United States Patent
Youn et al.

(10) Patent No.: US 9,391,089 B2
(45) Date of Patent: Jul. 12, 2016

(54) METHOD OF MANUFACTURING SEMICONDUCTOR DEVICE INCLUDING NICKEL-CONTAINING FILM

(71) Applicant: Samsung Electronics Co., Ltd., Suwon-si (KR)

(72) Inventors: Sang-chul Youn, Suwon-si (KR); Gyu-hee Park, Hwaseong-si (KR); Youn-joung Cho, Hwaseong-si (KR); Seung-min Ryu, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/598,659

(22) Filed: Jan. 16, 2015

(65) Prior Publication Data

US 2015/0228663 A1 Aug. 13, 2015

(30) Foreign Application Priority Data

Feb. 10, 2014 (KR) .................. 10-2014-0014965

(51) Int. Cl.

| | | |
|---|---|---|
| H01L 27/115 | (2006.01) | |
| H01L 21/768 | (2006.01) | |
| H01L 21/285 | (2006.01) | |
| H01L 29/49 | (2006.01) | |
| H01L 29/66 | (2006.01) | |
| H01L 29/788 | (2006.01) | |
| H01L 29/792 | (2006.01) | |

(52) U.S. Cl.
CPC .... *H01L 27/11582* (2013.01); *H01L 21/28518* (2013.01); *H01L 21/28562* (2013.01); *H01L 21/28568* (2013.01); *H01L 21/76879* (2013.01); *H01L 27/11556* (2013.01); *H01L 29/4916* (2013.01); *H01L 29/66825* (2013.01); *H01L 29/7889* (2013.01); *H01L 29/7926* (2013.01)

(58) Field of Classification Search
None
See application file for complete search history.

(56) References Cited

U.S. PATENT DOCUMENTS

| | | | |
|---|---|---|---|
| 6,503,561 B1 | 1/2003 | Senzaki et al. | |
| 7,064,224 B1 | 6/2006 | Lei et al. | |
| 7,220,671 B2 * | 5/2007 | Simka | ............... C23C 16/18 257/17 |
| 7,462,732 B2 | 12/2008 | Kim et al. | |
| 7,964,490 B2 | 6/2011 | Clendenning et al. | |

(Continued)

FOREIGN PATENT DOCUMENTS

| | | |
|---|---|---|
| JP | 2002-03317 | 1/2002 |
| JP | 2002-146532 | 5/2002 |

(Continued)

OTHER PUBLICATIONS

Ikarashi et al. "Silicide formation process in ultra-thin Ni-silicide film for advanced semiconductor devices: mechanism of $NiSi_2$ formation at low temperature" *Journal of Physics: Conference Series;* $17^{th}$ *International Conference on Microscopy of Semiconducting Materials* 326:1-4 (2011).

(Continued)

*Primary Examiner* — Scott B Geyer
(74) *Attorney, Agent, or Firm* — Myers Bigel & Sibley, P.A.

(57) ABSTRACT

A method of manufacturing a semiconductor device is provided. A substrate including a structure in which a hole is formed is prepared. Precursors including a nickel alkoxide compound are vaporized. A nickel-containing layer is formed in the hole by providing the vaporized precursors including the nickel alkoxide compound onto the substrate.

18 Claims, 49 Drawing Sheets

(56) References Cited

U.S. PATENT DOCUMENTS

| | | |
|---|---|---|
| 8,753,920 B2 | 6/2014 | Kim et al. |
| 2008/0171890 A1 | 7/2008 | Kim et al. |
| 2008/0187996 A1 | 8/2008 | Baca et al. |
| 2008/0254218 A1 | 10/2008 | Lei et al. |
| 2009/0197411 A1 | 8/2009 | Dussarrat et al. |
| 2010/0071587 A1 | 3/2010 | Byun et al. |
| 2010/0092667 A1 | 4/2010 | Gordon et al. |
| 2011/0284799 A1 | 11/2011 | Stoessel et al. |
| 2012/0040462 A1 | 2/2012 | Baca et al. |
| 2012/0183689 A1 | 7/2012 | Suzuki et al. |
| 2012/0225548 A1 | 9/2012 | Kang et al. |
| 2013/0089678 A1 | 4/2013 | Dussarrat et al. |
| 2013/0168614 A1 | 7/2013 | Lansalot-Matras |
| 2014/0174323 A1 | 6/2014 | Wada et al. |

FOREIGN PATENT DOCUMENTS

| | | |
|---|---|---|
| KR | 10-2009-0049094 | 5/2009 |
| KR | 10-2010-0109567 | 10/2010 |
| KR | 10-2011-0116199 | 10/2011 |
| KR | 10-2012-0100397 | 9/2012 |
| KR | 10-2012-0107665 | 10/2012 |
| WO | WO 2013/018413 A1 | 2/2013 |

OTHER PUBLICATIONS

Kim et al. "Atomic Layer Deposition of Ni Thin Films and Application to Area-Selective Deposition" *Journal of the Electrochemical Society* 158(1):D1-D5 (2011).

Li et al. "Direct-Liquid-Injection Chemical Vapor Deposition of Nickel Nitride Films and Their Reduction to Nickel Films" *Chemistry of Materials* 22:3060-3066 (2010).

Li et al. "Formation of Nickel Silicide from Direct-Liquid-Injection Chemical-Vapor-Deposited Nickel Nitride Films" *Journal of the Electrochemical Society* 157(6):H679-H683 (2010).

Peng et al. "Polycrystalline silicon thin films prepared by Ni silicide induced crystallization and the dopant effects on the crystallization" *Current Applied Physics* 12:1470-1475 (2012).

* cited by examiner

METHOD OF MANUFACTURING SEMICONDUCTOR DEVICE INCLUDING NICKEL-CONTAINING FILM

CROSS-REFERENCE TO RELATED APPLICATION

This application claims the benefit of Korean Patent Application No. 10-2014-0014965, filed on Feb. 10, 2014, in the Korean Intellectual Property Office, the disclosure of which is incorporated herein in its entirety by reference.

TECHNICAL FIELD

The inventive concept relates to a method of manufacturing a semiconductor device, and more particularly, to a method of manufacturing a semiconductor device including a nickel (Ni)-containing film.

DISCUSSION OF RELATED ART

As semiconductor devices improve in terms of speed and are rapidly becoming highly integrated and miniaturized, an aspect ratio of patterns forming the semiconductor devices increases. Thus, technology that provides a superior gap-filling characteristic and step coverage characteristic even in a narrow and deep space which has a large aspect ratio when depositing a metal-containing layer may be desirable to be developed concurrently.

SUMMARY

The inventive concept provides a method of manufacturing a semiconductor device, the method including forming a nickel (Ni)-containing layer that has a superior gap-filling and step coverage characteristic on a structure having a relatively large aspect ratio.

According to an aspect of the inventive concept, there is provided a method of manufacturing a semiconductor device, the method including: preparing a substrate including a structure in which a hole is formed; vaporizing precursors including a nickel alkoxide compound; and forming a nickel-containing layer in the hole by providing the vaporized precursors including the nickel alkoxide compound onto the substrate.

The precursors may include the nickel alkoxide compound represented by the following formula (I):

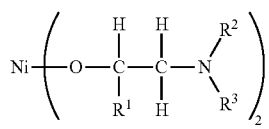

where each of $R^1$, $R^2$, and $R^3$ is a $C_1$-$C_4$ linear or branched alkyl group.

Each of $R^1$, $R^2$, and $R^3$ may be a methyl group, an ethyl group, a propyl group, an isopropyl group, a butyl group, an s-butyl group, a t-butyl group, or an isobutyl group.

$R^1$ may be the ethyl group and at least one of $R^2$ and $R^3$ may be the ethyl group.

The precursors may further include a compound having at least one organic coordination compound selected from an alcohol compound, a glycol compound, a β-diketone compound, a cyclopentadiene compound, and an organic amine compound. The precursors may include any one of silicon and metal.

The forming of the nickel-containing layer may include providing the vaporized precursor including the nickel alkoxide compound onto the substrate and decomposing or chemically reacting the provided precursor in the hole.

The forming of the nickel-containing layer may include: forming a first nickel-containing layer in the hole by providing a vapor containing the vaporized precursors including the nickel alkoxide compound onto the substrate; and forming a second nickel-containing layer by changing a composition of the first nickel-containing layer by using at least one of a reactive gas and heat.

The substrate may further include a silicon layer exposed through the hole. The forming of the nickel-containing layer may include: forming a nickel layer on the silicon layer by using the nickel alkoxide compound; and forming a nickel silicide layer from the silicon layer and the nickel layer by annealing the substrate.

The forming of the nickel-containing layer may include alternately and sequentially exposing the substrate to the nickel alkoxide compound and a reactive gas. The reactive gas may be formed of a reducing gas selected from a hydrogen compound, an ammonia compound, and an organo-metallic compound.

The forming of the nickel-containing layer may be performed in an atmosphere in which at least one selected from plasma, heat, light, and voltage is applied.

The nickel-containing layer may be a nickel layer, a nickel oxide layer, a nickel nitride layer, or a nickel silicide layer.

According to another aspect of the inventive concept, there is provided a method of manufacturing a semiconductor device, the method including: alternately stacking on a substrate one of a plurality of insulating layers and one of a plurality of sacrificial layers, the plurality of insulating layers and the plurality of sacrificial layers extending in parallel to the substrate; forming an opening penetrating the plurality of sacrificial layers and the plurality of insulating layers to expose the plurality of sacrificial layers; forming a nickel-containing layer in the opening by providing precursors including a nickel alkoxide compound onto the substrate; substituting the plurality of sacrificial layers with a plurality of gate lines; and forming a common source line in the opening, wherein the nickel alkoxide compound is represented by the following formula (I):

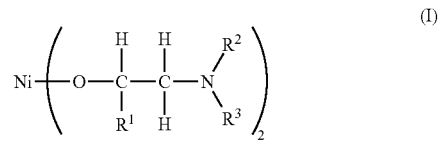

where each of $R^1$, $R^2$, and $R^3$ is a $C_1$-$C_4$ linear or branched alkyl group.

The plurality of sacrificial layers may include silicon. The substituting of the plurality of sacrificial layers with the plurality of gate lines may include: performing a silicidation process by inducing a reaction of the silicon included in the plurality of sacrificial layers and the nickel-containing layer; and changing the plurality of sacrificial layers to a nickel silicide layer by the silicidation process.

The forming of the opening may include etching the plurality of insulating layers and the plurality of sacrificial layers until the substrate is exposed in a bottom surface of the opening. The nickel-containing layer may include a portion contacting the substrate exposed in the opening. After the substituting of the plurality of sacrificial layers with the plurality of gate lines and before the forming of the common source line, the method may further include performing a silicidation process of the nickel-containing layer by inducing a reaction of the nickel-containing layer and the substrate.

According to another aspect of the inventive concept, there is provided a method of manufacturing a semiconductor device, the method including: alternately stacking on a substrate one of a plurality of insulating layers and one of a plurality of sacrificial layers, the plurality of insulating layers and the plurality of sacrificial layers extending in parallel to the substrate; forming a first opening penetrating the plurality of sacrificial layers and the plurality of insulating layers to expose a first region of the substrate; forming a plurality of second openings communicating with the first opening by removing the plurality of sacrificial layers through the first opening; forming a nickel layer in the first opening and the plurality of second openings by providing precursors including a nickel alkoxide compound into the first opening and the plurality of second openings; removing a portion of the nickel layer to leave a plurality of nickel layer patterns in the plurality of second openings; and forming a plurality of gate electrodes formed of a plurality of nickel silicide layers in the plurality of second openings by a silicidation process of the plurality of nickel layer patterns, wherein the nickel alkoxide compound is represented by the following formula (I):

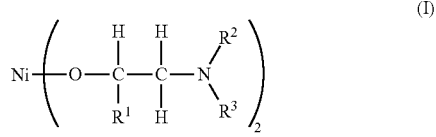

(I)

where each of R1, R2, and R3 is a C1-C4 linear or branched alkyl group.

$R^1$ may be the ethyl group and at least one of $R^2$ and $R^3$ is the ethyl group.

The forming of the plurality of gate electrodes may include: forming a polysilicon layer covering the plurality of nickel layer patterns in the first opening; and performing the silicidation process of the plurality of nickel layer patterns by inducing a reaction between the plurality of nickel layer patterns and the polysilicon layer.

The forming of the nickel layer may include: vaporizing the precursors including the nickel alkoxide compound; and providing the vaporized precursors including the nickel alkoxide compound into the first opening and the plurality of second openings.

After the forming of the plurality of gate electrodes, the method may further include: forming a source region in the first region of the substrate; forming an insulating spacer covering the plurality of gate electrodes; and forming a common source line connected to the source region in the first opening.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
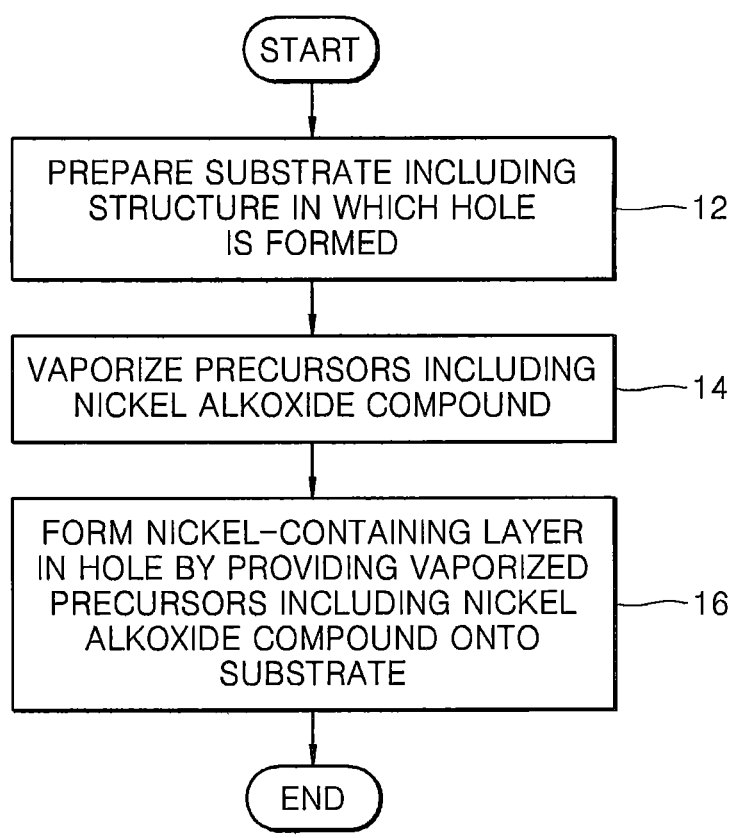
FIG. 1 is a flowchart illustrating a method of manufacturing a semiconductor device according to an exemplary embodiment of the inventive concept.

Hereinafter, the inventive concept will now be described more fully with reference to the accompanying drawings, in which exemplary embodiments of the inventive concept are shown. Like reference numerals in the drawings denote like elements, and a repeated explanation will not be given of overlapped features.

These inventive concepts may, however, be embodied in different forms and should not be construed as limited to the embodiments set forth herein. Rather, these embodiments are provided so that this disclosure is thorough and complete and fully conveys the inventive concept to those of ordinary skill in the art.

It will be understood that, although the terms "first", "second", "third", etc. may be used herein to describe various elements, components, regions, layers, and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of exemplary embodiments. For example, a first element could be termed a second element, and, similarly, a second element could be termed a first element, without departing from the scope of exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When an exemplary embodiment may be implemented differently, a specific process order may be performed differently from the described order. For example, two consecutively described processes may be performed substantially at the same time or performed in an order opposite to the described order.

In the drawings, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing.

As used herein, the term "and/or" includes any and all combinations of one or more of the associated listed items. Expressions such as "at least one of," when preceding a list of elements, modify the entire list of elements and do not modify the individual elements of the list.

FIG. 1 is a flowchart illustrating a method of manufacturing a semiconductor device according to an exemplary embodiment of the inventive concept.

Figure 2A:
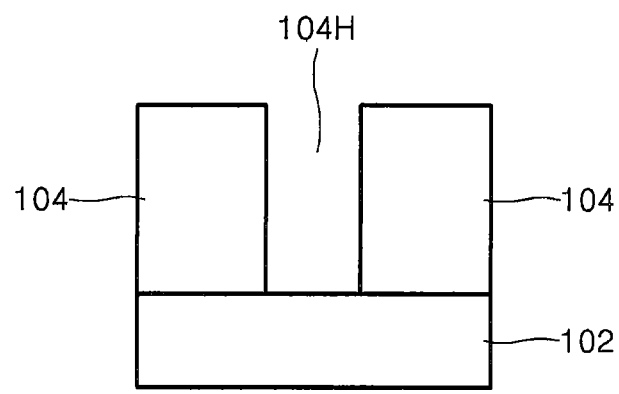
FIGS. 2A and 2B are cross-sectional views for describing an order of processes for manufacturing a semiconductor device according to an exemplary embodiment of the inventive concept.
Figure 2B:
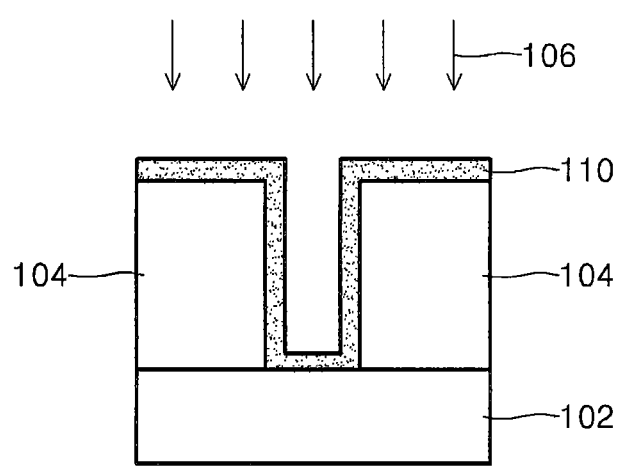

FIGS. 2A and 2B are cross-sectional views for describing an order of processes for manufacturing a semiconductor device according to an exemplary embodiment of the inventive concept.

Referring to FIGS. 1, 2A, and 2B, a substrate 102, on which a structure 104 including a hole 104H is formed, is prepared. In some embodiments, the substrate 102 may be prepared including structure 104 in which hole 104H is formed according to process 12.

According to an exemplary embodiment of the inventive concept, the substrate 102 may include a semiconductor element, such as silicon (Si) or germanium (Ge), or a compound semiconductor, such as silicon carbide (SiC), gallium arsenide (GaAs), indium arsenide (InAs), or indium phosphide (InP). According to another exemplary embodiment of the inventive concept, the substrate 102 may include a semiconductor substrate, and an insulating layer formed on the semiconductor substrate or structures including at least one conductive region. The conductive region may be formed of, for example, a well doped with impurities, or structures doped with impurities. According to an exemplary embodiment of the inventive concept, the substrate 102 may have various isolation structures, such as a shallow trench isolation (STI) structure.

The structure 104 may be formed as a single-layered structure including at least one insulating layer or at least one conductive layer, or as a multi-layered structure.

According to an exemplary embodiment of the inventive concept, the hole 104H formed in the structure 104 may have an aspect ratio of at least 2. According to another exemplary embodiment of the inventive concept, the aspect ratio of the hole 104H may be about 5 or more. According to another exemplary embodiment of the inventive concept, the aspect ratio of the hole 104H may be about 10 or more.

In process 14, precursors including a nickel alkoxide compound are vaporized.

The nickel alkoxide compound, which is suitable to use as the precursor to form a nickel-containing layer, in the method of manufacturing the semiconductor device according to the present exemplary embodiment, may be represented by the following formula (1).

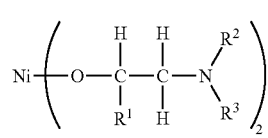

[Formula 1]

Here, each of $R^1$, $R^2$, and $R^3$ is a $C_1$-$C_4$ linear or branched alkyl group.

According to an exemplary embodiment of the inventive concept, each of $R^1$, $R^2$, and $R^3$ may be a methyl group, an ethyl group, a propyl group, an isopropyl group, a butyl group, an s-butyl group, a t-butyl group, or an isobutyl group. According to another exemplary embodiment of the inventive concept, $R^1$ may be an ethyl group, and at least one of $R^2$ and $R^3$ may be an ethyl group.

The nickel alkoxide compound of Formula 1 has a relatively low melting point, is capable of being delivered in a liquid state, and is easily vaporized since it has a relatively high vapor pressure, and thus, it is easy to deliver. Accordingly, the nickel alkoxide compound is suitable to be used as a material compound to form a nickel-containing layer in a deposition process in which a material compound that is necessary to form a thin layer is provided in a vaporized state, such as chemical vapor deposition (CVD) or atomic layer deposition (ALD). In particular, since the nickel alkoxide compound of Formula 1 has the relatively high vapor pressure, the nickel alkoxide compound of Formula 1 may be easily delivered to the structure having the relatively high aspect ratio, and thus, a nickel-containing layer having a superior gap-filling characteristic and step coverage characteristic may be formed on the structure having the relatively high aspect ratio.

A nickel precursor used to form the nickel-containing layer in the method of manufacturing the semiconductor device according to the present exemplary embodiment refers to the nickel alkoxide compound of Formula 1. Hereinafter, the nickel alkoxide compound of Formula 1 may be referred to as a nickel precursor or a material compound. In the method of manufacturing the semiconductor device according to the present exemplary embodiment, the nickel alkoxide compound may be used in different forms according to a process of forming the nickel-containing layer. The nickel alkoxide compound used as the material compound in the method of manufacturing the semiconductor device according to the present exemplary embodiment, has a property suitable to be used in the CVD process or the ALD process, and thus, it may be usefully applied to the CVD process or the ALD process. However, according to the present inventive concept, the process of forming the nickel-containing layer is not limited to the CVD process or the ALD process, and various deposition processes may be used.

The precursors including the nickel alkoxide compound, which may be used in process 14, may further include other precursor compounds in addition to the nickel alkoxide compound of Formula 1. Other precursor compounds may be formed as a compound of at least one organic coordination compound selected from an alcohol compound, a glycol compound, a β-diketone compound, a cyclopentadiene compound, and an organic amine compound and any one selected from silicon and metal.

A metal forming the organic coordination compound of other precursor compounds may include Mg, Ca, Sr, Ba, Ti, Zr, Hf, V, Nb, Ta, Mn, Fe, Ru, Co, Rh, Ir, Pd, Pt, Cu, Ag, Au, Zn, Al, Ga, In, Ge, Sn, Pb, Sb, Bi, Y, La, Ce, Pr, Nd, Pm, Sm, Eu, Gd, Tb, Dy, Ho, Er, Tm, and Yb. However, the present inventive concept is not limited thereto.

Examples of the alcohol compound which may be used as the organic coordination compound of other precursor compounds may include alkyl alcohols, such as methanol, ethanol, propanol, isopropyl alcohol, butanol, sec-butyl alcohol, isobutyl alcohol, tert-butyl alcohol, pentyl alcohol, isopentyl alcohol, and tert-pentyl alcohol; ether alcohols, such as 2-methoxyethanol, 2-ethoxyethanol, 2-butoxyethanol, 2-(2-methoxyethoxy)ethanol), 2-methoxy-1-dimethylethanol, 2-methoxy-1,1-dimethylethanol, 2-ethoxy-1,1-dimethylethanol, 2-isopropoxy-1,1-dimethylethanol, 2-butoxy-1,1-dimethylethanol, 2-(2-methoxyethoxy)-1,1-dimethylethanol, 2-propoxy-1,1-diethylethanol, 2-s-butoxy-1,1-diethylethanol, and 3-methoxy-1,1-dimethylpropanol; and dialkylaminoalcohol, but they are not limited thereto.

Examples of the glycol compound which may be used as the organic coordination compound of other precursor compounds may include 1,2-ethanediol, 1,2-propanediol, 1,3-propanediol, 2,4-hexanediol, 2,2-dimethyl-1,3-propanediol, 2,2-diethyl-1,3-propanediol, 1,3-butanediol, 2,4-butanediol, 2,2-diethyl-1,3-butanediol, 2-ethyl-2-butyl-1,3-propanediol, 2,4-pentanediol, 2-methyl-1,3-propanediol, 2-methyl-2,4-pentanediol, 2,4-hexanediol, and 2,4-dimethyl-2,4-pentanediol, but they are not limited thereto.

Examples of the β-diketone compound which may be used as the organic coordination compound of other precursor compounds may include alkyl-substituted β-diketones, such as acetylacetone, hexane-2,4-dione, 5-methylhexane-2,4-dione, heptane-2,4-dione, 2-methylheptane-3,5-dione, 5-methylheptane-2,4-dione, 6-methylheptane-2,4-dione, 2,2-dimethylheptane-3,5-dione, 2,6-dimethylheptane-3,5-dione, 2,2,6-trimethylheptane-3,5-dione, 2,2,6,6-tetramethylheptane-3,5-dione,octane-2,4-dione, 2,2,6-trimethyloctane-3,5-dione, 2,6-dimethyloctane-3,5-dione, 2,9-dimethylnonane-4,6-dione, 2-methyl-6-ethyldecane-3,5-dione, and 2,2-dimethyl-6-ethyldecane-3,5-dione; fluorine-substituted β-diketone, such as 1,1,1-trifluoropentane-2,4-dione, 1,1,1-trifluoro-5,5-dimethylhexane-2,4-dione, 1,1,1,5,5,5-hexafluoropentane-2,4-dione, and 1,3-diperfluorohexylpropane-1,3-dione; and ether-substituted β-diketone, such as 1,1,5,5-tetramethyl-1-methoxyhexane-2,4-dione, 2,2,6,6-tetramethyl-1-methoxyheptane-3,5-dione, and 2,2,6,6-tetramethyl-1-(2-methoxyethoxy)heptane-3,5-dione, but they are not limited thereto.

Examples of the cyclopentadiene compound which may be used as the organic coordination compound of other precursor compound may include cyclopentadiene, methylcyclopentadiene, ethylcyclopentadiene, propylcyclopentadiene, isopropylcyclopentadiene, butylcyclopentadiene, sec-butylcyclopentadiene, isobutylcyclopentadiene, tert-butylcyclopentadiene, and dimethylcyclopentadiene, tetramethylcyclopentadiene, but they are not limited thereto.

Examples of the organic amine compound which may be used as the organic coordination compound of other precursor compounds may include methylamine, ethylamine, propylamine, isopropylamine, dimethylamine, diethylamine, dipropylamine, diisopropylamine, ethylmethylamine, propylmethylamine, and isopropylmethylamine, but they are not limited thereto.

In process 16, the nickel-containing layer 110 is formed in the hole 104H by providing the vaporized precursors including the nickel alkoxide compound onto the substrate 102.

The nickel-containing layer 110 may be obtained by decomposing or chemically reacting a vapor 106 including the vaporized nickel alkoxide compound on the substrate 102.

According to an exemplary embodiment of the inventive concept, the vaporized nickel alkoxide compound may be solely provided onto the substrate 102 to form the nickel-containing layer 110. According to another exemplary embodiment of the inventive concept, the vaporized nickel alkoxide compound and at least one of another precursor compound, a reactive gas, a carrier gas, and a purge gas may be sequentially provided onto the substrate 102 to form the nickel-containing layer 110. Another precursor compound that may be provided on the substrate 102 along with the vaporized nickel alkoxide compound is as described in process 14. Descriptions with respect to more detailed aspects of the reactive gas, the carrier gas, and the purge gas that may be provided on the substrate 102 along with the vaporized nickel alkoxide compound may be provided later.

The nickel-containing layer 110 may be a nickel layer, a nickel oxide layer, a nickel nitride layer, a nickel silicide layer, or a combination thereof, but it is not limited thereto.

In a field of electronic devices, various kinds of nickel-containing layers including a nickel element are used. The nickel-containing layer may be applied for various usages according to an electrical characteristic provided according to composition elements thereof. For example, the nickel-containing layer may be used as a material of a wiring that has low resistance. Also, the nickel layer may provide an excellent luster and corrosion resistance and may have strong magnetic forces, and thus, the nickel-containing layer may be applied to a recording medium or various other devices requiring magnetic forces. In addition, the nickel silicide layer may be used as a wiring material in various kinds of electronic devices.

As the semiconductor device is highly integrated and miniaturized, an aspect ratio of a hole or a trench formed in an under layer in which the nickel-containing layer is formed increases. To form the nickel-containing layer in a narrow and deep space like this that has a large aspect ratio, the CVD process or the ALD process may be used. In the CVD process or the ALD process, the material compound, that is, the precursor is vaporized and delivered to a deposition reaction chamber to form a thin layer. Thus, to increase process efficiency and productivity in the CVD or ALD process, the material compound, which has a low melting point, is capable of being delivered in a liquid state, and has a high vapor pressure so that it may be vaporized easily, needs to be used.

In the method of manufacturing the semiconductor device according to the present exemplary embodiment, the nickel-containing layer 110 may be grown and deposited on the substrate 102 by providing a vapor generated by vaporizing a mixture of the nickel alkoxide compound of Formula 1 and another precursor onto the substrate 102, along with a reactive gas if necessary, and continuously decomposing and/or reacting the precursors on the substrate 102 according to the CVD process.

In the method of manufacturing the semiconductor device according to the present exemplary embodiment, a method of delivering and providing the material compound, a method of deposition, a method of manufacture, a condition of manufacture, and equipment of manufacture are not particularly restricted, and general conditions and methods may be used.

Examples of the reactive gas that may be used in the method of manufacturing the semiconductor device according to the present exemplary embodiment may include an oxidative gas, a reducing gas, a nitrogen-containing gas, etc.

Examples of the oxidative gas may include oxygen, ozone, nitrogen dioxide, nitrogen monoxide, vapor, hydrogen peroxide, formic acid, acetic acid, acetic anhydride, etc.

Examples of the reducing gas may include hydrogen, ammonia, an organo-metallic compound, etc.

Examples of the nitrogen-containing gas may include an organic amine compound, such as monoalkylamine, dialkylamine, trialkylamine, alkylenediamine, etc, hydrazine, ammonia, etc.

When the nickel layer is to be formed as the nickel-containing layer in the method of manufacturing the semiconductor device according to the present exemplary embodiment, the nickel alkoxide compound of Formula 1, which is used as the material compound, has a relatively high reactivity with hydrogen which is the reducing gas, and thus, the nickel alkoxide compound of Formula 1 is suitable to be used as the precursor for forming the nickel layer.

In the method of manufacturing the semiconductor device according to the present exemplary embodiment, a gas delivery method, a liquid delivery method, a single source method, or a cocktail source method may be used to provide the material compound to the reactive chamber.

In the method of manufacturing the semiconductor device according to the present exemplary embodiment, a heat CVD process that forms the nickel-containing layer by solely reacting a vaporized material compound by heat or by reacting the vaporized material compound and the reactive gas by heat, a plasma CVD process that forms a thin layer by using heat and plasma, a light CVD process that uses heat and light, a light plasma CVD process that uses heat, light, and plasma, or the ALD process that performs deposition by an molecular level in stages may be used to form the nickel-containing layer. However, the present inventive concept is not limited thereto.

In the method of manufacturing the semiconductor device according to the present exemplary embodiment, a thin layer forming condition for forming the nickel-containing layer may include a reactive temperature (a substrate temperature), a reactive pressure, a deposition speed, etc.

The reactive temperature may be a temperature at which the nickel alkoxide compound which is represented by Formula 1 may surely react, that is, about 100° C. or higher according to an exemplary embodiment, or between about 130° C. and about 300° C. according to another exemplary embodiment. However, it is not limited thereto.

The reactive pressure may be selected between an atmospheric pressure and about 10 Pa in the case of the heat CVD process or the light CVD process. The reactive pressure may be selected between about 10 Pa and about 2000 Pa in the case of the plasma CVD process. However, it is not limited thereto.

The deposition speed may be controlled by adjusting supplying conditions (for example, a temperature of vaporization and a pressure of vaporization) of the material compound, the reactive temperature, and the reactive pressure. If the deposition speed is too high, a characteristic of a thin layer consequently obtained may deteriorate, and if the deposition speed is too low, the productivity may decrease. The deposition speed of the nickel-containing layer may be about 0.01 to about 5000 nm/min, for example, the deposition speed of the nickel-containing layer may be selected between about 0.1 nm/min and about 1000 nm/min. However, it is not limited thereto. In the case in which the nickel-containing layer is formed by using the ALD process, the number of ALD cycles may be adjusted to control the nickel-containing layer to have a desired thickness.

After the forming of the nickel-containing layer 110 as described in reference to FIGS. 2A and 2B, the method of manufacturing the semiconductor device according to the present exemplary embodiment may further include a process of annealing under an inert atmosphere, an oxidation atmosphere, or a reducing atmosphere, in order to improve an electrical characteristic of the nickel-containing layer 110. Alternatively, a reflow process for the nickel-containing layer 110 may be performed. The annealing process and the reflow process may be performed at about 200 to about 1000° C., for example, the annealing process and the reflow process may be performed under a temperature condition selected between about 300° C. and about 500° C.; however they are not limited thereto.

According to the method of manufacturing the semiconductor device according to the present exemplary embodiment, various kinds of nickel-containing layers may be formed by appropriately selecting the nickel alkoxide compound, other precursors used along with the nickel alkoxide compound, the reactive gas, and the thin layer forming condition. According to an exemplary embodiment, the nickel-containing layer may be formed of nickel, a nickel alloy, an oxide ceramic, a nitride ceramic, or a glass. According to another exemplary embodiment, the nickel-containing layer may be formed of pure nickel, nickel oxide, nickel nitride, or nickel silicide. For example, the nickel alloy may be formed of Ni—Ti, Ni—Cr, Ni—V, Ni—Cu, Ni—Cr—Si, Ni—Cr—Al, Ni—W, AuGeNi, or $NiP_2$. The nickel nitride may be formed of nickel nitrate ($Ni(NO_3)_2$) or nickel nitrate hexahydrate ($Ni(NO_3)_2.6H_2O$). The nickel silicide may be formed of $Ni_2Si$, $NiSi$, $NiSi_2$, or a combination thereof. However, the composition of the nickel-containing layer is not limited thereto.

The nickel-containing layer 110 illustrated in FIG. 2B may form a gate electrode of a transistor, an electrode of a capacitor, a conductive barrier layer for wirings, a resistive layer, a magnetic layer, a barrier metal layer for a liquid crystal display (LCD), a member for a thin layer solar cell, etc. However, it is not limited thereto.

FIGS. 3A through 3D are schematic views of structures of exemplary chemical vapor deposition (CVD) devices 200A, 200B, 200C, and 200D which may be used in a process of forming a nickel (Ni)-containing layer in a method of manufacturing a semiconductor device according to an exemplary embodiment of the inventive concept.

The CVD devices 200A, 200B, 200C, and 200D illustrated in FIGS. 3A through 3D include a fluid delivery unit 210, a thin layer forming unit 250 performing a deposition process to form the thin layer on a substrate W by using a process gas supplied from a material container 212 in the fluid delivery unit 210, and an exhaust system 270 to discharge a gas that is left after being used in reaction in the thin layer forming unit 250 or reaction by-products.

The thin layer forming unit 250 includes a reaction chamber 254 including a susceptor 252 supporting the substrate W. A shower head 256 to supply the gas supplied from the fluid delivery unit 210 onto the substrate W is formed in an upper end of the reaction chamber 254.

The fluid delivery unit 210 includes an inlet line 222 to supply a carrier gas from the outside to the material container 212 and an outlet line 224 to supply a material compound contained in the material container 212 to the thin layer forming unit 250. Valves V1 and V2 and mass flow controllers (MFC) M1 and M2 may be formed in each of the inlet line 222 and the outlet line 224. The inlet line 222 and the outlet line 224 may be inter-connected via a bypass line 226. A valve V3 is formed in the bypass line 226. The valve V3 may be operated by air pressure by an electric motor or other units capable of being remotely controlled.

The material compound supplied from the material container 212 may be supplied to the reaction chamber 254 via an inlet line 266 of the thin layer forming unit 250 connected to the outlet line 224 of the fluid delivery unit 210. According to necessity, the material compound supplied from the material container 212 may be supplied to the reaction chamber 254 along with the carrier gas supplied via an inlet line 268. A valve V4 and an MFC M3 may be formed in the inlet line 268 via which the carrier gas is supplied.

The thin layer forming unit 250 includes an inlet line 262 to supply a purge gas into the reaction chamber 254 and an inlet line 264 to supply a reaction gas into the reaction chamber 254. Valves V5 and V6 and MFCs M4 and M5 may be formed in each of the inlet lines 262 and 264.

The process gas used in the reaction chamber 254 and the reaction by-products for disposal may be discharged to the outside by the exhaust system 270. The exhaust system 270 may include an exhaust line 272 connected with the reaction chamber 254 and a vacuum pump 274 formed in the exhaust line 272. The vacuum pump 274 may remove the process gas and the reaction by-products for disposal discharged from the reaction chamber 254.

A trap 276 may be formed in the exhaust line 272 at the upstream of the vacuum pump 274. The trap 276 may capture the reaction by-products generated from the process gas that was not completely reacted in the reaction chamber 254 so as not to make the reaction by-products flow downstream into the vacuum pump 274.

The nickel alkoxide compound of Formula 1 is used as the material compound to form the nickel-containing layer. In particular, the nickel alkoxide compound of Formula 1 may exist in a liquid state at room temperature and be reactive to the reactive gas such as the reducing gas. Accordingly, the trap 276 formed in the exhaust line 272 may capture extraneous matter such as reaction by-products generated by a reaction between process gases to prevent the extraneous matter flowing downstream. The trap 276 may have a composition which may be cooled by a cooler or by water cooling.

Also, a bypass line 278 and an automatic pressure controller 280 may be formed in the exhaust line 272 upstream of the trap 276. Valves V7 and V8 may be respectively formed in the bypass line 278 and in a portion of the exhaust line 272, which extends in parallel to the bypass line 278.

Figure 3A:
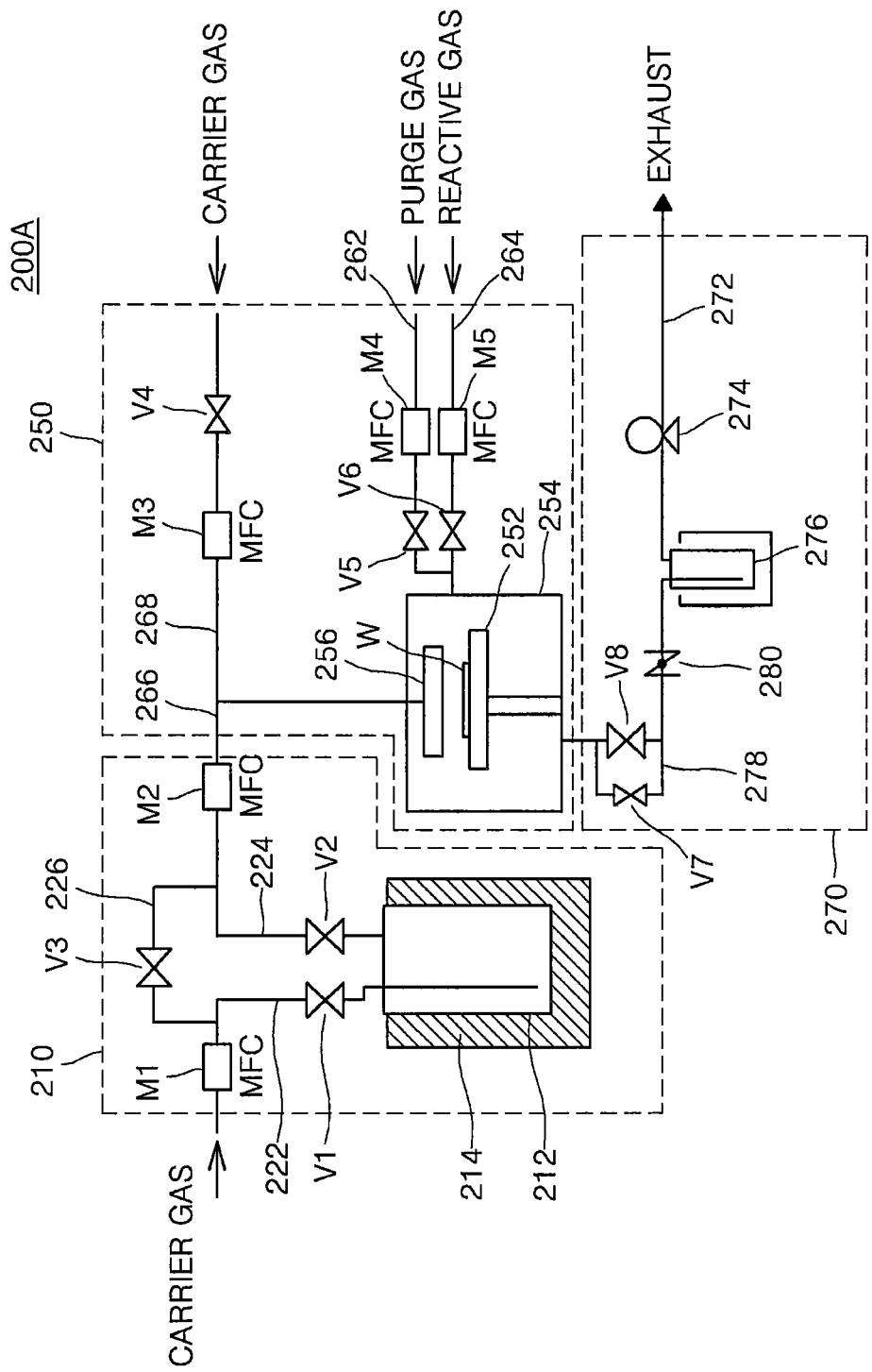
FIGS. 3A through 3D are schematic views of structures of exemplary chemical vapor deposition (CVD) devices which may be used in a process of forming a nickel (Ni)-containing layer in a method of manufacturing a semiconductor device according to an exemplary embodiment of the inventive concept.
Figure 3B:
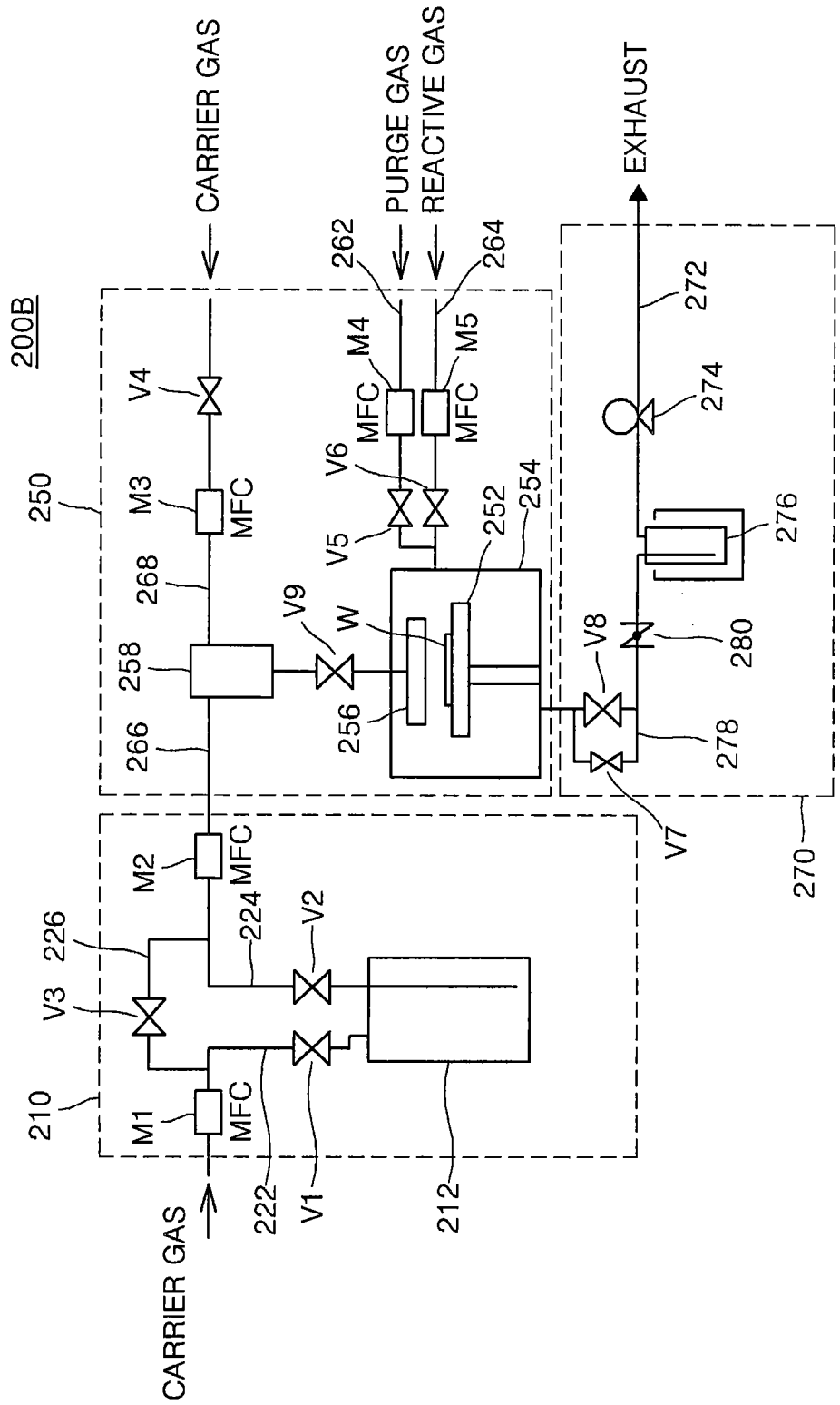
Figure 3C:
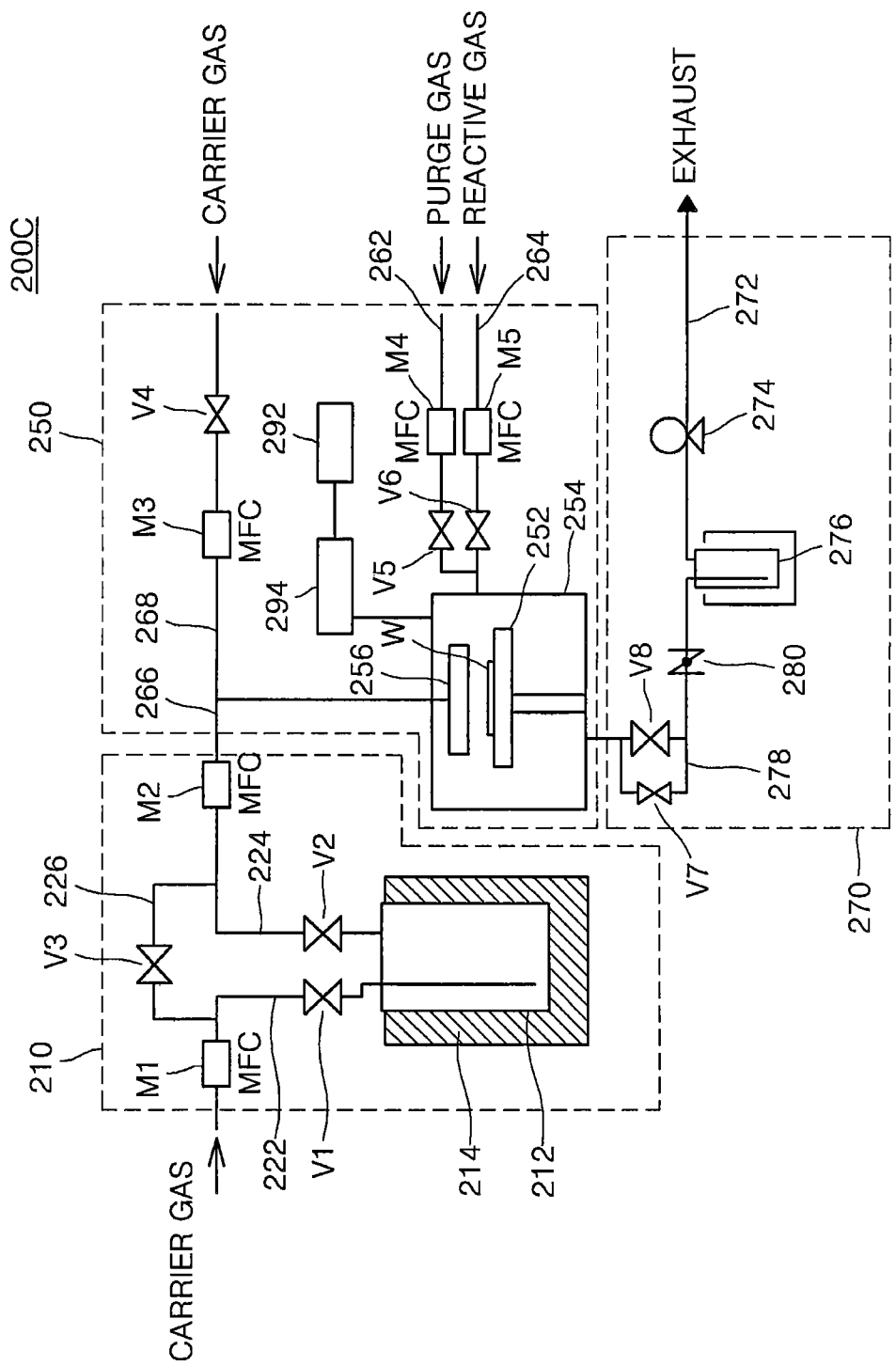

As in the CVD devices 200A and 200C illustrated in FIGS. 3A and 3C, a heater 214 may be formed in the material container 212. The temperature of the material compound contained in the material container 212 may be maintained to be relatively high by the heater 214.

Figure 3D:
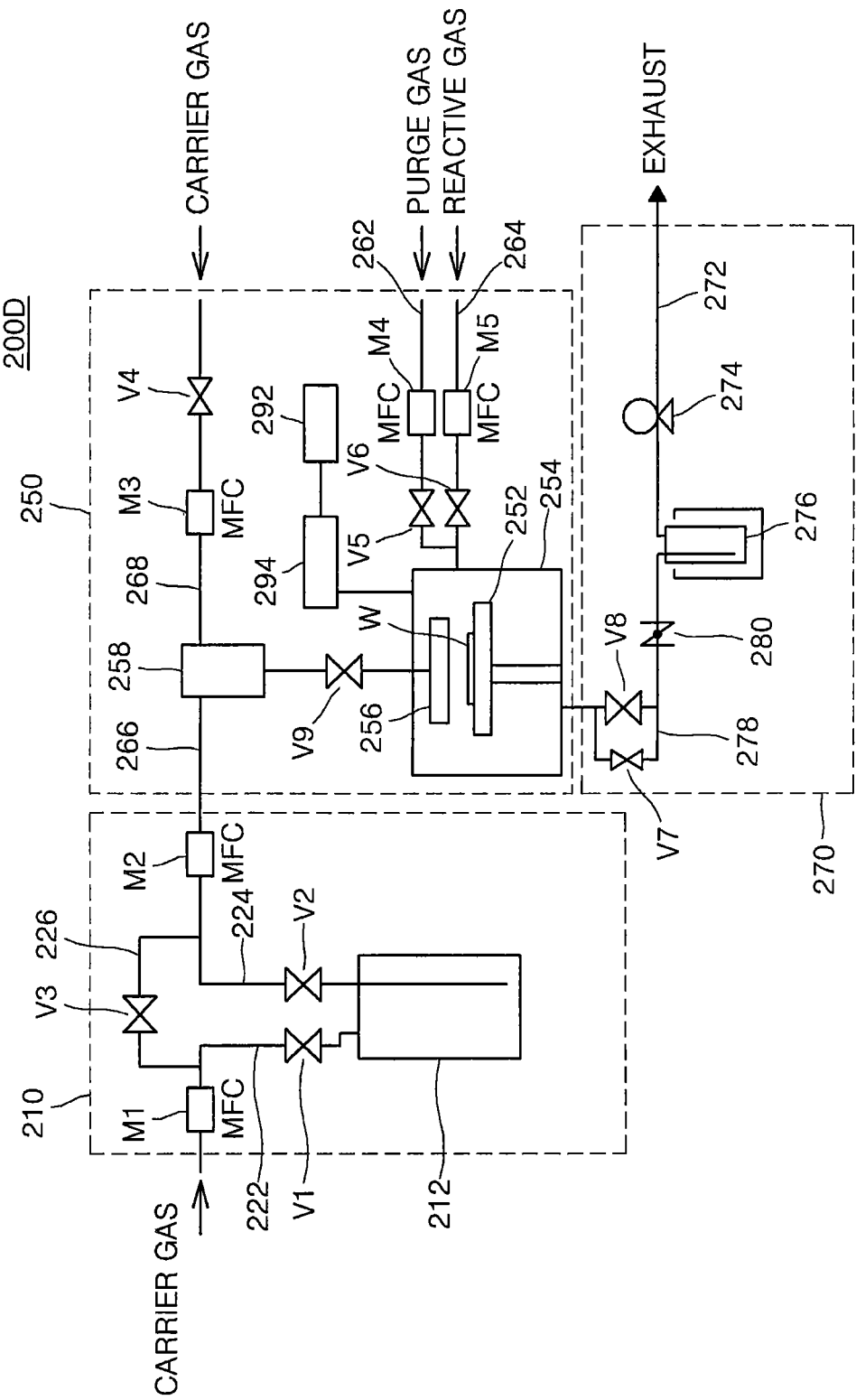

As in the CVD devices 200B and 200D illustrated in FIGS. 3B and 3D, a vaporizer 258 may be formed in the inlet line 266 of the thin layer forming unit 250. The vaporizer 258 vaporizes a fluid supplied in a liquid state from the fluid delivery unit 210 and supplies the vaporized material compound into the reaction chamber 254. The material compound vaporized in the vaporizer 258 may be supplied into the reaction chamber 254 along with the carrier gas supplied via the inlet line 268. The flow of the material compound into the reaction chamber 254 through the vaporizer 258 may be controlled by a valve V9.

In addition, as in the CVD devices 200C and 200D illustrated in FIGS. 3C and 3D, the thin layer forming unit 250 may include a high frequency power source 292 and an RF matching system 294 connected with the reaction chamber 254 in order to generate plasma in the reaction chamber 254.

Although it is illustrated in FIGS. 3A through 3D that the CVD devices 200A, 200B, 200C, and 200D have a structure in which one material container 212 is connected with the reaction chamber 254, it is not limited thereto. According to necessity, a plurality of material container 212 may be included in the fluid delivery unit 210, and each of the plurality of material containers 212 may be connected with the reaction chamber 254. The number of the material containers 212 connected with the reaction chamber 254 is not particularly restricted.

The vaporizer 258 may be used in any one of the CVD devices 200B and 200D illustrated in FIGS. 3B and 3D in order to vaporize the precursors including the nickel alkoxide compound in process 14 of FIG. 1. However, the present inventive concept is not limited thereto.

Also, any one of the CVD devices 200A, 200B, 200C, and 200D illustrated in FIGS. 3A through 3D may be used to form the nickel-containing layer 110 in process 16 of FIG. 1 and a process of FIG. 2B. However, the present inventive concept is not limited thereto.

In order to form the nickel-containing layer 110 on the substrate according to the processes of FIGS. 1, 2A, and 2B, the precursors including the nickel alkoxide compound may be delivered by using various methods to be supplied into a reaction chamber of a thin layer forming device, for example, into the reaction chamber 254 of the CVD devices 200A, 200B, 200C, and 200D illustrated in FIGS. 3A through 3D.

According to an exemplary embodiment, in order to form a thin layer by the CVD process by using the nickel alkoxide compound, a gas delivery method in which the nickel alkoxide compound of Formula 1 is vaporized by being heated and/or decompressed in the material container 212, and then is supplied into the reaction chamber 254 along with a carrier gas, such as Ar, N, and He, according to necessity, may be used. In the case in which the gas delivery method is used, the nickel alkoxide compound of Formula 1 itself may be used as the material compound for forming the thin layer in the CVD process.

According to another exemplary embodiment, in order to form the thin layer by the CVD process by using the nickel alkoxide compound of Formula 1, a liquid delivery method in which the nickel alkoxide compound is delivered to the vaporizer 258 in a liquid or solution state, is vaporized by being heated and/or decompressed in the vaporizer 258, and then is supplied into the reaction chamber 254, may be used. In the case in which the liquid delivery method is used, the nickel alkoxide compound itself or a solution in which the nickel alkoxide compound is dissolved in an organic solvent may be used as the material compound for forming the thin layer in the CVD process.

According to an exemplary embodiment, a multicomponent CVD process may be used to form the nickel-containing layer. The multicomponent CVD process may include a method in which the material compound to be used in the CVD process is vaporized separately for each component thereof and then is supplied (hereinafter, this may be referred to as a "single source method") and a method in which a mixture material that is a mixture of a desired composition of multicomponent materials is vaporized and then is supplied (hereinafter, this may be referred to as a "cocktail source method"). In the case in which the cocktail source method is used, a first mixture including the nickel alkoxide compound of Formula 1, a first mixture solution in which the first mixture is dissolved in an organic solvent, a second mixture including the nickel alkoxide compound of Formula 1 and other precursors, or a second mixture solution in which the second mixture is dissolved in the organic solvent may be used as the material compound in a process of forming a nickel-containing layer by the CVD process.

Types of the organic solvent that may be used to obtain the first mixture solution or the second mixture solution are not particularly restricted, and the organic solvents that are commonly known may be used. For example, examples of the organic solvents may include acetic acid esters, such as acetic acid ethyl, acetic acid butyl, and acetic acid methoxyethyl; ethers, such as tetrahydrofuran, tetrahydropyran, ethylene glycol dimethyl ether, diethylene glycol dimethyl ether, triethylene glycol dimethyl ether, dibutyl ether, and dioxane; ketones, such as methyl butyl ketone, methyl isobutyl ketone, ethyl butyl ketone, dipropyl ketone, diisobutyl ketone, methyl amyl ketone, cyclohexanone, and methylcyclohexanone; hydrocarbons, such as hexane, cylclohexane, methylcyclohexane, dimethylcyclohexane, ethylcyclohexane, heptane, octane, toluene, and xylene; hydrocarbons having a cyano group, such as 1-cyanopropane, 1-cyanobutane, 1-cyanohexane, cyanocyclohexane, cyanobenzene, 1,3-dicyanopropane, 1,4-dicyanobutane, 1,6-dicyanohexane, 1,4-dicyanocyclohexane, and 1,4-dicyanobenzene; pyridine; and lutidine. The exemplified organic solvents may be used each independently or as a mixed solvent of at least two kinds. When these organic solvents are used, a total sum of the nickel alkoxide compound of Formula 1 and other precursors in a given organic solvent may be about 0.01 to about 2.0 mol/L, for example about 0.05 to about 1.0 mol/L.

In the case in which the multicomponent CVD process is used, types of other precursors that may be used with the nickel alkoxide compound of Formula 1 are not particularly restricted, and precursors that may be used as the material compound in the CVD process may be used.

Figure 4:
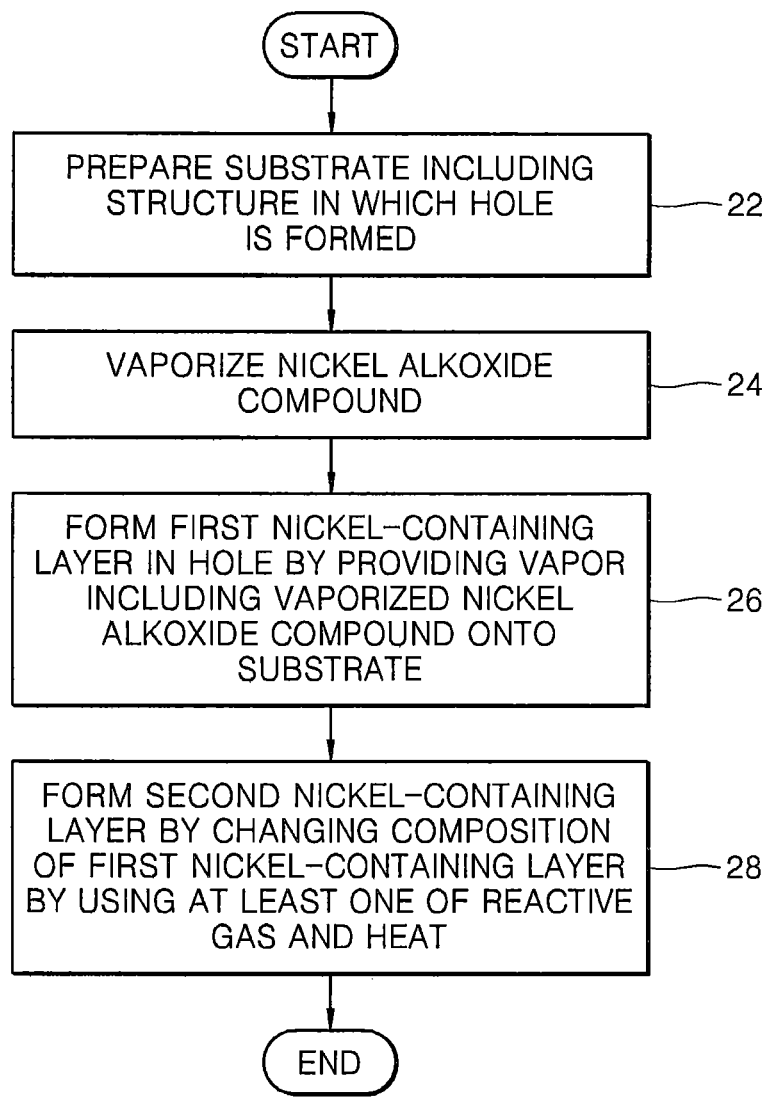
FIG. 4 is a flowchart illustrating a method of manufacturing a semiconductor device according to an exemplary embodiment of the inventive concept.

FIG. 4 is a flowchart illustrating a method of manufacturing a semiconductor device according to an exemplary embodiment of the inventive concept.

Figure 5A:
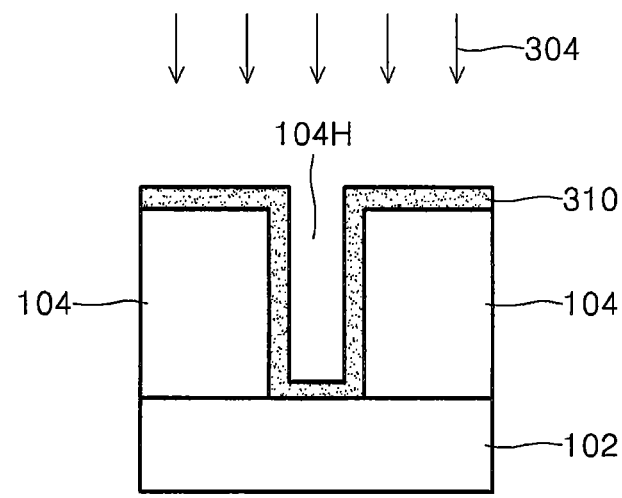
FIGS. 5A and 5B are cross-sectional views for describing a method of manufacturing a semiconductor device according to an exemplary embodiment of the inventive concept.
Figure 5B:
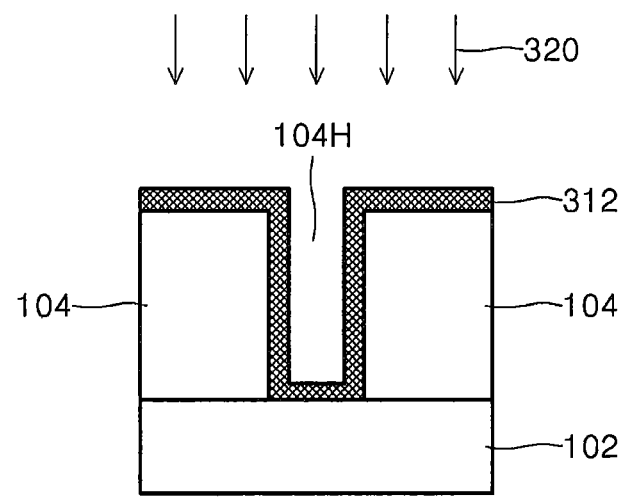

FIGS. 5A and 5B are cross-sectional views for describing a method of manufacturing a semiconductor device according to an exemplary embodiment of the inventive concept. In FIGS. 5A and 5B, like reference numerals in FIGS. 2A and 2B refer to like elements, and thus, detailed descriptions thereof will not be repeated here.

Referring to FIGS. 4, 5A, and 5B, the substrate 102 including the structure 104 in which the hole 104H is formed is prepared in process 22, as illustrated in process 12 of FIG. 1 and FIG. 2A.

A nickel alkoxide compound is vaporized in process 24.

The nickel alkoxide compound may be formed as a compound represented by Formula 1.

The vaporizing process may be performed by using the vaporizer 258 included in any one of the CVD devices 200B and 200D illustrated in FIGS. 3B and 3D or a vaporizer having a similar function.

A vapor 304 including the vaporized nickel alkoxide compound is supplied onto the substrate 102 to form a first nickel-containing layer 310 in the hole 104H in process 26.

The first nickel-containing layer 310 may be formed to cover an inner wall of the hole 104H and an upper surface of the structure 104.

The first nickel-containing layer 310 may be obtained by decomposing or chemically reacting the vapor 304 including the vaporized nickel alkoxide compound on the substrate 102. For example, the first nickel-containing layer 310 may be formed by the CVD process or the ALD process.

According to an exemplary embodiment, the forming of the first nickel-containing layer 310 may be performed in an atmosphere in which at least one selected from plasma, heat, light, and voltage is applied. For example, the forming of the first nickel-containing layer 310 may be performed by using any one of the CVD devices 200A, 200B, 200C, and 200D illustrated in FIGS. 3A through 3D.

According to an exemplary embodiment, the first nickel-containing layer 310 may be formed as a nickel layer (hereinafter, this could be referred to as an "NiN layer") including nitrogen atoms. The nitrogen atoms included in the first nickel-containing layer 310 may be a product obtained as nitrogen atoms included in the nickel alkoxide compound used as the material compound remain in a thin layer formed on the substrate 102 during the forming of the first nickel-containing layer 310.

A second nickel-containing layer 312 is formed by changing a composition of the first nickel-containing layer 310 by using at least one of a reactive gas and heat, in process 28.

In an exemplary embodiment to form the second nickel-containing layer 312, in process 28, the second nickel-containing layer 312 formed as a nickel layer (an Ni layer) may be formed by supplying a reactive gas 320 onto the first nickel-containing layer 310 as illustrated in FIG. 5B. To this end, a reducing gas, for example, a $H_2$ gas, may be used as the reactive gas 320.

Figure 6:
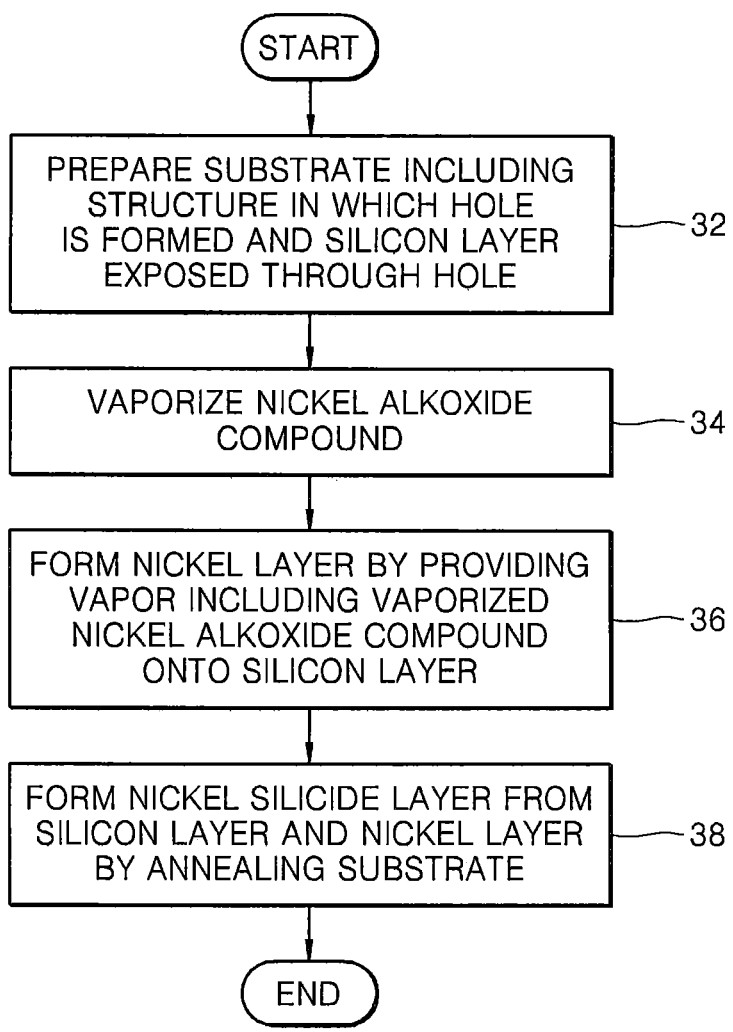
FIG. 6 is a flowchart illustrating a method of manufacturing a semiconductor device according to an exemplary embodiment of the inventive concept.
Figure 7A:
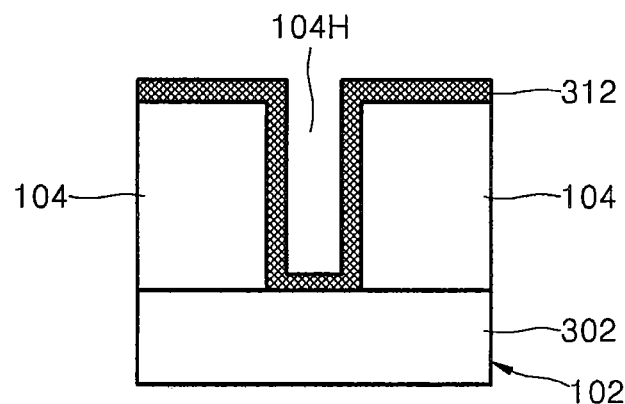
FIGS. 7A through 7C are cross-sectional views for describing a method of manufacturing a semiconductor device according to an exemplary embodiment of the inventive concept.
Figure 7B:
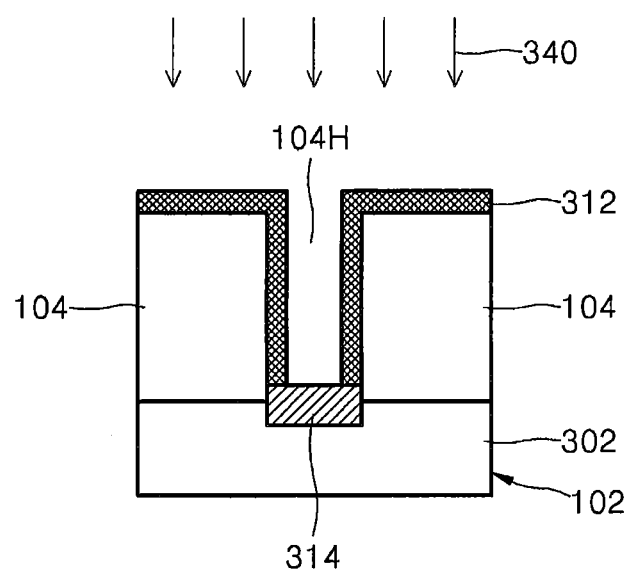

In another exemplary embodiment to form the second nickel-containing layer 312, in process 28, the second nickel-containing layer 312 formed as a nickel silicide layer 314 (FIG. 7B) as described in reference to FIGS. 6, 7A and 7B may be formed.

Hereinafter, a process of forming the nickel silicide layer 314 will be described in detail by referring to FIGS. 6, 7A, and 7B, according to another exemplary embodiment of the inventive concept.

FIG. 6 is a flowchart illustrating a method of manufacturing a semiconductor device according to an exemplary embodiment of the inventive concept.

Figure 7C:
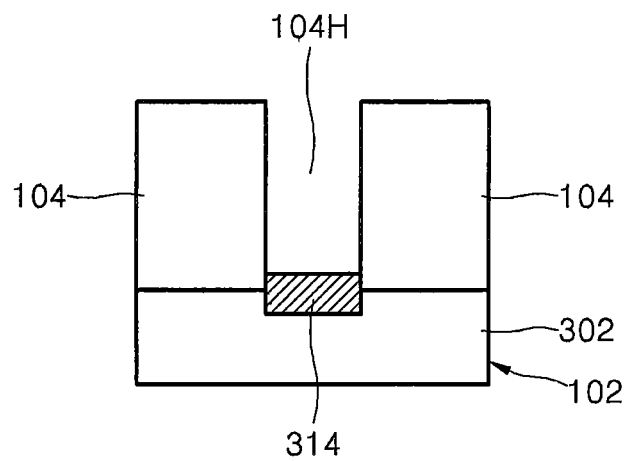

FIGS. 7A through 7C are cross-sectional views for describing a method of manufacturing a semiconductor device according to an exemplary embodiment of the inventive concept. In FIGS. 7A through 7C, like reference numerals in FIGS. 2A and 2B refer to like elements, and thus, detailed descriptions thereof will not be repeated here.

Referring to FIGS. 6 and 7A through 7C, the substrate 102 in which a silicon layer 302 is exposed is prepared in process 32.

For simplicity of the drawings, only the silicon layer 302 included in the substrate 102 is illustrated in FIGS. 7A through 7C.

A nickel alkoxide compound is vaporized in process 34, as in process 24 of FIG. 5.

The vapor 304 including the vaporized nickel alkoxide compound is supplied onto the substrate 102 to form the nickel layer 312 as illustrated in FIG. 5B on the silicon layer 302, in process 36, as in process 26 and process 28 of FIG. 4.

The vapor 304 including the vaporized nickel alkoxide compound, and the reactive gas 320, for example, the reducing gas such as hydrogen, may be supplied onto the substrate 102 at the same time to form the nickel layer 312 in process 36. Alternatively, after the first nickel-containing layer 310 formed as the NiN layer is formed by supplying the vapor 304 including the vaporized nickel alkoxide compound, the nickel layer 312 may be formed by supplying the reactive gas 320, for example, the reducing gas such as hydrogen, on the first nickel-containing layer 310, as described in reference to FIGS. 5A and 5B.

According to an exemplary embodiment, the nickel layer 312 may be formed by using the CVD process or the ALD process.

The nickel silicide ($NiSi_x$) layer 314 is formed from the silicon layer 302 and the nickel layer 312 by annealing the substrate 102 under a reducing atmosphere 340 in process 38.

According to an exemplary embodiment, a hydrogen atmosphere may be used as the reducing atmosphere 340 for annealing. The annealing may be performed at about 250 to about 1000° C. under the hydrogen atmosphere, for example, the annealing may be performed at a temperature condition of between about 300° C. and about 500° C. Also, the annealing may be performed for about 1 to 10 minutes, or for longer according to necessity. The annealing temperature and time may be adjusted in consideration of characteristics such as a thickness of the nickel silicide layer 314 that is to be formed and resistivity that is to be obtained in the nickel silicide layer 314.

The nickel silicide layer 314 may be formed by the reaction of the silicon layer 302 and the nickel layer 312 by the annealing.

After the nickel silicide layer 314 is formed, nickel of the nickel layer 312, which remains on the nickel silicide layer 314 without having participated in a silicidation process, or other unnecessary materials may be removed from a surface of the nickel silicide layer 314 to obtain a product illustrated in FIG. 7C.

The $NiSi_x$ forming the nickel silicide layer 314 may be formed of $Ni_2Si$, $NiSi$, $NiSi_2$, or a combination thereof.

After the nickel silicide layer 314 is formed, a phase changing process for changing from at least one phase forming the nickel silicide layer 314 to another desired phase may be additionally performed. NiSi has a relatively low resistivity compared to other nickel silicide phases. Thus, $NiSi_x$ of a phase other than NiSi may be shifted to NiSi in the phase changing process. According to an exemplary embodiment, the phase changing process and the annealing process under the reducing atmosphere 340 described in reference to FIG. 7B may be performed at the same time. According to another exemplary embodiment, the phase changing process may be performed in another reaction chamber which is different from a chamber in which the annealing process is performed. The phase changing process may be performed at a pressure of about 0.01 to about 10 mbar at a temperature of about 200 to about 500° C. for about 5 to about 1000 seconds.

Figure 8:
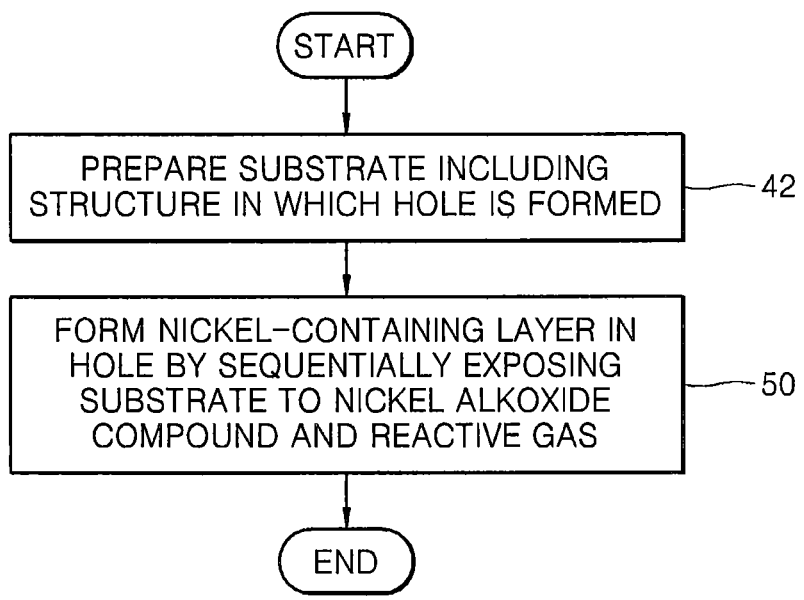
FIG. 8 is a flowchart illustrating a method of manufacturing a semiconductor device according to an exemplary embodiment of the inventive concept.

FIG. 8 is a flowchart illustrating a method of manufacturing a semiconductor device according to an exemplary embodiment of the inventive concept.

Referring to FIG. 8, a substrate including a structure in which a hole is formed is prepared according to process 42. The substrate may be the substrate 102 described in reference to FIG. 5A.

A nickel-containing layer is formed in the hole by alternately and sequentially exposing the substrate 102 to a nickel alkoxide compound and a reactive gas in process 50.

The nickel alkoxide compound may be the nickel alkoxide compound represented by Formula 1.

The reactive gas may be a reducing gas selected from hydrogen, ammonia, and an organo-metallic compound.

An ALD process may be used to perform process 50.

Figure 9:
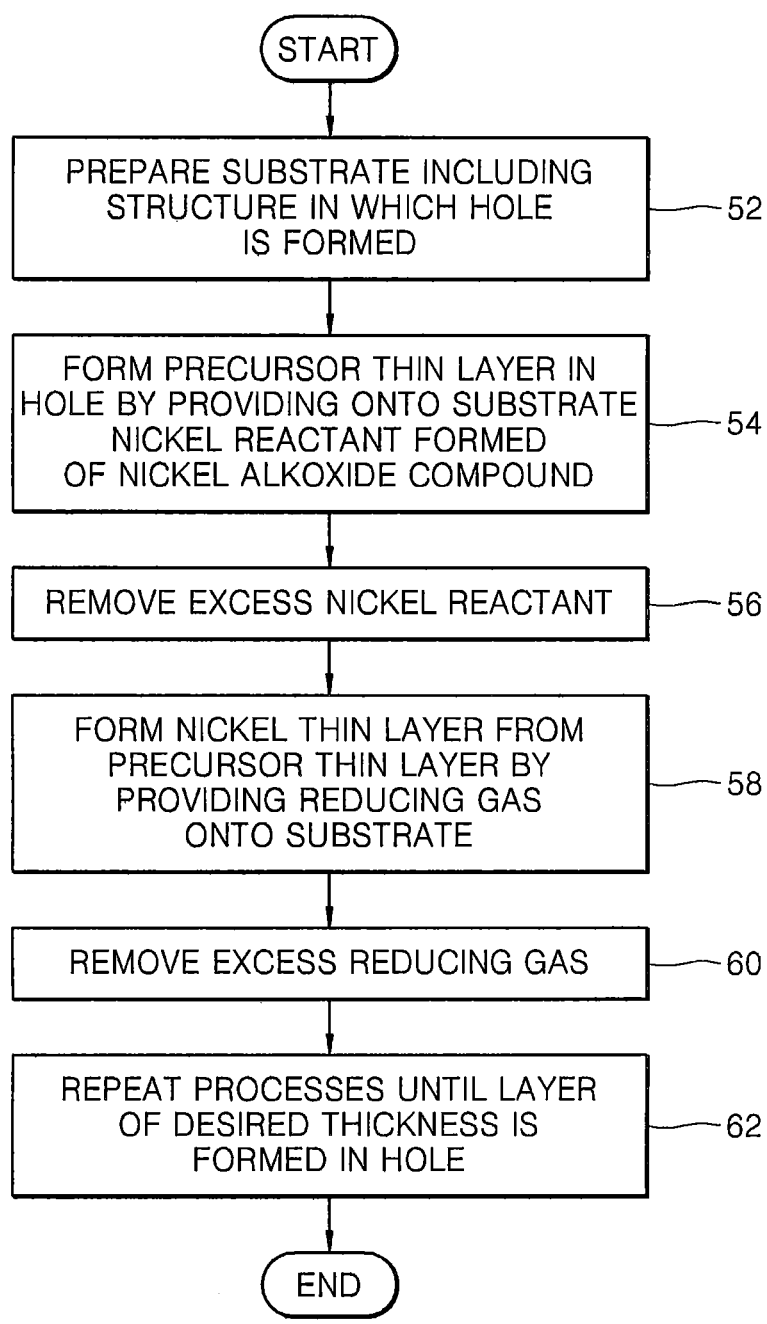
FIG. 9 is a flowchart illustrating in more detail a process of forming a Ni-containing layer by an atomic layer deposition (ALD) process in a method of manufacturing a semiconductor device according to an exemplary embodiment of the inventive concept.

FIG. 9 is a flowchart illustrating in more detail a process of forming a Ni-containing layer by the ALD process in process 50 of FIG. 8.

Referring to FIG. 9, a substrate including a structure in which a hole is formed is prepared in process 52, and then, an Ni reactant formed of the nickel alkoxide compound is supplied onto the substrate to perform a process of growing a precursor thin layer that forms a precursor thin layer in the hole, in process 54.

The Ni reactant may be obtained from the nickel alkoxide compound represented by Formula 1.

According to an exemplary embodiment, after a material compound is introduced in a deposition device for performing the ALD process, a reactant obtained from the nickel alkoxide compound supplied to a deposition reaction unit is provided onto the substrate to grow the Ni precursor thin layer, in order to form the nickel-containing layer by the ALD process. Here, a process temperature may be adjusted by heating the substrate or the deposition reaction unit. The precursor thin layer obtained by such a precursor thin layer forming process is a nickel thin layer or a thin layer generated as a portion of the nickel alkoxide compound is decomposed and/or reacted, and may have a different composition from a nickel thin layer which is to be ultimately obtained. According to an exemplary embodiment, the process temperature of the precursor thin layer forming process may be maintained at about room temperature to about 400° C., for example about 150 to about 300° C.

A first exhaust process that removes an excess Ni reactant from the substrate is performed in process 56.

An unreacted nickel compound gas or a reaction by-product gas may be exhausted from the deposition reaction unit in the first exhaust process. It is desirable that the unreacted nickel compound gas or the reaction by-product gas is completely exhausted from the deposition reaction unit. However, according to cases, it may not be completely exhausted. According to an exemplary embodiment, a purge process that uses an inert gas, such as He and Ar, may be performed for the first exhaust process. According to another exemplary embodiment, the inside of the deposition reaction unit may be decompressed. Alternatively, a process combining the purge process and the decompressing process may be used. When the first exhaust process is performed by using the decompressing process, a decompression degree may be maintained at about 0.01 to about 50 kPa, for example about 0.1 to about 5 kPa.

A process of forming a nickel thin layer that forms the nickel thin layer from the precursor thin layer by supplying the reducing gas onto the substrate is performed in process 58.

In the process of forming the nickel thin layer, the nickel thin layer is formed from the precursor thin layer formed in process 54, by the reducing gas and a heat reaction.

According to an exemplary embodiment, the process of forming the nickel thin layer may be performed at room temperature to about 400° C., for example at a temperature of about 150 to about 300° C.

The nickel alkoxide compound represented by Formula 1 has good reactivity with the reducing gas, and thus, a desired nickel thin layer may be easily obtained.

A second exhaust process that removes an excess reducing gas may be performed in process 60.

An unreacted reducing gas or a reaction by-product gas may be exhausted from the deposition reaction unit in the second exhaust process. According to an exemplary embodiment, the purge process or the decompression process may be used for the second exhaust process. The second exhaust process may be performed similarly with the first exhaust process in process 56.

Process 54 through process 60 are repeated until a layer of a desired thickness is formed in the hole, in process 62.

A thin layer deposition process formed of a series of processes formed of process 54 through process 60 may be considered to be one cycle, and the cycle may be repeated a plurality of times until the layer having the desired thickness is formed. According to an exemplary embodiment, after the cycle is performed, an unreacted nickel compound gas, an unreacted reducing gas, and a reaction by-product gas may be exhausted from the deposition reaction unit by using a method similar to that of the first exhaust process in process 56 or the second exhaust process in process 60, and then, a sequential cycle may be performed.

In the forming of the nickel-containing layer by using the ALD process as described in reference to FIG. 9, energy such as plasma, light, and voltage, may be applied to the deposition reaction unit while each process is performed. A period in which the energy is applied is not particularly restricted. For example, the energy may be applied when introducing raw materials into the ALD device, when introducing a nickel compound into the deposition reaction unit, when increasing the temperature in performing the process of depositing the nickel thin layer according to process 54 or in performing the process of forming the nickel thin layer according to process 58, when exhausting from the deposition reaction unit in the first exhaust process according to process 56 or in the second exhaust process according to process 58, when introducing the reducing gas in forming the nickel thin film according to the process 58, or between each of the aforementioned processes.

Next, exemplary embodiments in which a method of manufacturing a semiconductor device according to an exemplary embodiment of the inventive concept is applied to a vertical semiconductor device will be described in detail.

Figure 10:
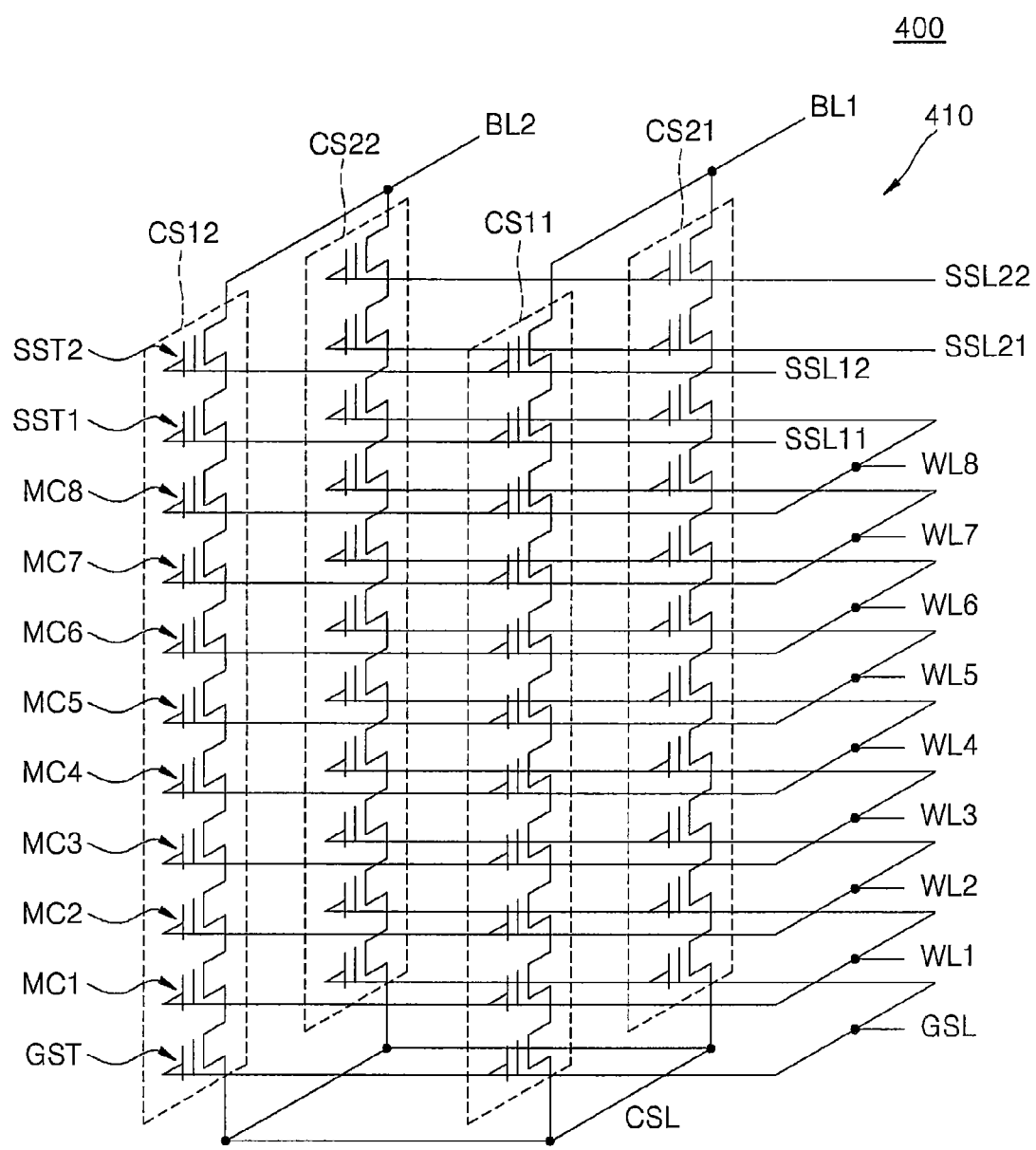
FIG. 10 is an equivalent circuit diagram of a memory cell array of a vertical non-volatile memory device which may be manufactured according to a method of manufacturing a semiconductor device according to an exemplary embodiment of the inventive concept.

FIG. 10 is an equivalent circuit diagram of a memory cell array 410 of a vertical non-volatile memory device 400 which may be manufactured according to the method of manufacturing the semiconductor device according to the present exemplary embodiment. FIG. 10 illustrates the equivalent circuit diagram of a vertical NAND flash memory device having a vertical channel structure.

The memory cell array 410 has a three-dimensional structure. The memory cell array 410 may include a plurality of cell strings CS11, CS12, CS21, and CS22 which extend in a vertical direction. Each of the cell strings CS11, CS12, CS21, and CS22 may include a ground selection transistor GST, a plurality of memory cell transistors MC1, MC2, . . . , MC8, and string selection transistors SST1, and SST2 connected in series. Although it is illustrated in FIG. 10 that one ground selection transistor GST and two string selection transistors SST1 and SST2 are connected to the plurality of cell strings CS11, CS12, CS21, and CS22, the number of the ground selection transistors and the string selection transistors connected to the cell strings CS11, CS12, CS21, and CS22 are not limited thereto. Also, the number of the plurality of memory cell transistors is not limited thereto.

The string selection transistors SST1 and SST2 of each of the plurality of cell strings CS11, CS12, CS21, and CS22 are connected to corresponding bit lines BL1 and BL2. Also, the string selection transistors SST1 and SST2 of the plurality of cell strings CS11, CS12, CS21, and CS22 may be connected to string selection lines SSL11, SSL12, SSL21, and SSL22. The ground selection transistor GST of the plurality of cell strings CS11, CS12, CS21, and CS22 may be connected by a ground selection line GSL. A common source line CSL may be connected with the ground selection transistor GST of each of the cell strings CS11, CS12, CS21, and CS22.

The plurality of memory cell transistors MC1, MC2, . . . , MC8 located at the same height may be connected to the same gate lines WL1, WL2, . . . , WL8. For example, the first memory cell transistor MC1 connected with the ground selection transistor GST may be connected with the first memory cell transistor MC1 in an adjacent column via the gate line WL1.

Figure 11:
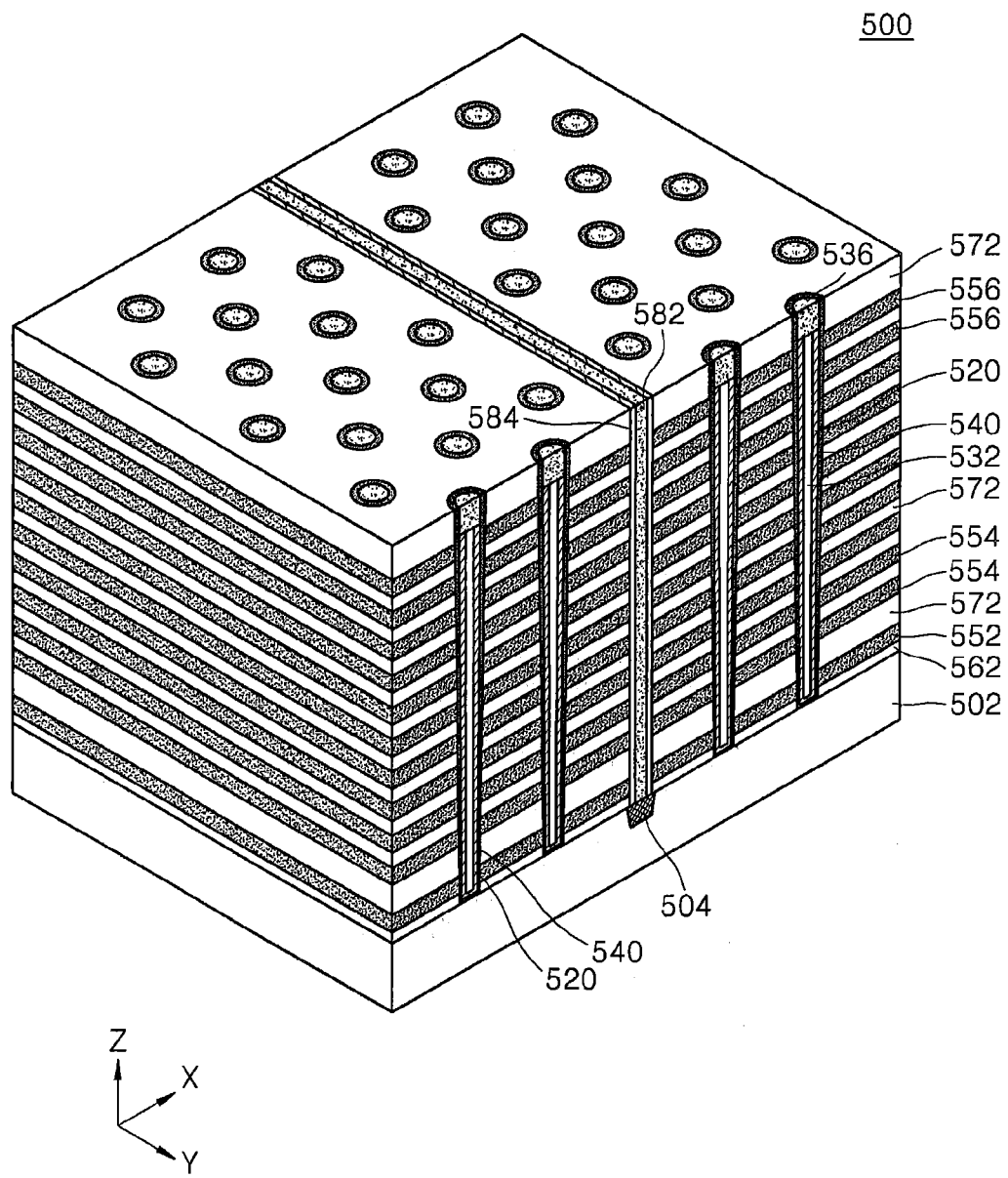
FIG. 11 is a perspective view of a partial structure of a memory cell array of a vertical non-volatile memory device which may be manufactured according to a method of manufacturing a semiconductor device according to an exemplary embodiment of the inventive concept.

FIG. 11 is a perspective view of a partial structure of an exemplary non-volatile memory device 500, which may form the memory cell array 410 of the vertical non-volatile memory device 400 illustrated in FIG. 10. In FIG. 11, the bit lines BL1 and BL2 illustrated in FIG. 10 are omitted.

Referring to FIG. 11, the non-volatile memory device 500 includes a source region 504 extending along a direction parallel to a main surface of a substrate 502 (direction Y in FIG. 11) in a portion of the substrate 502.

The substrate 502 has a structure substantially similar to that of the substrate 102 described in reference to FIG. 2A. According to an exemplary embodiment, the substrate 502 may include a well having an N-type or P-type conductivity type. For example, the substrate 502 may include a P well formed by a group III element such as boron (B) being injected. Alternatively, the substrate 502 may include a pocket p-well provided in an N well.

The source region 504 may have a different conductivity type from the substrate 502. For example, the substrate 502 may be a P-type and the source region 504 may be an N-type.

Although one source region 504 is illustrated in FIG. 11, there may be a plurality of source regions 504, extending along direction Y and each being spaced apart from one another along direction X.

A plurality of channel layers 520 extend in direction Z on the substrate 502 at a location in which each of the plurality of channel layers 520 is spaced apart from one another. According to an exemplary embodiment, the channel layer 520 may include conductive silicon or intrinsic silicon. The channel layer 520 may function as a channel region in the cell strings CS11, CS12, CS21, and CS22 of FIG. 10.

A buried insulating layer 532 may be formed in the channel layer 520. According to an exemplary embodiment, the buried insulating layer 532 may include an insulating material, such as silicon oxide, silicon oxynitride, or silicon nitride, however, it is not limited thereto.

A conductive layer 536 may be formed on the channel layer 520 and the buried insulating layer 532. The conductive layer 536 may function as a drain region in the cell strings CS11, CS12, CS21, and CS22 of FIG. 10. The conductive layer 536 may be formed of conductive polysilicon, however, it is not limited thereto.

A gate insulating layer 540 may be formed at a side wall of the channel layer 520. According to an exemplary embodiment, the gate insulating layer 540 may have a structure in which a tunnel insulating layer, a charge storage layer, and a blocking insulating layer are sequentially stacked.

A ground selection line 552, a plurality of gate lines 554, and a string selection line 556 may be formed to be spaced apart from one another along direction Z at the side wall of the channel layer 520. In FIG. 11, each of the ground selection line 552, the plurality of gate lines 554, and the string selection line 556 may be formed to extend in parallel to the substrate 502, while surrounding the side walls of the plurality of channel layers 520. The gate insulating layer 540 may be interposed between the channel layer 520 and the string selection line 556, between the channel layer 520 and the plurality of gate lines 554, and between the channel layer 520 and the ground selection line 552. Accordingly, the string selection line 556, portions of the channel layer 520 and portions of the gate insulating layer 540 adjacent to the string selection line 556 may form the string selection transistors SST1 and SST2. Also, the plurality of gate lines 554, portions of the channel layer 520 and portions of the gate insulating layer 540 adjacent to the plurality of gate lines 554 may form the plurality of memory cell transistors MC1, MC2, . . . , MC8. Also, the ground selection line 552, a portion of the channel layer 520 adjacent to the ground selection line 552, and a portion of the gate insulating layer 540 may form the ground selection transistor GST.

According to an exemplary embodiment, at least one of the ground selection line 552, the plurality of gate lines 554, and the string selection line 556 includes a nickel silicide material. According to an exemplary embodiment, each of the ground selection line 552, the plurality of gate lines 554, and the string selection line 556 may include the nickel silicide material. According to another exemplary embodiment, some of the ground selection line 552, the plurality of gate lines 554, and the string selection line 556 may be formed of nickel silicide, and the others may be formed of titanium silicide, tantalum silicide, tungsten silicide, or cobalt silicide.

An etching-stop insulating layer 562 may be formed between the ground selection line 552 and the substrate 502. The etching-stop insulating layer 562 may include an insulating material, such as silicon oxide, silicon nitride, and silicon oxynitride.

An insulating layer 572 may be interposed between the ground selection line 552 and the bottommost gate line 554 of the plurality of gate lines 554, between the plurality of gate lines 554, and between the uppermost gate line 554 of the plurality of gate lines 554 and the string selection line 556. The insulating layer 572 may include an insulating material, such as silicon oxide, silicon oxynitride, and silicon nitride.

A common source line 582 extends along direction Y above the source region 504. The common source line 582 may be formed of a conductive material, such as metal silicide, a metal, and doped polysilicon. According to an exemplary embodiment, the common source line 582 may include a metal, such as tungsten, aluminum, copper, titanium, and tantalum. According to another exemplary embodiment, the common source line 582 may be formed of nickel silicide, titanium silicide, tungsten silicide, or cobalt silicide. An insulating spacer 584 is formed at both side walls of the common source line 582. Spaces between the ground selection line 552 and the plurality of gate lines 554 and between the string selection line 556 and the common source line 582 may be electrically insulated by the insulating spacer 584.

A bit line contact (592 of FIG. 12I) may be formed on the channel layer 520 and the conductive layer 536, and a bit line (594 of FIG. 12I) extending in direction X may be formed on the bit line contact 592.

In the non-volatile memory device 500 illustrated in FIG. 11, the number of the plurality of gate lines 554, the number of the string selection lines 556, and the number of the ground selection lines 552 are not limited to what is illustrated. For example, there may be three or more sequential string selection lines 556 along direction Z. Also, there may be two or more sequential ground selection lines 552 along direction Z. Also, the number of the plurality of gate lines 554 may vary such as 16, 32, 64, etc. The number of the cell strings connected to the bit line 594 is not limited to what is illustrated in FIGS. 10 and 11, and may vary according to design. Also, the structure of the memory cell array illustrated in FIGS. 10 and 11 is exemplary, and the present inventive concept is not limited thereto. Exemplary embodiments of the inventive concept may include various types of memory cell arrays formed in a three dimensional array structure.

FIGS. 12A through 12I are cross-sectional views for describing an order of processes for manufacturing a semiconductor device according to an exemplary embodiment of the inventive concept. An embodiment in which each of the ground selection line 552, the plurality of gate lines 554, and the string selection line 556 of the non-volatile memory device 500 illustrated in FIG. 11 is formed of the nickel-containing layer will be described in reference to FIGS. 12A through 12I.

Figure 12A:
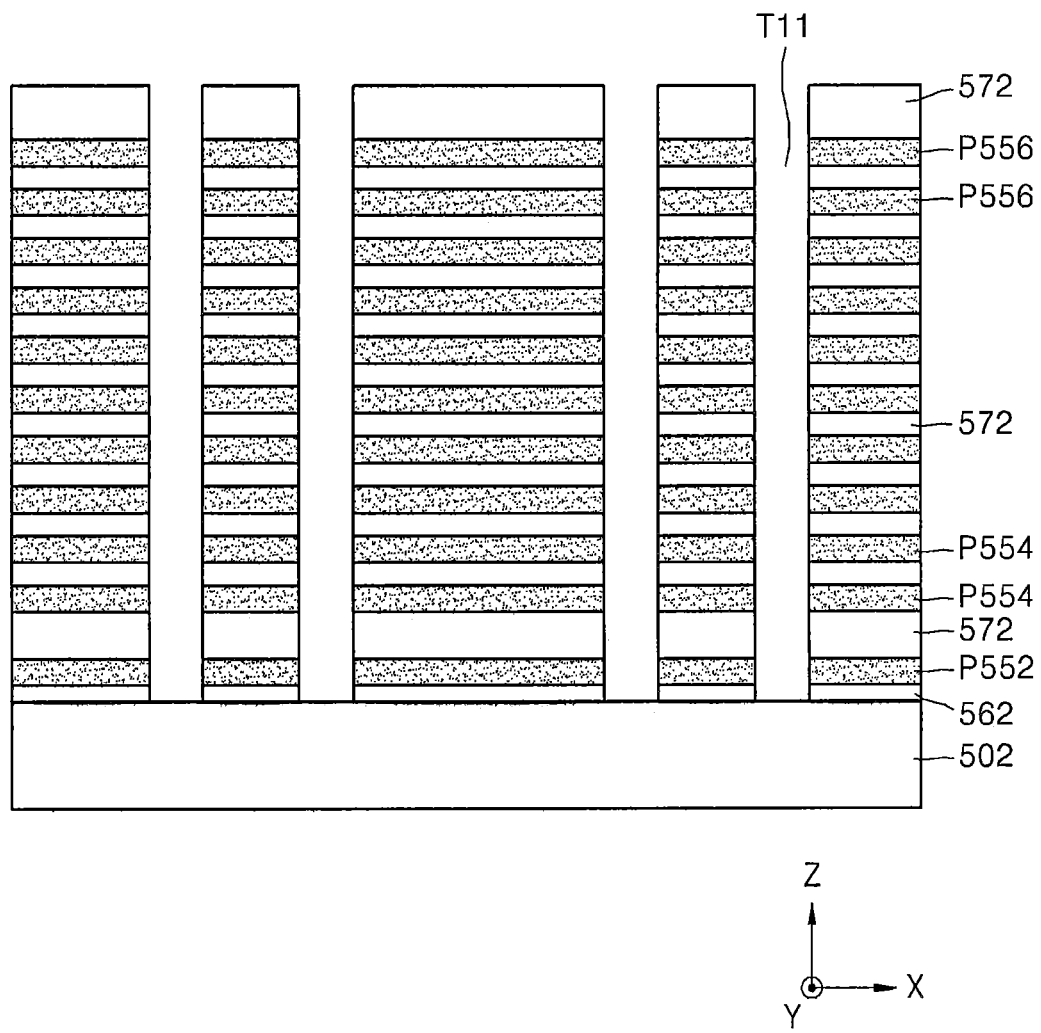
FIGS. 12A through 12I are cross-sectional views for describing an order of processes for manufacturing a semiconductor device according to an exemplary embodiment of the inventive concept.

Referring to FIG. 12A, the etching-stop insulating layer 562 is formed on the substrate 502 and a first sacrificial layer P552 is formed on the etching-stop insulating layer 562. One of a plurality of insulating layers 572 and one of a plurality of second sacrificial layers P554 are alternately stacked on the first sacrificial layer P552. One of the insulating layers 572 and one of third sacrificial layers P556 are alternately stacked on the uppermost of the second sacrificial layers P554.

Next, a first opening T11 penetrating the plurality of insulating layers 572, the first through third sacrificial layers P552, P554, and P556, and the etching-stop insulating layer 562 is formed. The substrate 502 is exposed through the first opening T11.

According to an exemplary embodiment, the etching-stop insulating layer 562 and the plurality of insulating layers 572 may be formed of insulating materials, for example silicon oxide, silicon nitride, or silicon oxynitride. According to an exemplary embodiment, the first through third sacrificial layers P552, P554, and P556 may be formed of conductive materials, for example polysilicon doped with impurities.

According to an exemplary embodiment, a mask pattern is formed on the uppermost insulating layer 572 to form the first opening T11, and the plurality of insulating layers 572, the first through third sacrificial layers P552, P554, and P556, and the etching-stop insulating layer 562 may be anisotropically etched by using the mask pattern as an etch mask until the substrate 502 is exposed.

The first opening T11 may form a channel hole to form a channel layer (520 of FIG. 1) in a sequential process.

Figure 12B:
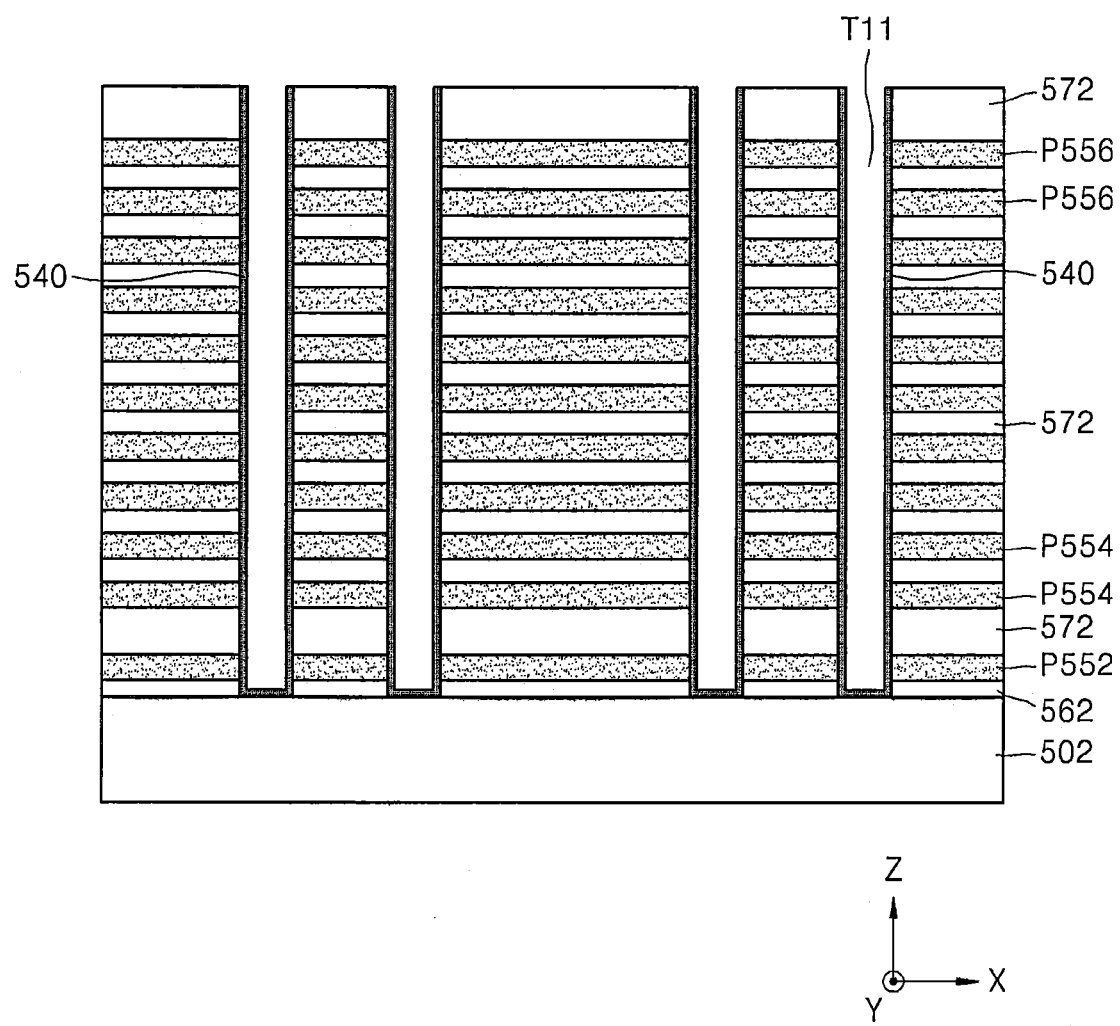

Referring to FIG. 12B, a gate insulating layer 540 is formed to cover a side wall and a bottom surface of the first opening T11.

According to an exemplary embodiment, the gate insulating layer 540 may include a tunnel insulating layer, a charge storage layer, and a blocking insulating layer which are sequentially stacked.

Figure 12C:
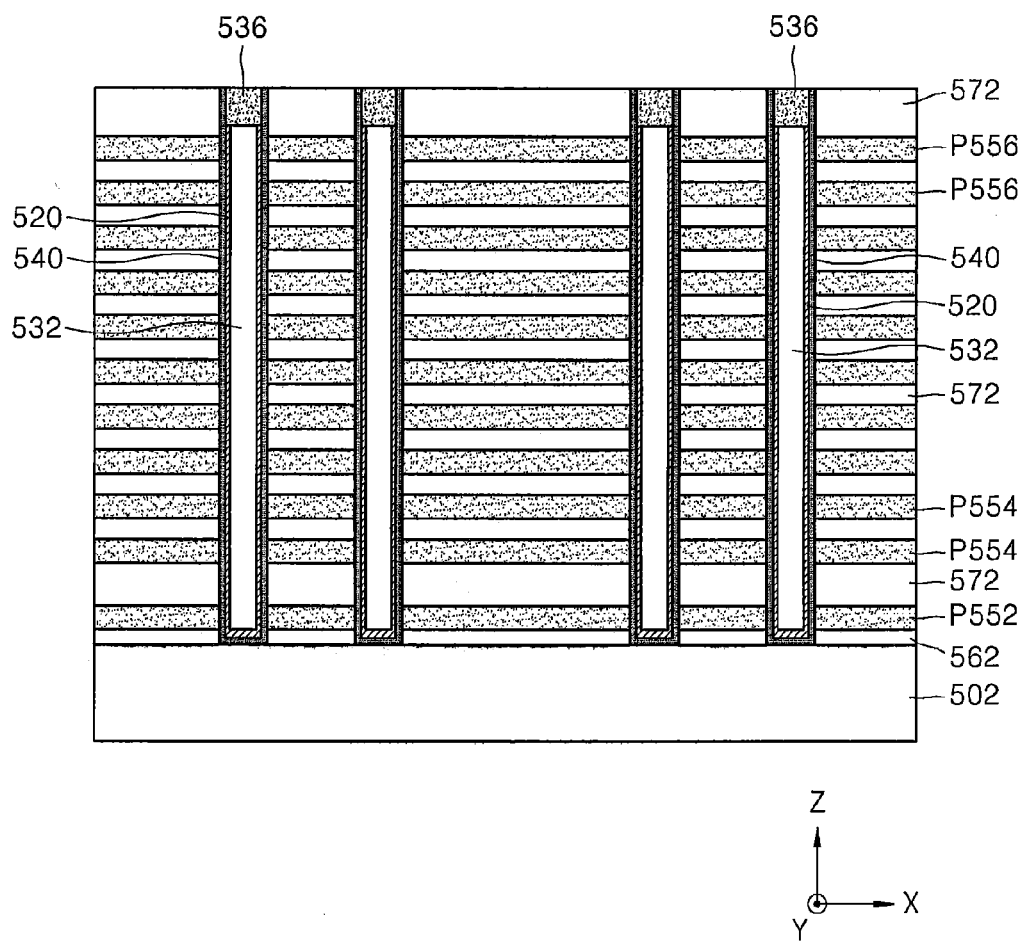

Referring to FIG. 12C, the channel layer 520 is formed on the gate insulating layer 540 in the first opening T11 (refer to FIG. 12B), and a buried insulating layer 532 filling the first opening T11 above the channel layer 520 is formed.

Then, a portion of each of the channel layer 520 and the buried insulating layer 532 filling the first opening T11 is etched-back to prepare a space in an upper region near an entrance of the first opening T11, and then, a conductive layer 536 filling the upper space near the entrance of the first opening T11 is formed.

According to an exemplary embodiment, the conductive layer 536 may be formed of polysilicon doped with impurities.

Figure 12D:
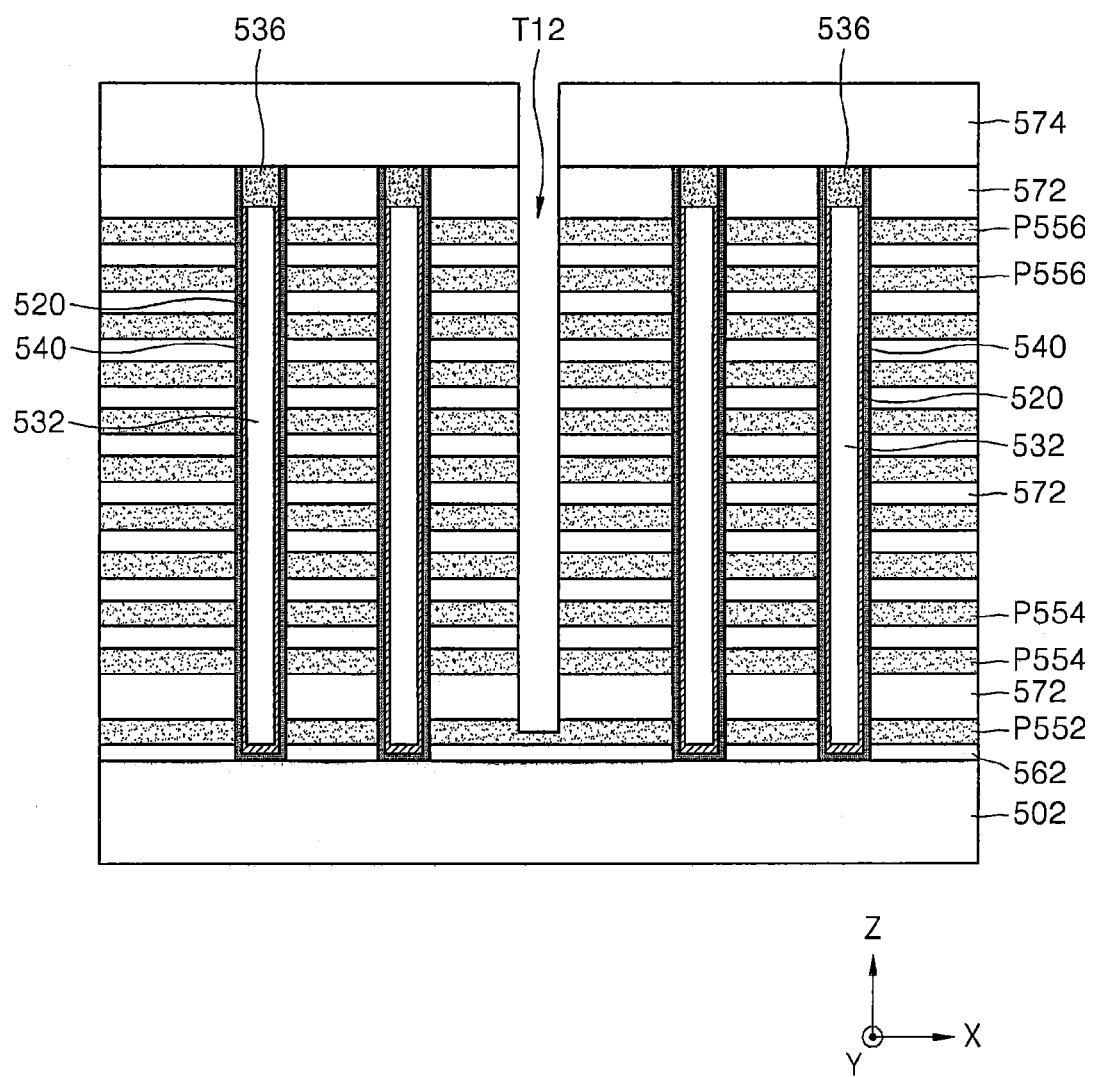

Referring to FIG. 12D, after an insulating layer 574 covering the insulating layer 572 and the conductive layer 536 is formed, the insulating layers 572 and 574, and the first through third sacrificial layers P552, P554, and P556 are anisotropically etched to form a second opening T12 exposing the first sacrificial layer P552.

The insulating layers 572 and 574 may be formed of insulating materials, such as silicon oxide, silicon nitride, and silicon oxynitride.

The second opening T12 may be formed to extend along direction Y. Also, side walls of the insulating layers 572 and 574, an upper surface of the first sacrificial layer P552, and side walls of the second and third sacrificial layers P554 and P556 may be exposed as the second opening T12 is formed.

According to an exemplary embodiment, the first sacrificial layer P552 may be etched to a predetermined thickness when the second opening T12 is formed, however, the second opening T12 may be formed such that the second opening T12 does not completely penetrate the first sacrificial layer P552.

Figure 12E:
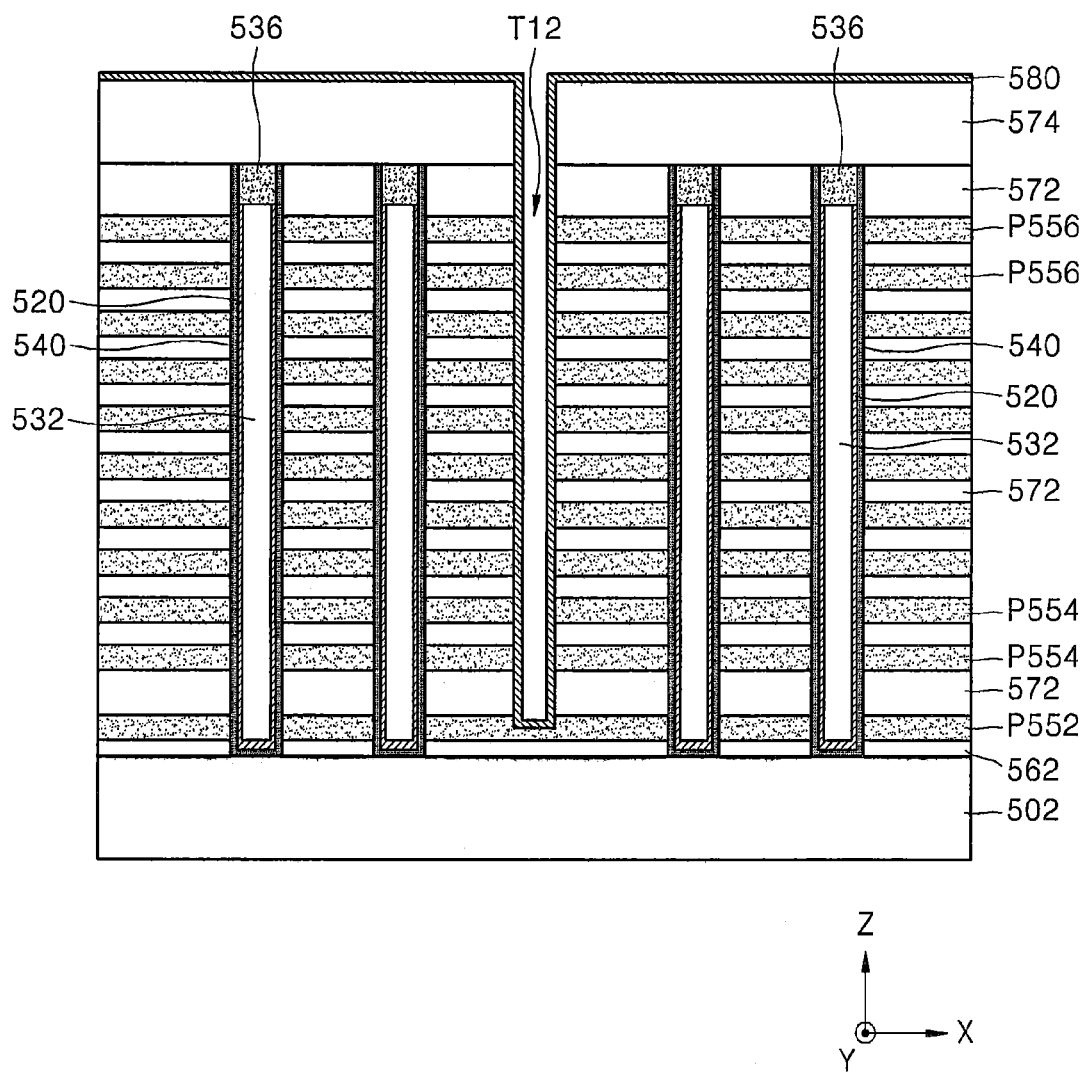

Referring to FIG. 12E, similarly to processes 34 and 36 of FIG. 6, the nickel alkoxide compound of Formula 1 is vaporized, and a vapor including the vaporized nickel alkoxide compound is supplied onto the substrate 502 to form a nickel layer 580 covering an inner wall of the second opening T12.

According to an exemplary embodiment, the vapor including the vaporized nickel alkoxide compound and a reducing gas such as hydrogen may be supplied to the substrate 502 at the same time to form the nickel layer 580. Alternatively, as described in reference to FIGS. 5A and 5B, the vapor 304 including the vaporized nickel alkoxide compound is supplied onto the substrate 502 to form a first nickel-containing layer similar to the first nickel-containing layer 310 (refer to FIG. 5A) formed of NiN, and then, the reactive gas 320 (refer to FIG. 5B), for example, the reducing gas such as hydrogen, may be supplied onto the first nickel-containing layer 310 to form the nickel layer 580.

According to an exemplary embodiment, the nickel layer 580 may be formed by the CVD process or the ALD process.

When forming the nickel layer 580 illustrated in FIG. 12E, the nickel alkoxide compound of Formula 1 may be used as a material compound. The nickel alkoxide compound of Formula 1 provides properties required by the material compound in a deposition process that forms a thin layer by vaporizing the material compound, such as a low melting point, a high vapor pressure, a delivery capability in a liquid state, an availability of vaporization, and high heat stability. Thus, the process of forming the nickel layer 580 by using the nickel alkoxide compound is simplified, and the nickel layer 580 that has a superior gap-filling and step coverage characteristic may be obtained even inside the hole having a large aspect ratio such as the second opening T12.

Figure 12F:
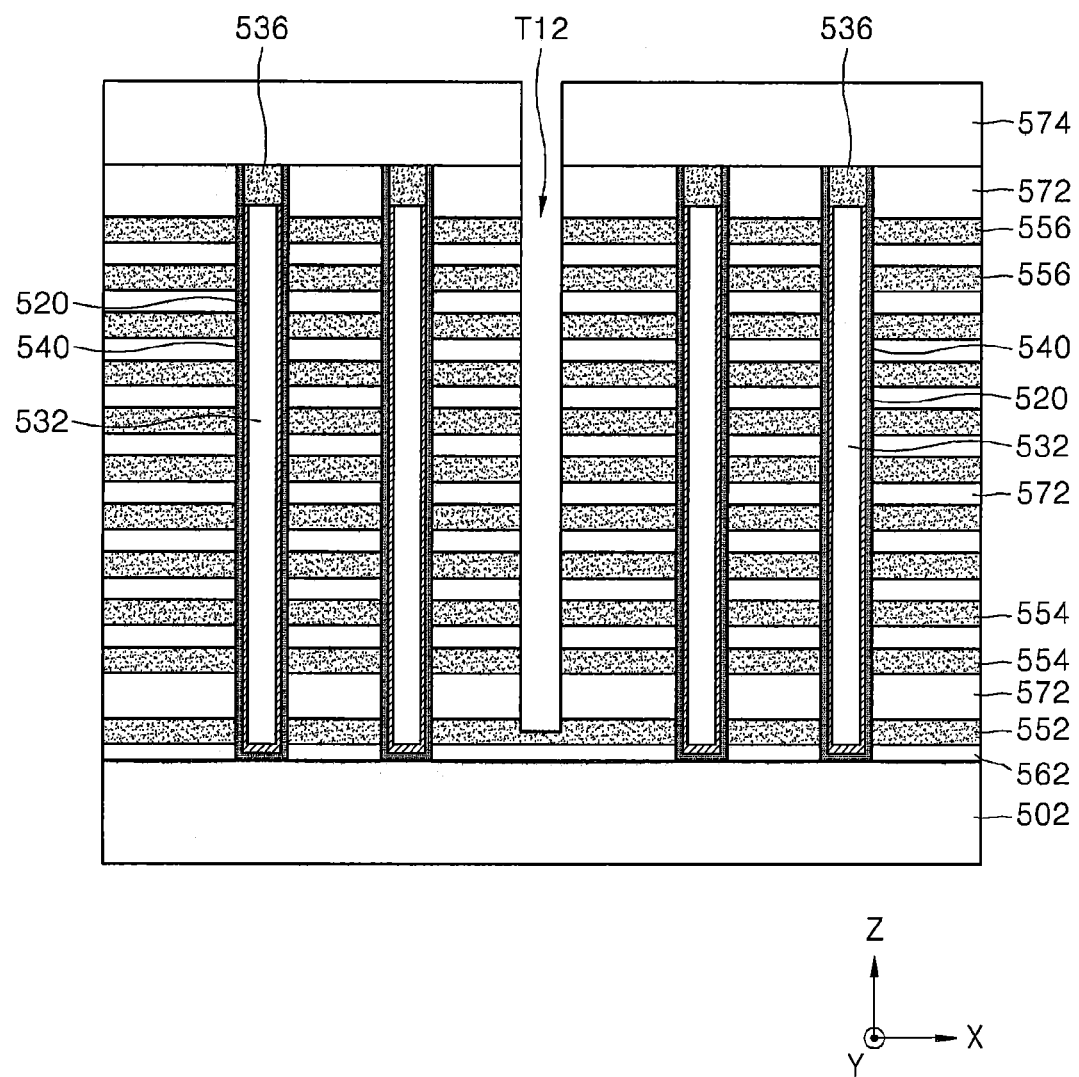

Referring to FIG. 12F, a silicidation process is performed by inducing a reaction of the first through third sacrificial layers P552, P554, and P556 and the nickel layer 580 by annealing a product of the nickel layer 580 formed under a reducing atmosphere. As a result, each of the first through third sacrificial layers P552, P554, and P556 may be converted to the ground selection line 552, the plurality of gate lines 554, and the string selection line 556 which are formed of the nickel silicide layer.

According to an exemplary embodiment, the reducing atmosphere for the annealing of the silicidation process may include a hydrogen atmosphere. The annealing may be performed under the hydrogen atmosphere at a temperature of about 200 to about 600° C. for about 1 to about 10 hours.

The annealing temperature and time may be adjusted in consideration of a thickness and area of the first through third sacrificial layers P552, P554, and P556, a thickness of the nickel silicide layer to be formed, and resistivity to be obtained from the nickel silicide layer.

According to an exemplary embodiment, a phase changing process for shifting the nickel silicide layer forming the ground selection line 552, the plurality of gate lines 554, and the string selection line 556 to an NiSi phase having a relatively low resistivity may be performed. The phase changing process may be performed at a pressure of about 0.01 to about 10 mbar, under a temperature of about 200 to about 500° C., for a period of time selected within a range of about 5 to about 1000 seconds.

In general, to form the ground selection line 552, the plurality of gate lines 554, and the string selection line 556, the first through third sacrificial layers P552, P554, and P556 are removed and a new conductive material is filled in the removed portion. However, in the method of manufacturing the semiconductor device according to the present exemplary embodiment, the first through third sacrificial layers P552, P554, and P556 are not removed and converted to the nickel silicide layer. Thus, a process of forming the ground selection line 552, the plurality of gate lines 554, and the string selection line 556 may be simplified. Also, as there is no need to remove the first through third sacrificial layers P552, P554, and P556, a height of the first through third sacrificial layers P552, P554, and P556 in a vertical direction may be reduced so that an etching process for forming the first opening T11 and the second opening T12 may be simplified and a cell current may increase.

After the ground selection line 552, the plurality of gate lines 554, and the string selection line 556 formed of the nickel silicide layer are formed, a remaining and unnecessary portion of the nickel layer 580, which has not participated in the silicidation reaction, may be removed to expose the ground selection line 552, the plurality of gate lines 554, and the string selection line 556 through the second opening T12.

Figure 12G:
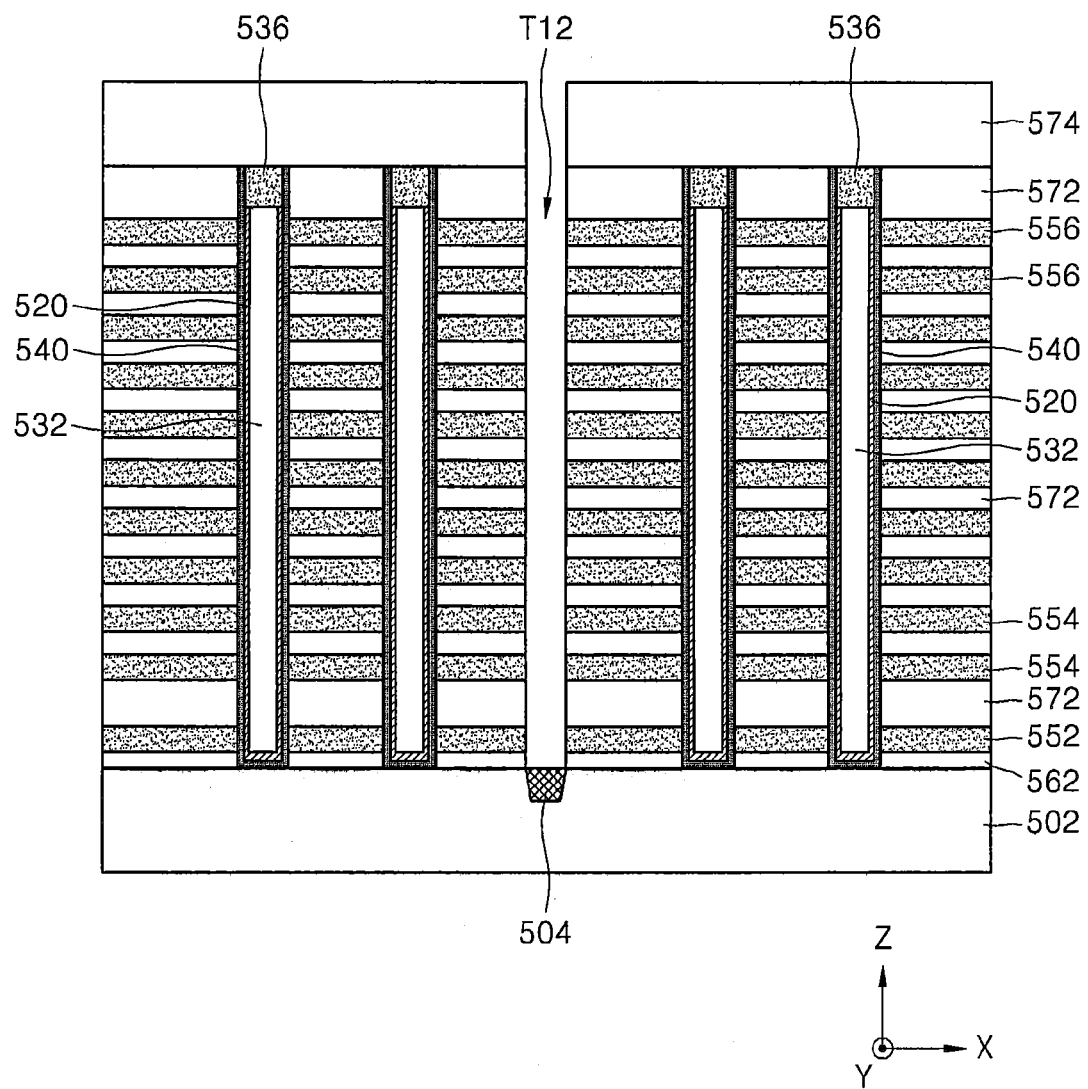

Referring to FIG. 12G, at a product of FIG. 12F, a portion of the ground selection line 252 exposed in a bottom surface of the second opening T12 and a portion of the below etching-stop insulating layer 562 are removed to expose the substrate 502.

Then, impurities are injected into the exposed substrate 502 through the second opening T12 to form the source region 504 in an upper area of the substrate 502.

According to an exemplary embodiment, the impurities may be N-type impurities, such as phosphorus (P) and arsenic (As), or P-type impurities, such as B.

Figure 12H:
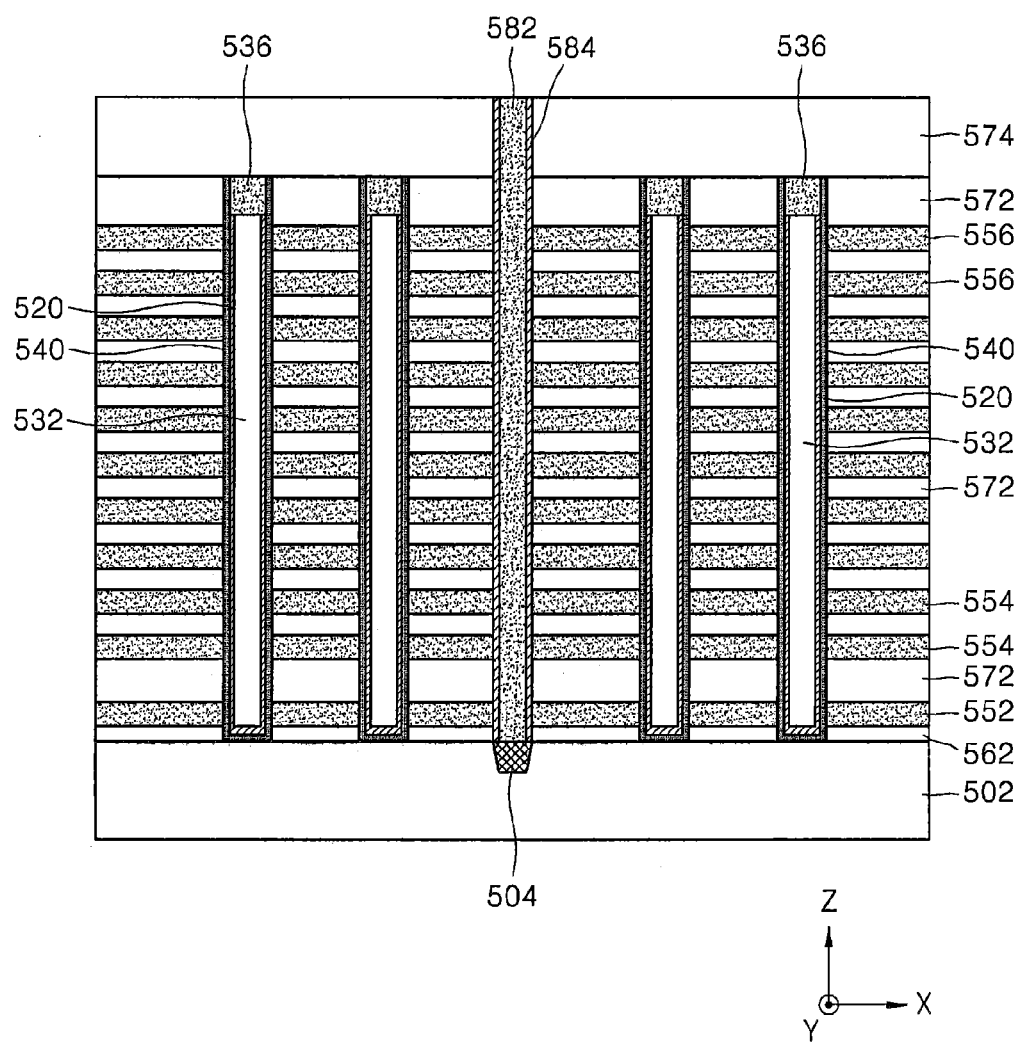

Referring to FIG. 12H, after an insulating thin layer conformally covering an inner wall of the second opening T12 (refer to FIG. 12G) and an upper surface of the insulating layer 574 is formed, unnecessary portions of the insulating thin layer are removed by anisotropic etching such that a portion of the insulating thin layer is left in a form of the insulating spacer 584 covering the inner side wall of the second opening T12. After the insulating spacer 584 is formed, the source region 504 may be exposed in the bottom surface of the second opening T12.

The insulating spacer 584 may be formed of silicon nitride, silicon oxide, or silicon oxynitride.

Then, a common source line 582 filling the second opening T12 above the insulating spacer 584 is formed.

The common source line 582 is electrically connected with the source region 504 of the substrate 502 and extends in the second opening T12 in direction Y.

According to an exemplary embodiment, the common source line 582 may be formed of a metal, polysilicon, metal silicide, or a combination thereof. For example, the common source line 582 may be formed of a metal, such as tungsten, aluminum, copper, titanium, and tantalum, metal silicide, such as polysilicon doped with impurities, nickel silicide, titanium silicide, tungsten silicide, and cobalt silicide, or a combination thereof.

According to an exemplary embodiment, the common source line 582 may be formed of a nickel layer. Here, to form the common source line 582, similarly to processes 34 and 36 of FIG. 6, a vapor including the nickel alkoxide compound of Formula 1 is supplied onto the substrate 502 to form the nickel layer filling the second opening T12. A CVD process or an ALD process may be used to form the nickel layer for forming the common source line 582, and, after the nickel layer is formed, unnecessary portions of the nickel layer, which are outside the second opening T12, may be removed so that the nickel layer remains only inside the second opening T12.

When the common source line 582 is formed of the nickel layer, the nickel alkoxide compound of Formula 1 is used so that a process of forming the nickel layer may be simplified and the nickel layer having a superior gap-filling characteristic may be obtained in the hole having a relatively large aspect ratio as the second opening T12.

Figure 12I:
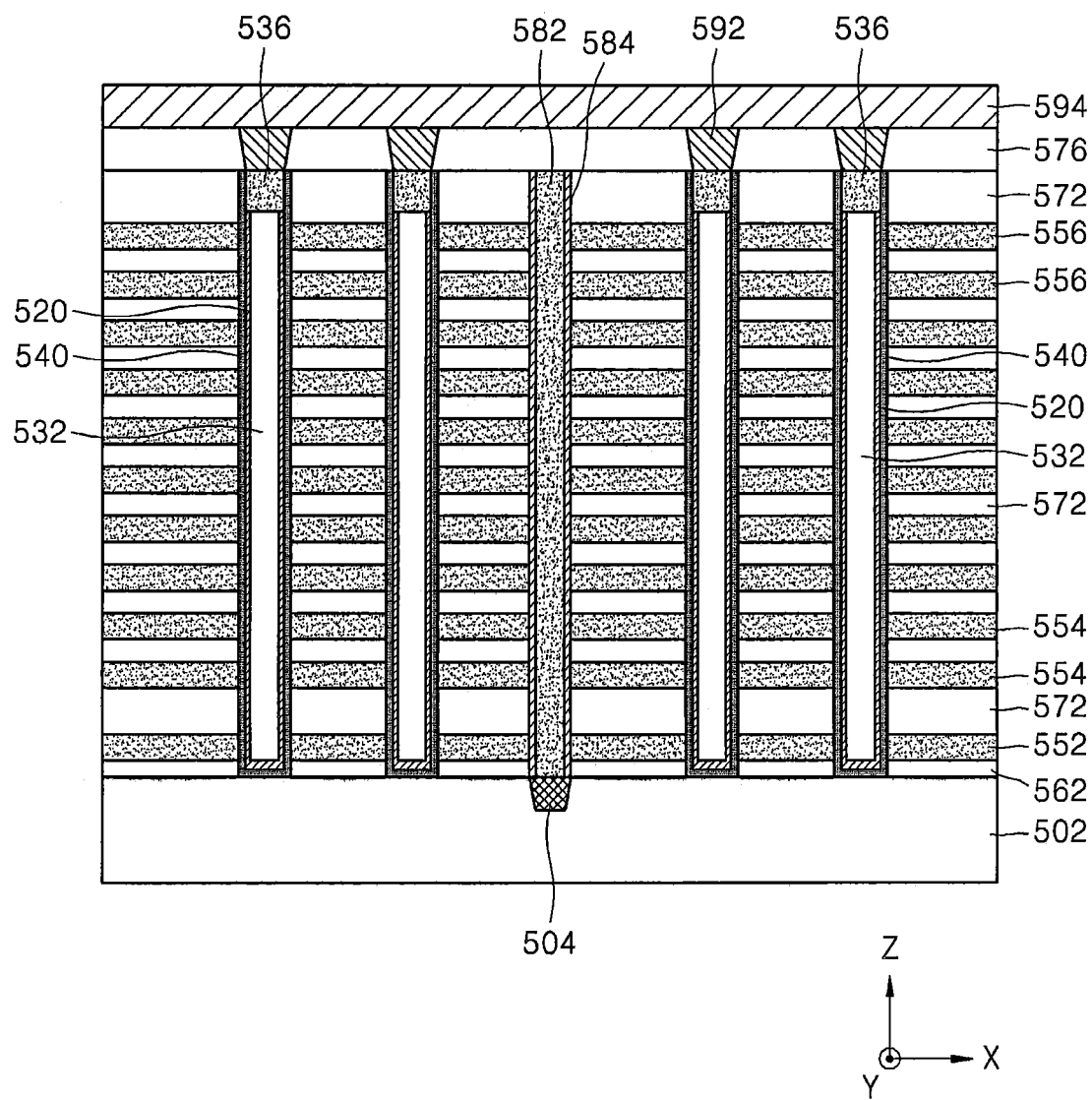

Referring to FIG. 12I, the insulating later (574 of FIG. 12H) exposed in an upper region is removed to expose upper surfaces of the below insulating layer 572 and the conductive layer 536.

According to an exemplary embodiment to remove the insulating layer 574, a planarization process that planarizes the insulating layer 574 until the upper surface of the conductive layer 536 is exposed may be performed. During the planarization process, a portion of the common source line 582 and a portion of the insulating spacer 584 may be together removed.

Then, an upper insulating layer 576 is formed on the conductive layer 536, the insulating layer 572, and the common source line 582, and a plurality of bit line contacts 592 penetrating the upper insulating layer 576 to be electrically connected with the conductive layer 536 are formed.

Then, a bit line 594 connecting the bit line contacts 592 arranged in series in direction X of the plurality of bit line contacts 592 is formed on the upper insulating layer 576. The bit lines 594 may have a line shape connected in direction X.

Figure 13:
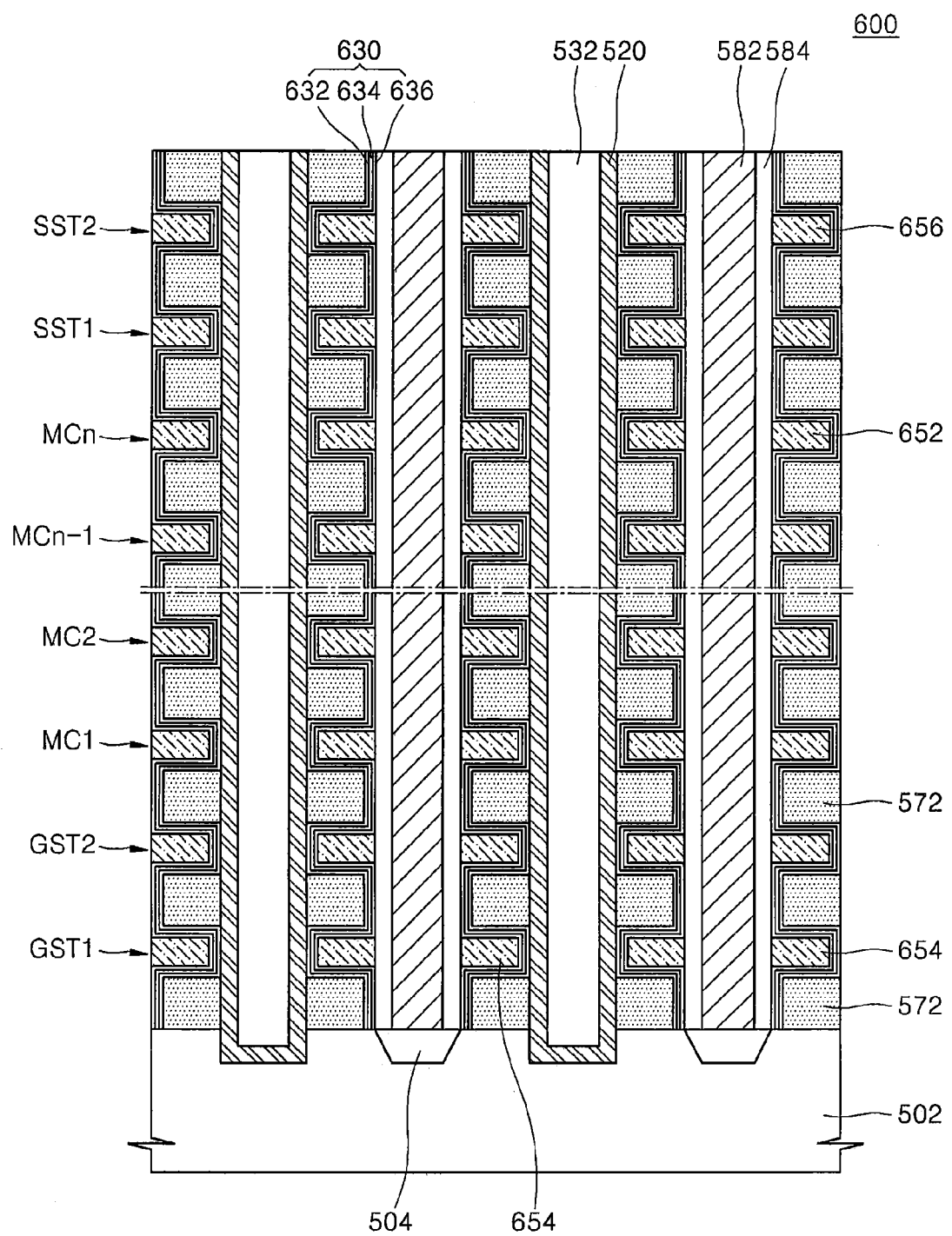
FIG. 13 is a perspective view of a partial structure of a memory cell array of a vertical non-volatile memory device which may be manufactured according to a method of manufacturing a semiconductor device according to an exemplary embodiment of the inventive concept.

FIG. 13 is a perspective view of a partial structure of an exemplary non-volatile memory device 600, which may form the memory cell array 410 of the vertical non-volatile memory device 400 illustrated in FIG. 10. In FIG. 13, like reference numerals in FIGS. 10 through 12I denote like elements, and their detailed descriptions will be omitted.

Referring to FIG. 13, ground selection transistors GST1 and GST2, a plurality of memory cells MC1, MC2, . . . , MCn, and the string selection transistors SST1 and SST2 may be sequentially formed on the substrate 502 in the non-volatile memory device 600. The insulating layer 572 may be arranged between the ground selection transistors GST1 and GST2, the plurality of memory cells MC1, MC2, . . . , MCn, and the string selection transistors SST1 and SST2.

The channel layer 520 extends vertically on a region of the substrate 502. First through third control gate electrodes 652, 654, and 656 forming the ground selection transistors GST1 and GST2, the plurality of memory cells MC1, MC2, . . . , MCn, and the string selection transistors SST1 and SST2 may be arranged along a side wall of the channel layer 520. Also, a storage structure 630 is interposed between the first through third control gate electrodes 652, 654, and 656, and the channel layer 520 to sequentially extend along surfaces of the first through third control gate electrodes 652, 654, and 656. The channel layer 520 may be filled with the buried insulating layer 532.

The storage structure 630 may include a tunneling insulating layer 632, a charge storage layer 634, and a blocking insulating layer 636.

Each of the plurality of memory cells MC1, MC2, . . . , MCn may include the first control gate electrode 652 electrically connected with the storage structure 630. The ground selection transistor GST1 and GST2 may include the second control gate electrode 654 electrically connected with the storage structure 630. The string selection transistors SST1 and SST2 may include the third control gate electrode 656 electrically connected with the storage structure 630. The storage structure 630 may function as a gate insulating layer.

The common source line 582 is formed on the source region 504 formed in the upper region of the substrate 502. The ground selection transistors GST1 and GST2, the plurality of memory cells MC1, MC2, . . . , MCn, and the string selection transistors SST1 and SST2 may be located between the channel layer 520 and the common source line 582.

A side wall of the common source line 582 is covered by the insulating spacer 584.

FIGS. 14A through 14J are cross-sectional views for describing an order of processes for manufacturing a semiconductor device according to an exemplary embodiment of the inventive concept. Referring to FIGS. 14A through 14J, an embodiment in which the first through third control gate electrodes 652, 654, and 656 in the non-volatile memory device 600 illustrated in FIG. 13 are formed of the nickel-containing layer will be described. In FIGS. 14A through 14J, like reference numerals in FIGS. 10 through 13 denote like elements, and thus, their detailed descriptions will be omitted.

Figure 14A:
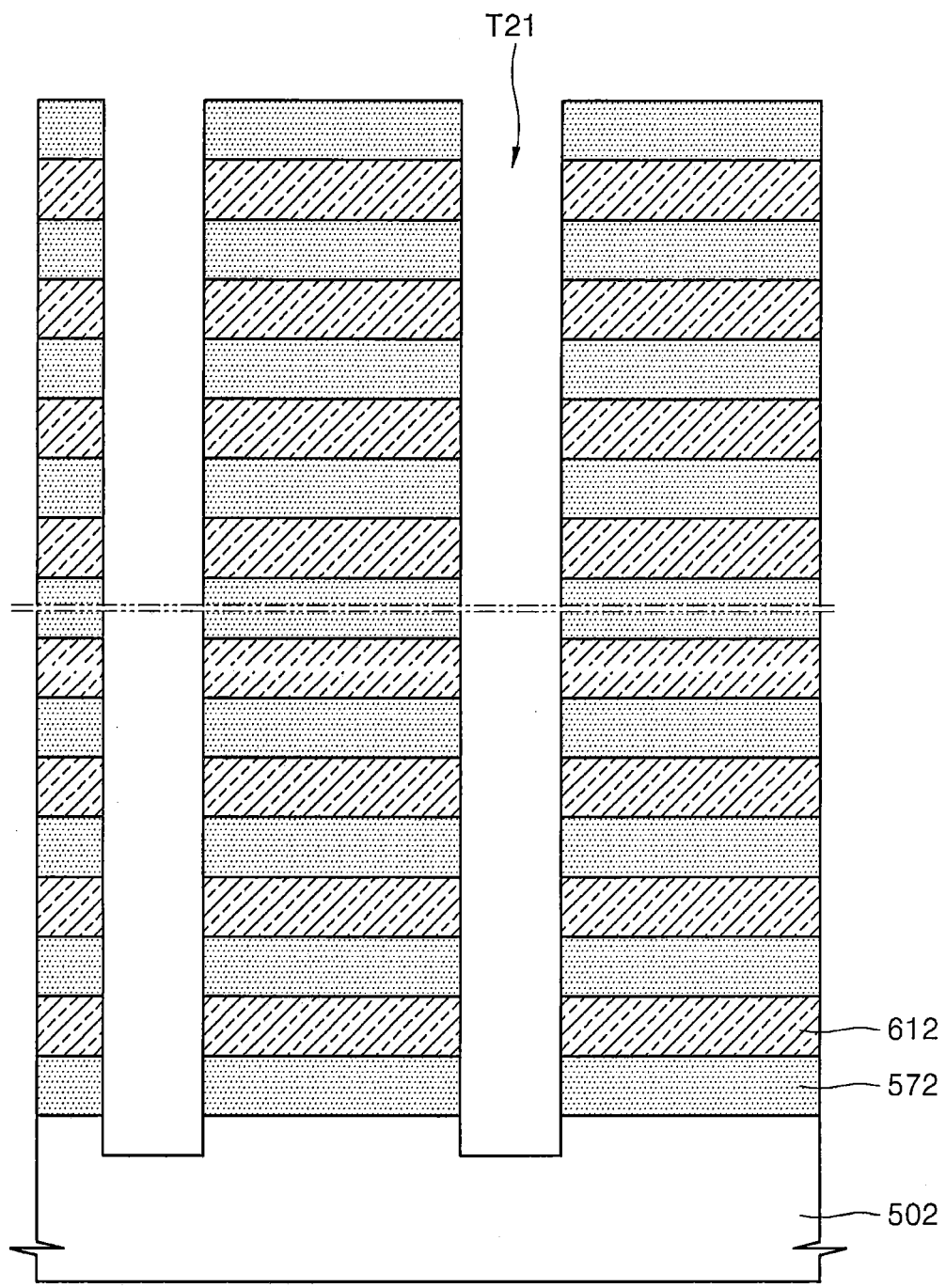
FIGS. 14A through 14J are cross-sectional views for describing an order of processes for manufacturing a semiconductor device according to an exemplary embodiment of the inventive concept.

Referring to FIG. 14A, one of the plurality of insulating layers 572 and one of a plurality of sacrificial layers 612 are alternately formed on the substrate 502, and then, portions of the plurality of insulating layers 572 and the plurality of sacrificial layers 612 are removed to form a plurality of first openings T21 exposing the substrate 502.

The plurality of sacrificial layers 612 may be formed of silicon, silicon oxide, silicon carbide, or silicon oxynitride.

Figure 14B:
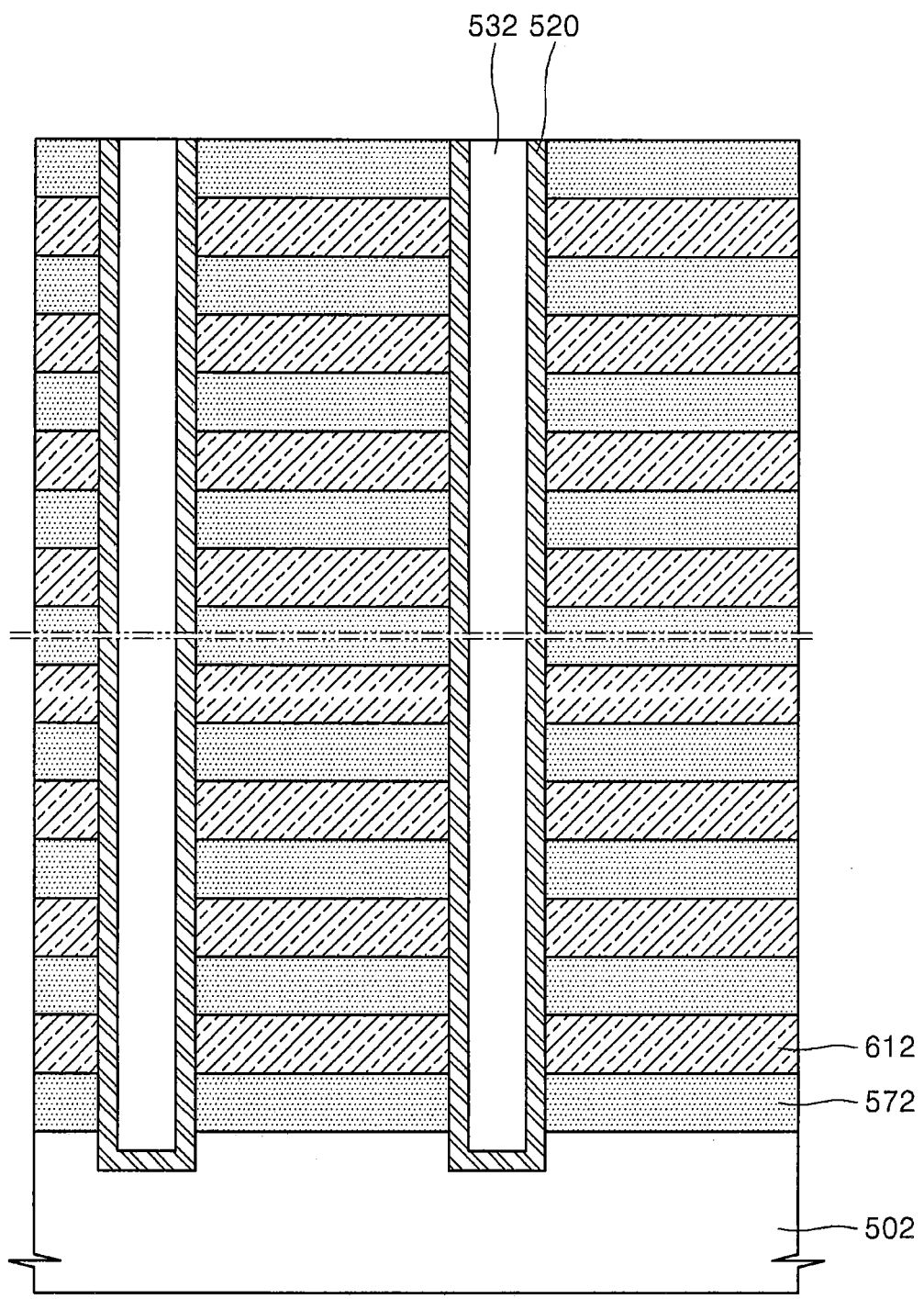

Referring to FIG. 14B, the channel layer 520 covering side walls of the plurality of first openings T21 (refer to FIG. 14) by a consistent depth is formed, and then, the buried insulating layer 532 filling the first openings T21 above the channel layer 520 is formed.

Figure 14C:
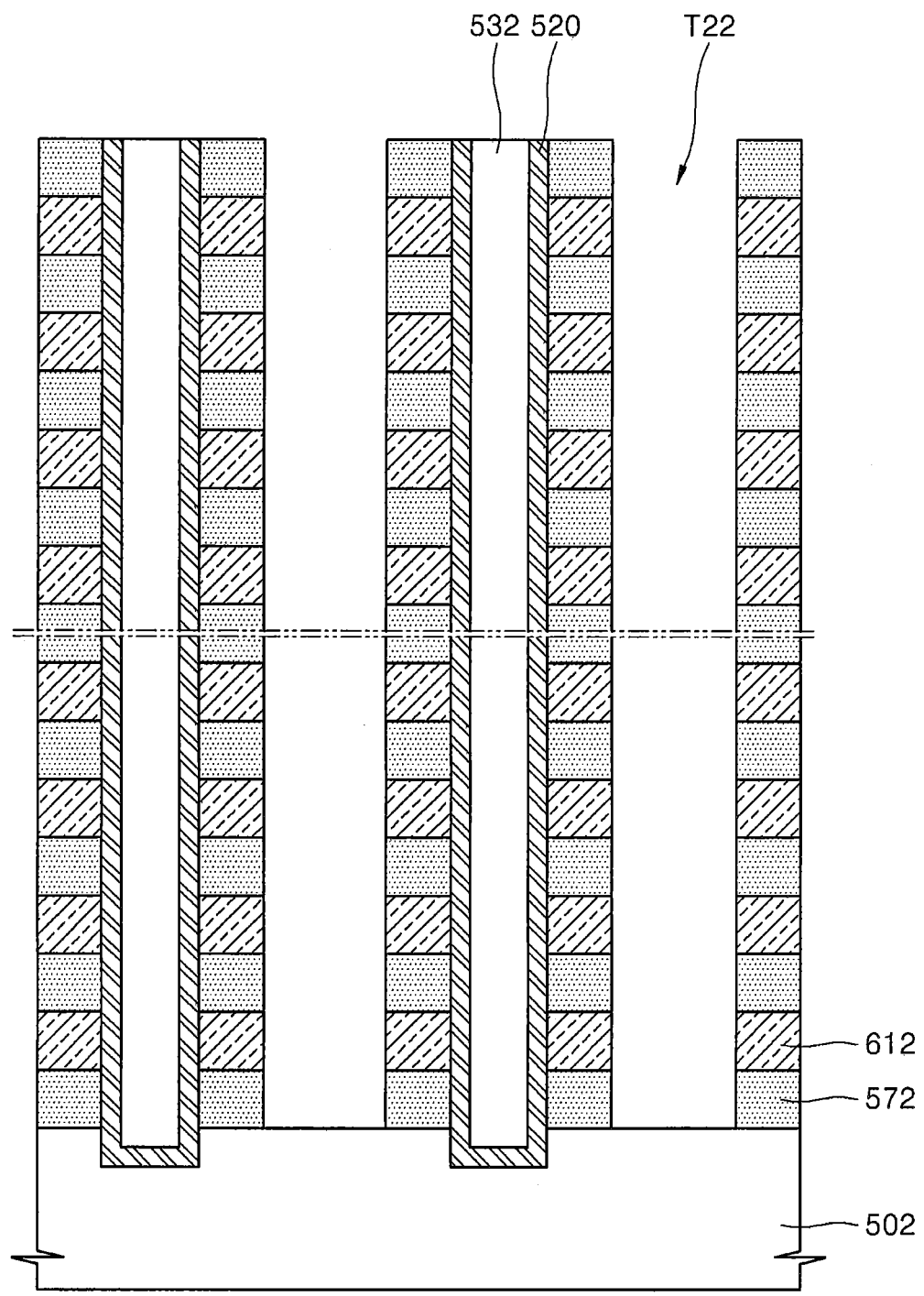

Referring to FIG. 14C, other portions of the plurality of insulating layers 572 and the plurality of sacrificial layers 612 are removed from a product of the plurality of channel layers 520 formed so that a plurality of second openings T22 exposing the substrate 502 are formed.

Figure 14D:
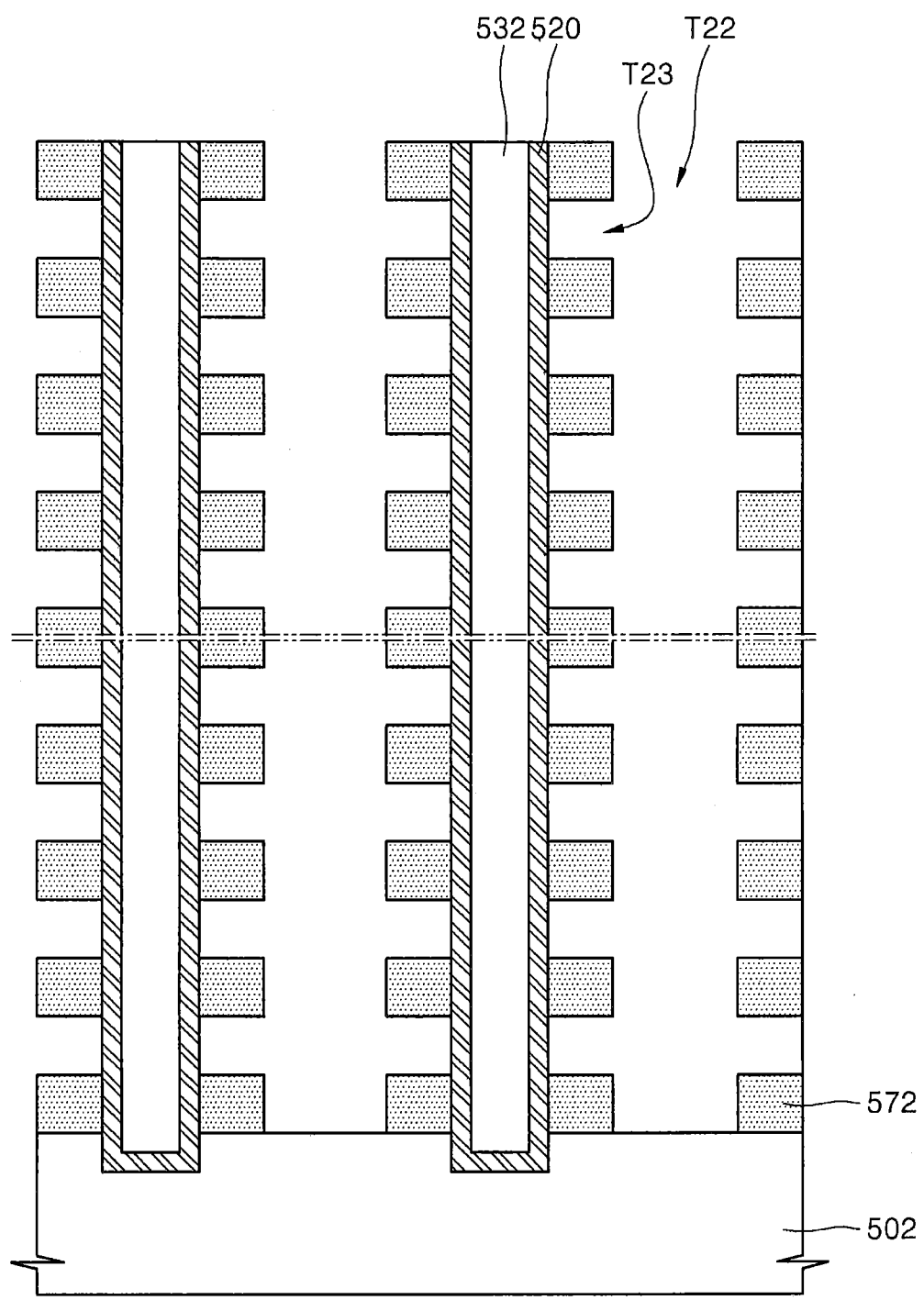

Referring to FIG. 14D, the plurality of sacrificial layers 612 interposed between the plurality of insulating layers 572 are removed through the plurality of second openings T22 to form a plurality of third openings T23 connected with the plurality of second openings T22.

To form the plurality of the third openings T23, an etchant may be penetrated between the plurality of insulating layers 572 through the second openings T22 to remove the plurality of sacrificial layers 612. The channel layer 520 is exposed through the plurality of third openings T23.

Figure 14E:
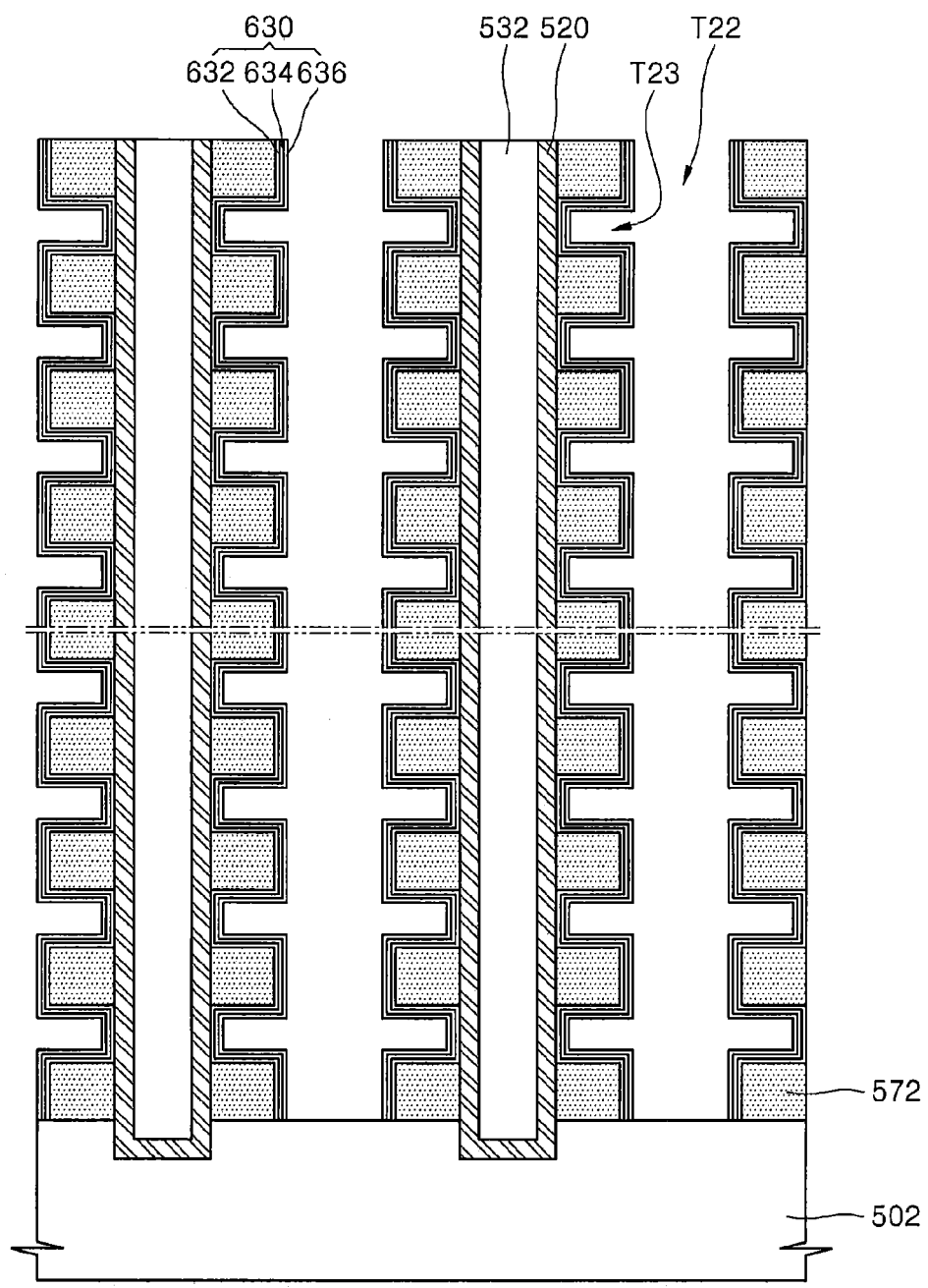

Referring to FIG. 14E, the storage structure 630 is formed on a surface of the plurality of insulating layers 572 exposed through the plurality of second openings T22 and the plurality of third openings T23 and on a surface of the channel layer 520.

The storage structure 630 may include the tunneling insulating layer 632, the charge storage layer 634, and the blocking insulating layer 636. The tunneling insulating layer 632 may be formed to contact the channel layer 520. The charge storage layer 634 and the blocking insulating layer 636 may be sequentially formed on the tunneling insulating layer 632.

The tunneling insulating layer 632 may be formed of silicon oxide, silicon nitride, silicon oxynitride, hafnium oxide, hafnium silicon oxide, aluminum oxide, zirconium oxide, or a combination thereof. According to an exemplary embodiment, the charge storage layer 634 may be a floating gate including polysilicon. According to another exemplary embodiment, the charge storage layer 634 may be a charge trap layer formed of silicon oxide, silicon nitride, silicon oxynitride, hafnium oxide, zirconium oxide, tantalum oxide, titanium oxide, hafnium aluminum oxide, hafnium tantalum oxide, hafnium silicon oxide, aluminum nitride, aluminum gallium nitride, or a combination thereof. According to another exemplary embodiment, the charge storage layer 634 may include quantum dots trapping the charge. The blocking insulating layer 636 may be formed of silicon oxynitride, silicon nitride, silicon oxynitride, a high dielectric layer, or a combination thereof. The high dielectric layer may be formed of aluminum oxide, tantalum oxide, titanium oxide, yttrium oxide, zirconium oxide, zirconium silicon oxide, hafnium oxide, hafnium silicon oxide, lanthanum oxide, lanthanum aluminum oxide, lanthanum hafnium oxide, hafnium aluminum oxide, praseodymium oxide, or a combination thereof.

Figure 14F:
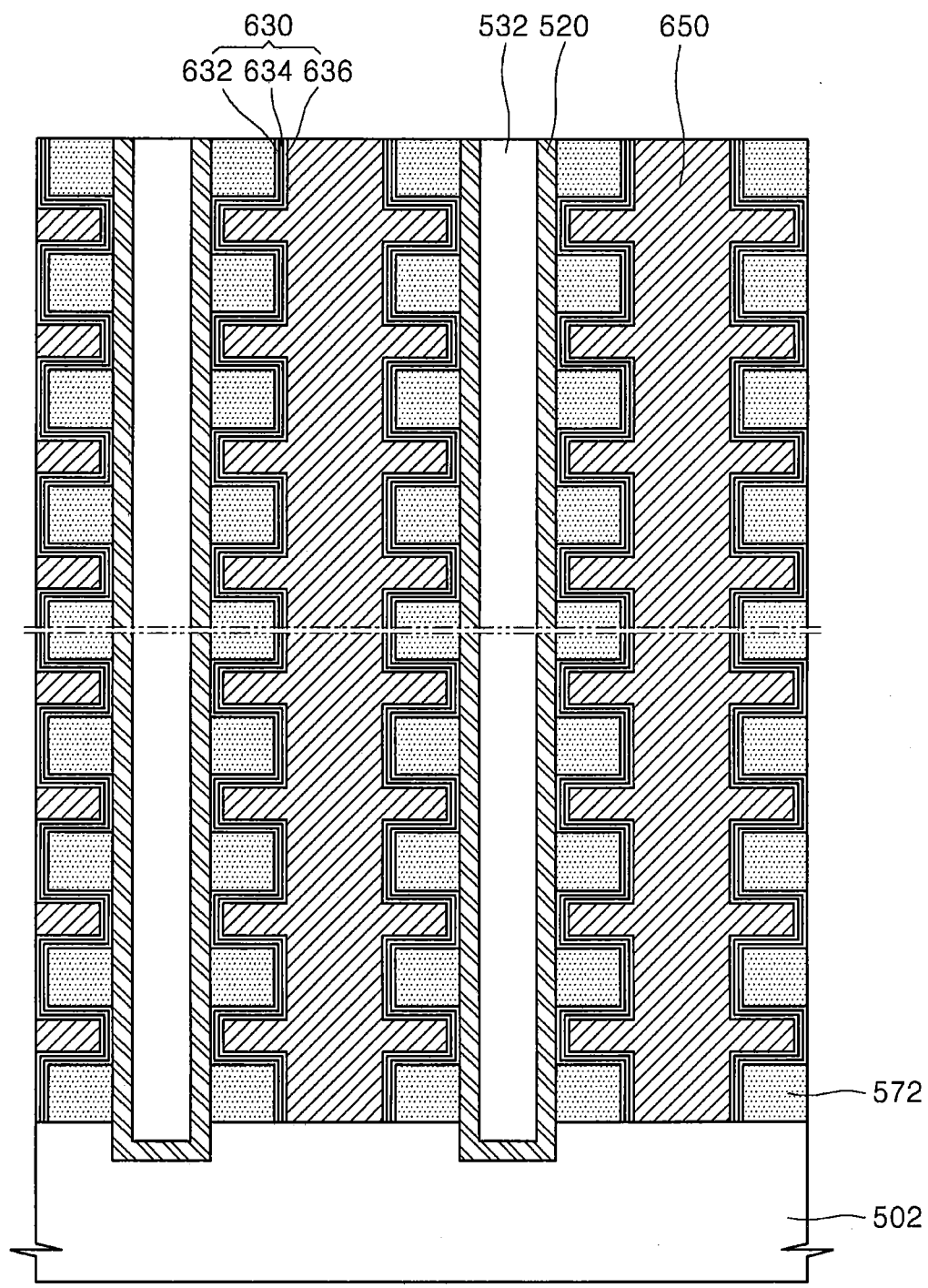

Referring to FIG. 14F, a nickel layer 650 filling the plurality of second openings T22 and the plurality of third openings T23 is formed on a plurality of storage structures 630.

To form the nickel layer 650, a vapor including a vaporized nickel alkoxide compound, and a reducing gas such as hydrogen, may be together supplied onto the substrate 502. Descriptions with respect to the nickel layer 580 with reference to FIG. 12E will be referred to for more detailed descriptions with respect to the forming of the nickel layer 650.

In the process of forming the nickel layer 650, the nickel alkoxide compound of Formula 1 is used as a material compound, and thus, the process of forming the nickel layer 650 is simplified and the nickel layer 650 having a superior gap-filling characteristic may be obtained even in the hole having a relatively large aspect ratio such as the second opening T22.

Figure 14G:
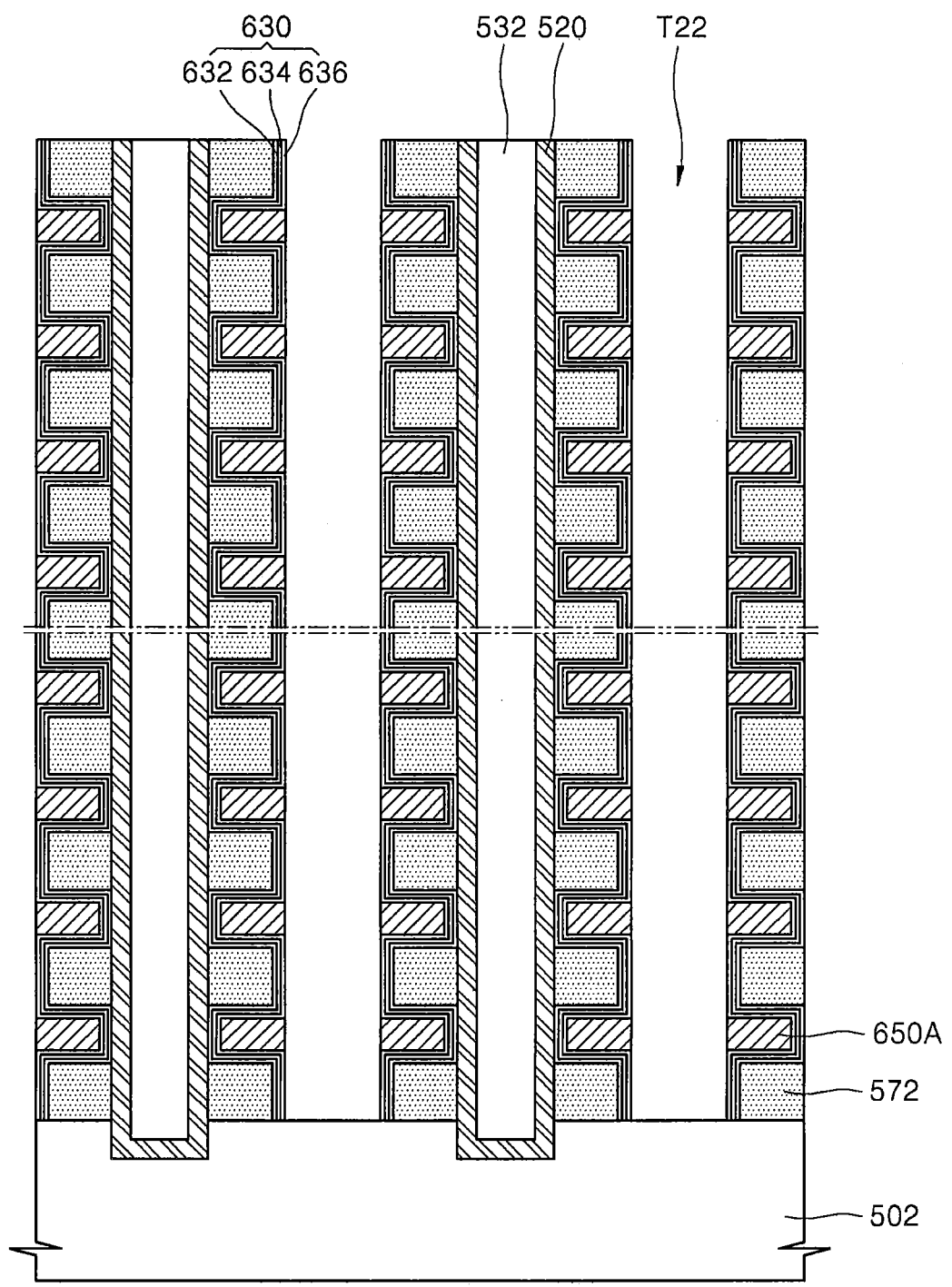

Referring to FIG. 14G, a portion of the nickel layer 650 (refer to FIG. 14F) is removed to expose portions of the plurality of storage structures 630 in the second opening T22. As a result, a plurality of nickel layer patterns 650A of the nickel layer 650, remaining in the plurality of third openings T23 (refer to FIG. 14E), may be obtained.

An anisotropic etching process may be used to remove the portion of the nickel layer 650.

Figure 14H:
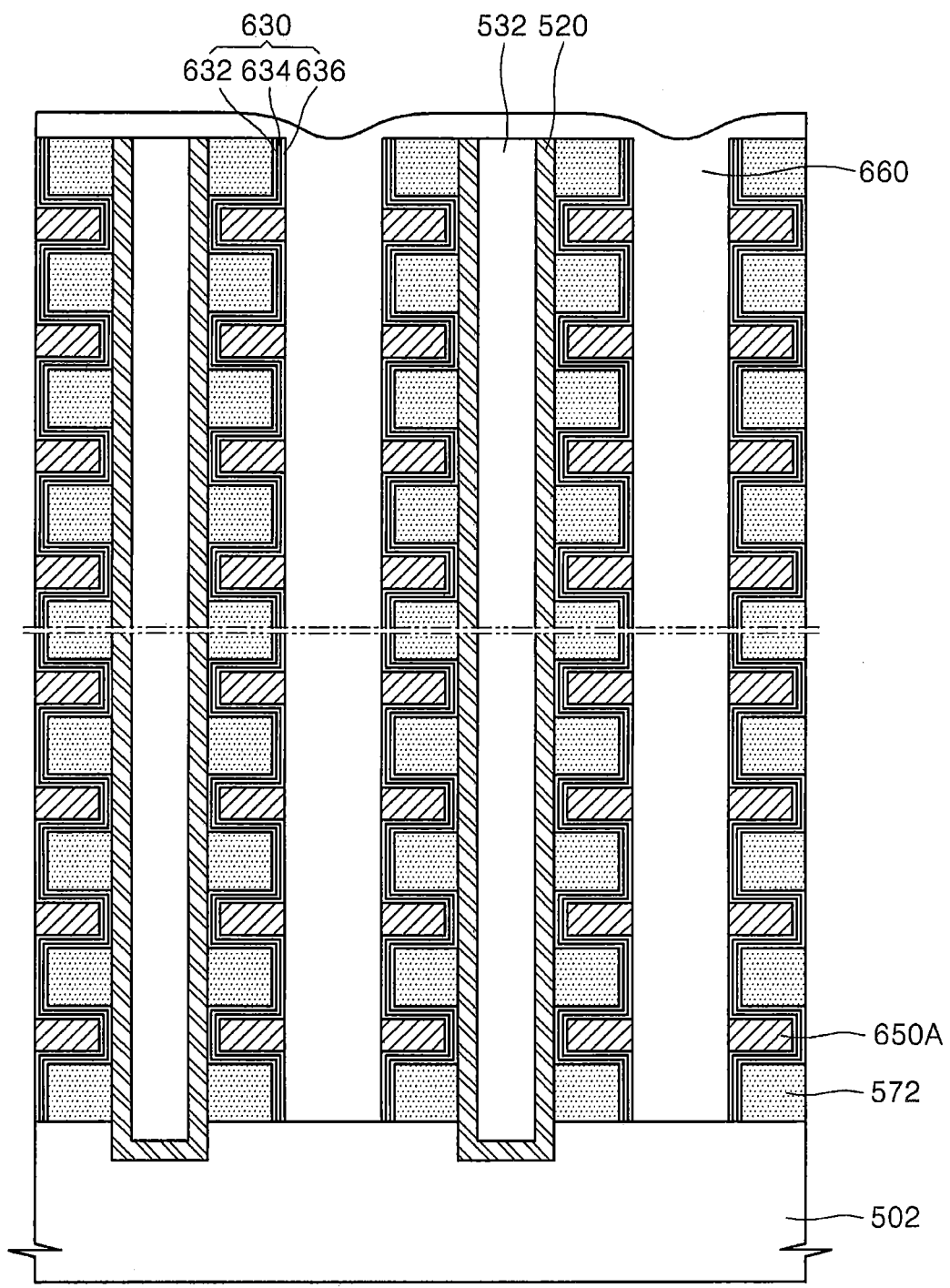

Referring to FIG. 14H, a polysilicon layer 660 covering the plurality of nickel layer patterns 650A is formed in the second opening T22 (refer to FIG. 14G).

According to an exemplary embodiment, the polysilicon layer 660 may be formed to have a sufficient thickness to fill the second opening T22. According to another exemplary embodiment, the polysilicon layer 660 may be formed as a thin layer conformally covering an inner wall of the second opening T22 by a consistent depth, and as a result, a portion of space of the second opening T22 may remain after the polysilicon layer 660 is formed.

Figure 14I:
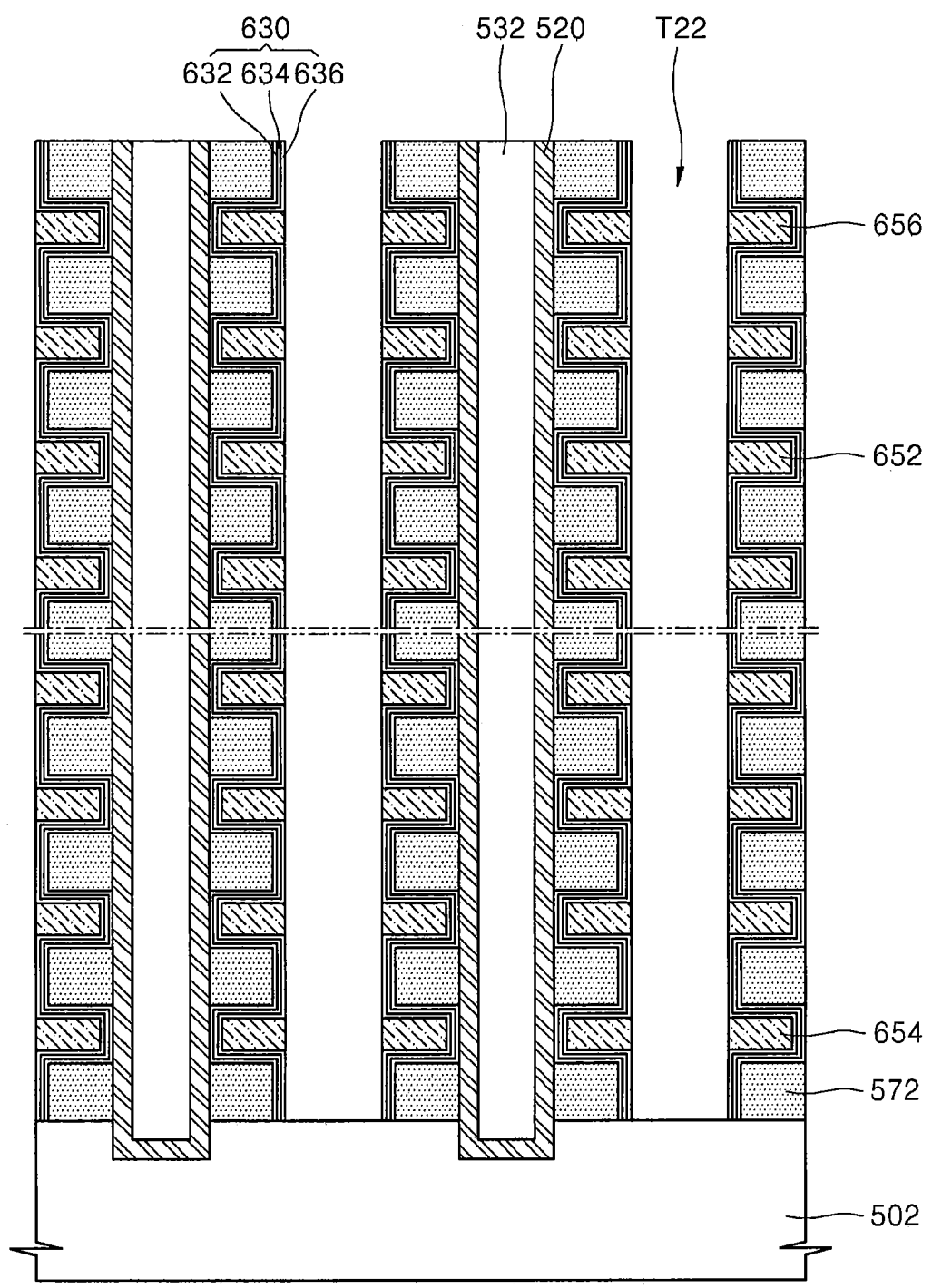

Referring to FIG. 14I, a silicidation process is performed by inducing a reaction of the plurality of nickel layer patterns 650A and the polysilicon layer 660 by annealing a product of the plurality of nickel layer patterns 650A and the polysilicon layer 650 under a reducing atmosphere. As a result, each of the plurality of nickel layer patterns 650A is converted to a nickel silicide layer, and the first through third control gate electrodes 652, 654, and 656 formed of the nickel silicide layer may be obtained.

After the first through third control gate electrodes 652, 654, and 656 formed of the nickel silicide layer are formed, a remaining and unnecessary portion of the polysilicon layer 660, which has not participated in the silicidation process, may be removed to expose the first through third control gate electrodes 652, 654, and 656 through the second opening T22.

Descriptions with respect to the silicidation process with reference to FIG. 12F may be referred to for more detail with respect to the silicidation process for forming the first through third control gate electrodes 652, 654, and 656 formed of the nickel silicide layer.

Figure 14J:
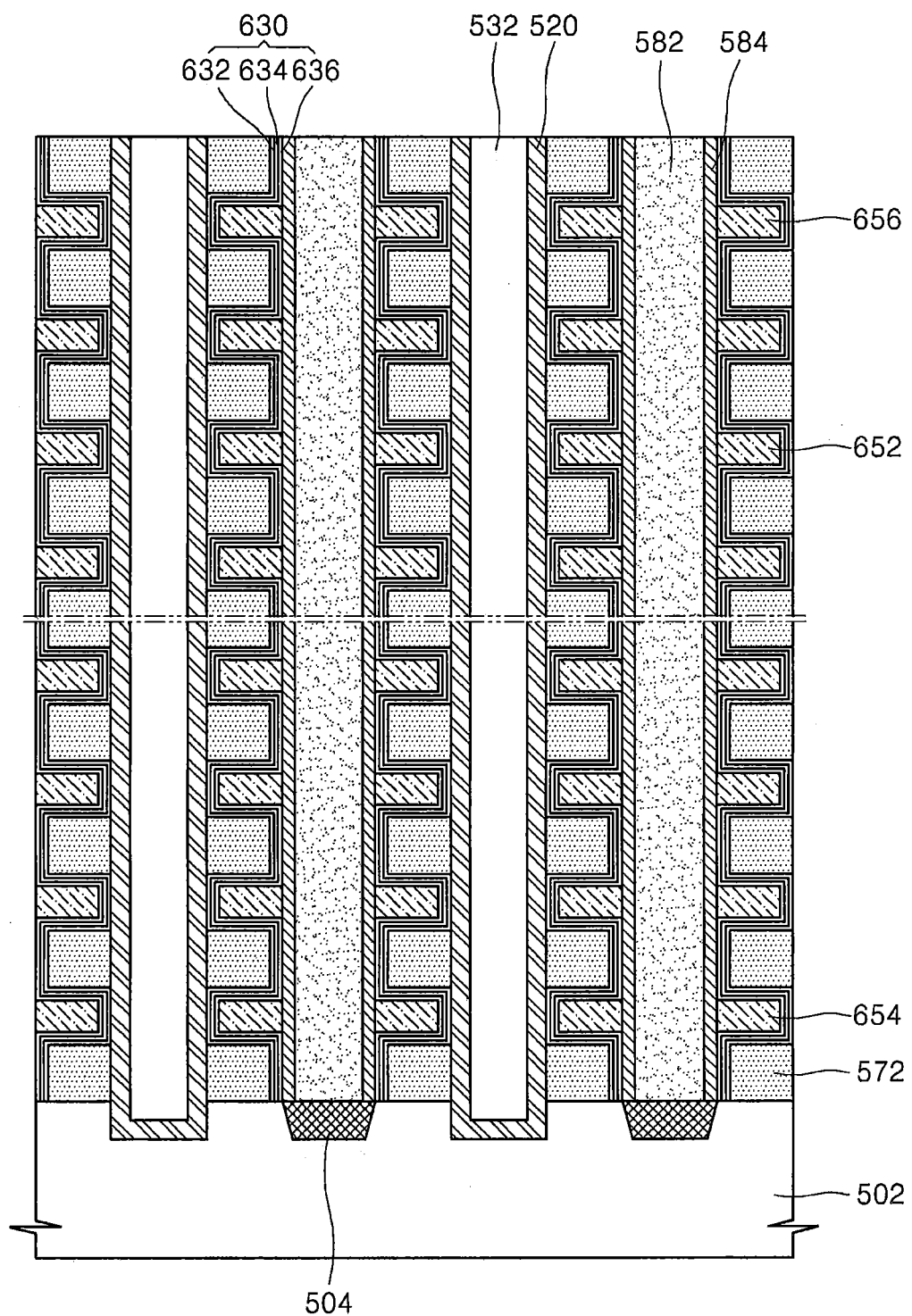

Referring to FIG. 14J, the source region 504 is formed on the substrate 502 exposed through the plurality of second openings T22 (refer to FIG. 14I), and the insulating spacer 584 covering the first through third control gate electrodes 652, 654, and 656 exposed in the second opening T22 and the storage structure 630 is formed.

Then, the common source line 582 is formed in the plurality of second openings T22 to form the non-volatile memory device 600 illustrated in FIG. 13.

Figure 15:
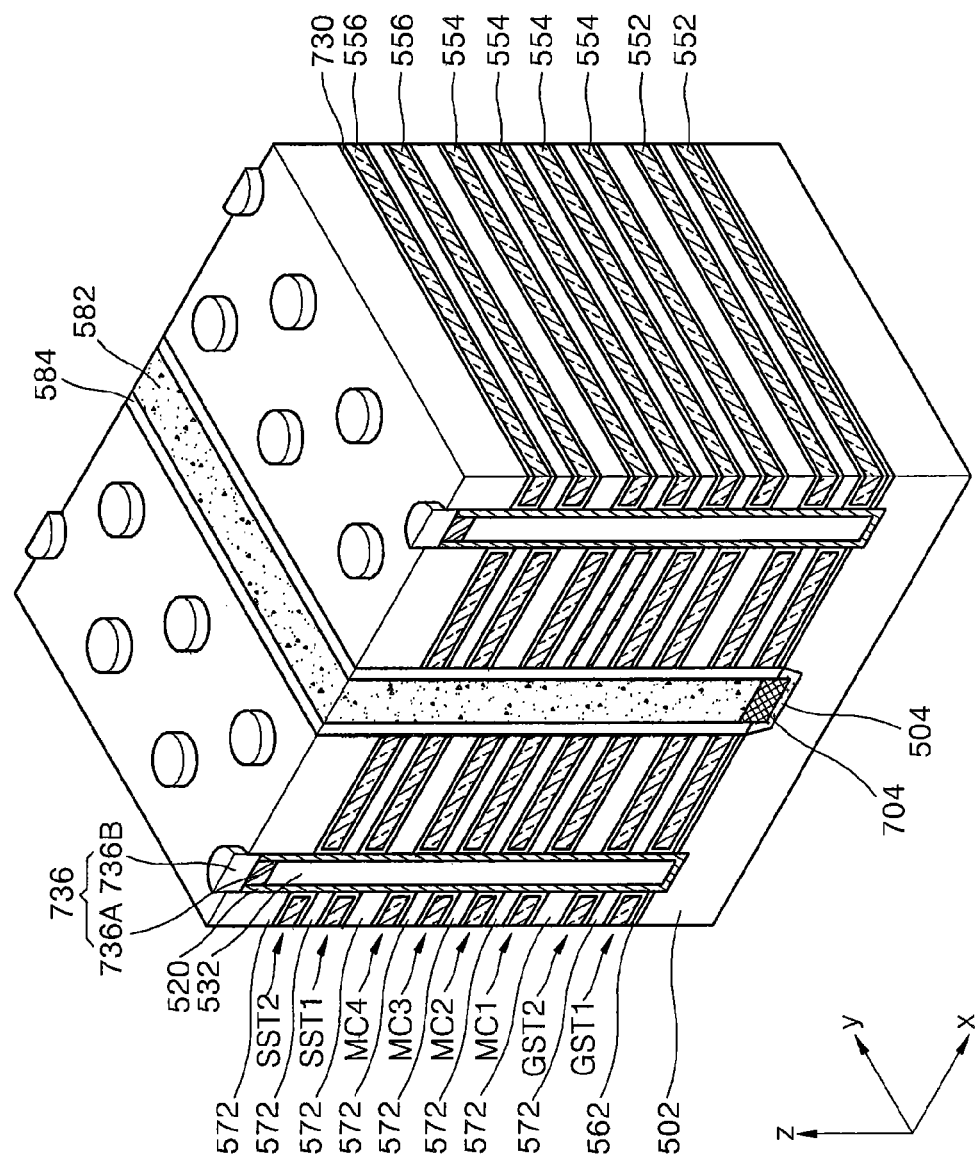
FIG. 15 is a perspective view of a partial structure of a memory cell array of a vertical non-volatile memory device which may be manufactured according to a method of manufacturing a semiconductor device according to an exemplary embodiment of the inventive concept.

FIG. 15 is a perspective view of a partial structure of an exemplary non-volatile memory device 700, which may form the memory cell array 410 of the vertical non-volatile memory device 400 illustrated in FIG. 10. In FIG. 15, like reference numerals in FIGS. 10 through 14J denote like elements, and thus, their detailed descriptions will be omitted.

Referring to FIG. 15, the non-volatile memory device 700 includes the channel layer 520 formed on the substrate 502 and the plurality of memory cell strings CS11, CS12, CS21, and CS22 (refer to FIG. 10) arranged along the side wall of the channel layer 520.

Each of the plurality of memory cell strings CS11, CS12, CS21, and CS22 may include two ground selection transistors GST1 and GST2, the plurality of memory cells MC1, MC2, MC3, and MC4, and two string selection transistors SST1 and SST2. The number of the ground selection transistors and the string selection transistors is not limited to that illustrated in FIG. 15.

The buried insulating layer 532 is formed in the channel layer 520.

A conductive layer 736 connected to the channel layer 520 is formed on the channel layer 520 and the buried insulating layer 532. The conductive layer 736 may include a first conductive layer 736A and a second conductive layer 736B. The first conductive layer 736A may be formed of polysilicon. According to necessity, the first conductive layer 736A may be doped or may not be doped. The second conductive layer 736B is formed on the first conductive layer 736A and includes nickel silicide.

A portion of the conductive layer 736 is formed of nickel silicide so that resistivity of the conductive layer 736 itself may decrease, and contact resistivity between the bit lines (BL1 and BL2 of FIG. 10) electrically connected with the conductive layer 736 in an upper portion of the conductive layer 736 may also decrease.

According to an exemplary embodiment, the conductive layer 736 may function as a drain region of the string selection transistor SST2.

A low resistivity layer 704 and the common source line 582 formed of the nickel silicide layer are formed on the source region 504. The low resistivity layer 704 extends in direction Y between the source region 504 and the common source line 582. The low resistivity layer 704 may function as a source line along with the common source line 582.

The common source line 582 may provide a source region to the ground selection transistors GST1 and GST2 of the memory cell strings on side surfaces of two channel layers 520 adjacent to each other in direction X.

The second conductive layer 736B on the first conductive layer 736A and the low resistivity layer 704 on the source region 504 may be formed at the same time, or may be formed in separate processes.

FIG. 15 illustrates that adjacent channel layers 520 of the plurality of channel layers 520 are symmetrically arranged with the common source line 582 as the center. However, the present inventive concept is not limited thereto, and various arrangements of the plurality of channel layers 520 are possible.

The plurality of ground selection lines 552, the plurality of gate lines 554, and the plurality of string selection lines 556 may be arranged to be spaced apart from the substrate 502 in direction Z along a side surface of the channel layer 520. Each of the plurality of ground selection lines 552, the plurality of gate lines 554, and the plurality of string selection lines 556 may form gate electrodes of the ground selection transistors GST1 and GST2, the plurality of memory cells MC1, MC2, MC3, and MC4, and the string selection transistors SST1 and SST2.

Each of the plurality of ground selection lines 552, the plurality of gate lines 554, and the plurality of string selection lines 556 may be formed of a metal, for example, tungsten (W). According to an exemplary embodiment, the plurality of ground selection lines 552, the plurality of gate lines 554, and the plurality of string selection lines 556 may further include a diffusion prevention layer. The diffusion prevention layer may be formed of tungsten nitride (WN), tantalum nitride (TaN), titanium nitride (TiN), or a combination thereof.

A gate insulating layer 730 is interposed between the plurality of ground selection lines 552 and the plurality of gate lines 554, and between the plurality of string selection lines 556 and the channel layer 520. According to an exemplary embodiment, the gate insulating layer 730 may have the same structure as the storage structure 630 described in reference to FIG. 13, however, it is not limited thereto.

FIGS. 16A through 16J are cross-sectional views for describing an order of processes for manufacturing a semiconductor device according to an exemplary embodiment of the inventive concept. An exemplary process for forming the low resistivity layer 704 and the second conductive layer 736B of the non-volatile memory device 700 illustrated in FIG. 15 by using the nickel-containing layer will be described in reference to FIGS. 16A through 16J. In FIGS. 16A through 16J, like reference numerals in FIGS. 10 through 15 denote like elements, and thus, their detailed descriptions will be omitted.

Figure 16A:
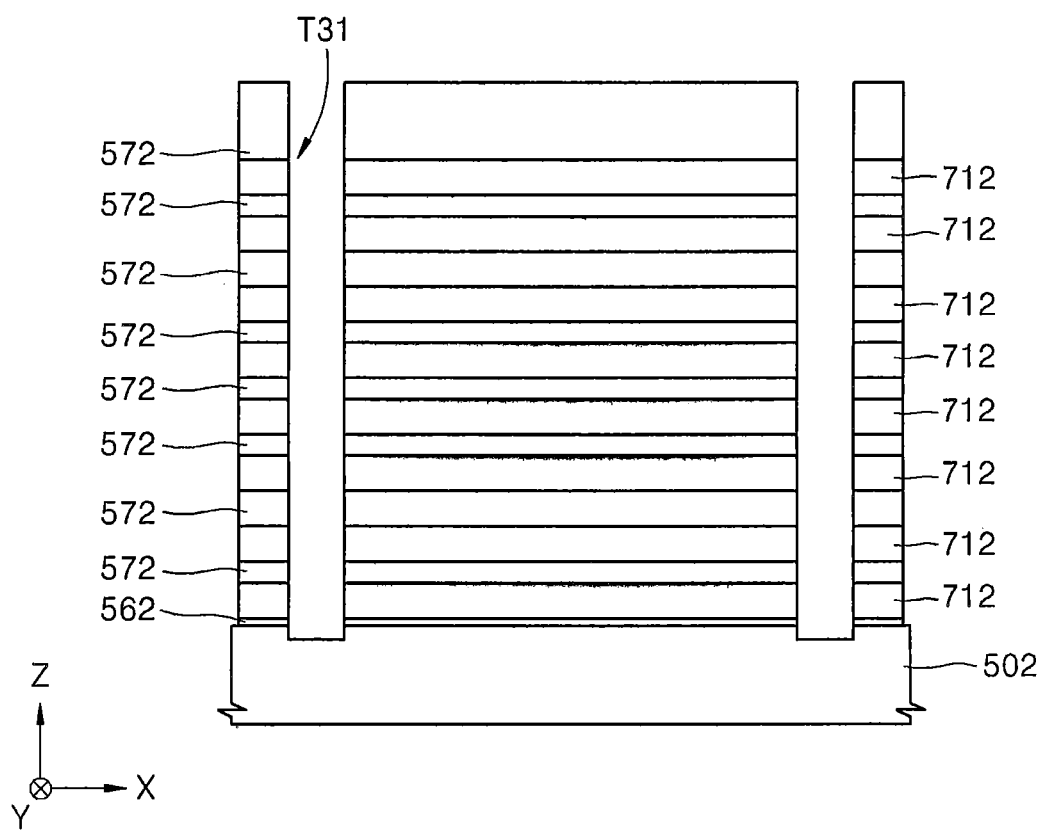
FIGS. 16A through 16J are cross-sectional views for describing an order of processes for manufacturing a semiconductor device according to an exemplary embodiment of the inventive concept.

Referring to FIG. 16A, the etching-stop insulating layer 562 is formed on the substrate 502, and above that, one of the plurality of insulating layers 572 and one of the plurality of sacrificial layers 712 are alternately formed. Then, a plurality of first openings T31 penetrating the plurality of insulating layers 572, the plurality of sacrificial layers 712, and the etching-stop insulating layer 562 to expose the substrate 502 are formed.

The plurality of sacrificial layers 712 are formed of materials that may provide an etching selectivity between the plurality of sacrificial layers 712 and the plurality of insulating layers 572. For example, the plurality of sacrificial layers 712 may be formed of any one material selected from a silicon layer, a silicon oxide layer, a silicon carbide layer, and a silicon nitride layer, and the plurality of insulating layers 572 may be formed of another material, which is different from the any one material for forming the plurality of sacrificial layers 712 among the above exemplified materials.

Each of the plurality of first openings T31 may have a hole shape extending in direction Z. During an etching process to form the plurality of first openings T31, a portion of the exposed surface of the substrate 502 may be etched by excessive etching.

Figure 16B:
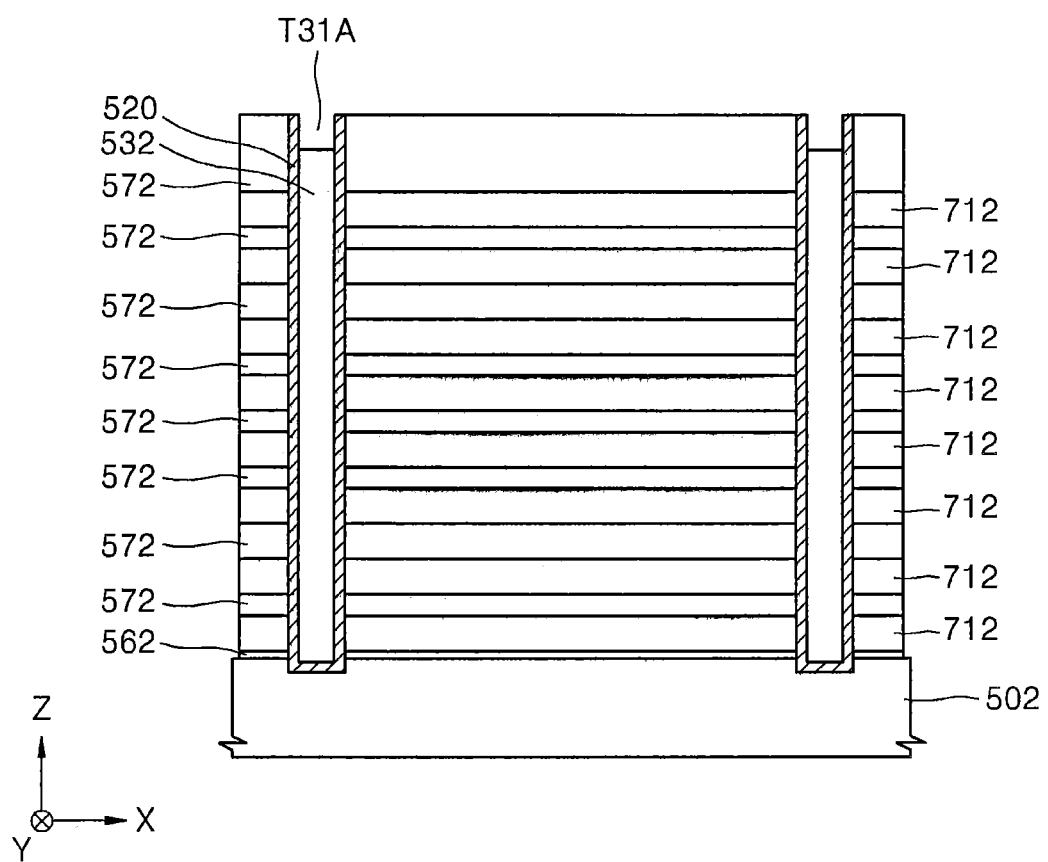

Referring to FIG. 16B, the channel layer 520 and the buried insulating layer 532 are formed in each of the plurality of first openings T31.

When forming the buried insulating layers 532, an upper surface T31A near an entrance of the first opening T31 may remain above the buried insulating layer 532 in each of the plurality of first openings T31.

Figure 16C:
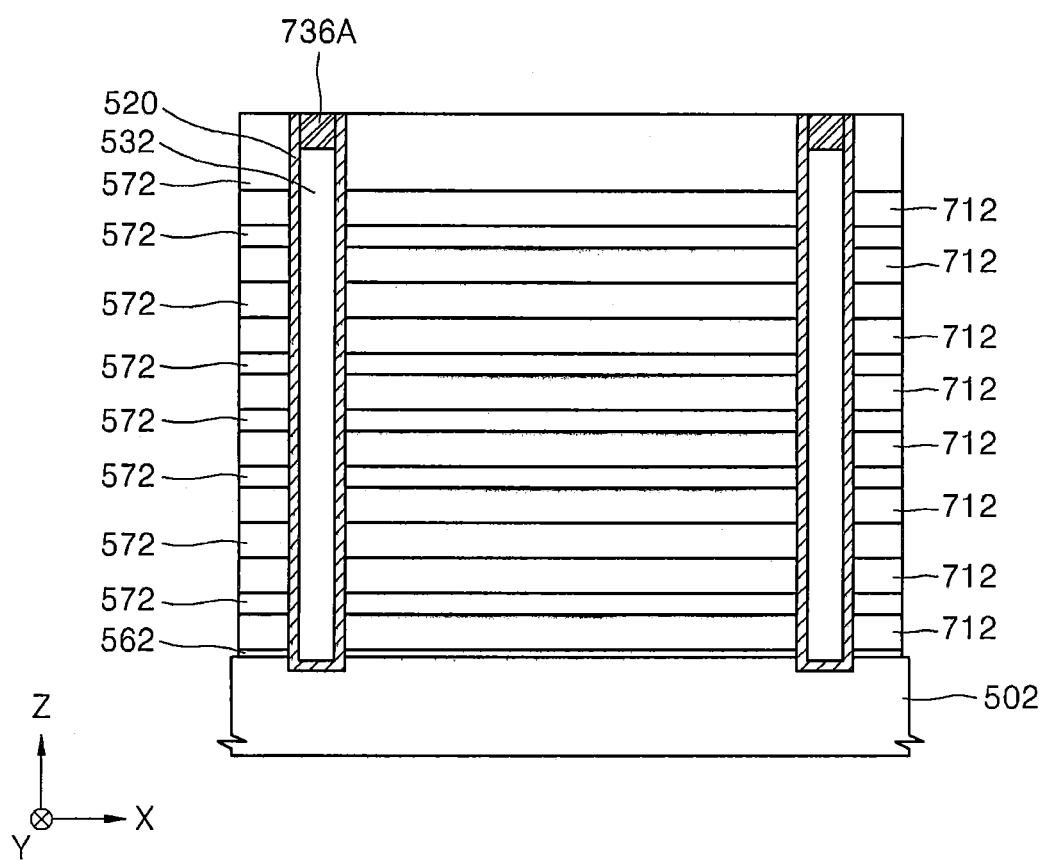

Referring to FIG. 16C, the first conductive layer 736A filling the upper space T31A of each of the plurality of first openings T31 is formed.

According to an exemplary embodiment, in order to form the first conductive layer 736A, a polysilicon layer having a sufficient thickness to fill the upper space T31A of the plurality of first openings T31 is formed on a resultant product of the buried insulating layer 532 formed, and then, a planarization process of the polysilicon layer may be performed such that the polysilicon layer may remain only in the upper space T31A.

According to an exemplary embodiment, the polysilicon layer forming the first conductive layer 736A may be a layer doped with impurities or a layer that is not doped with impurities.

Figure 16D:
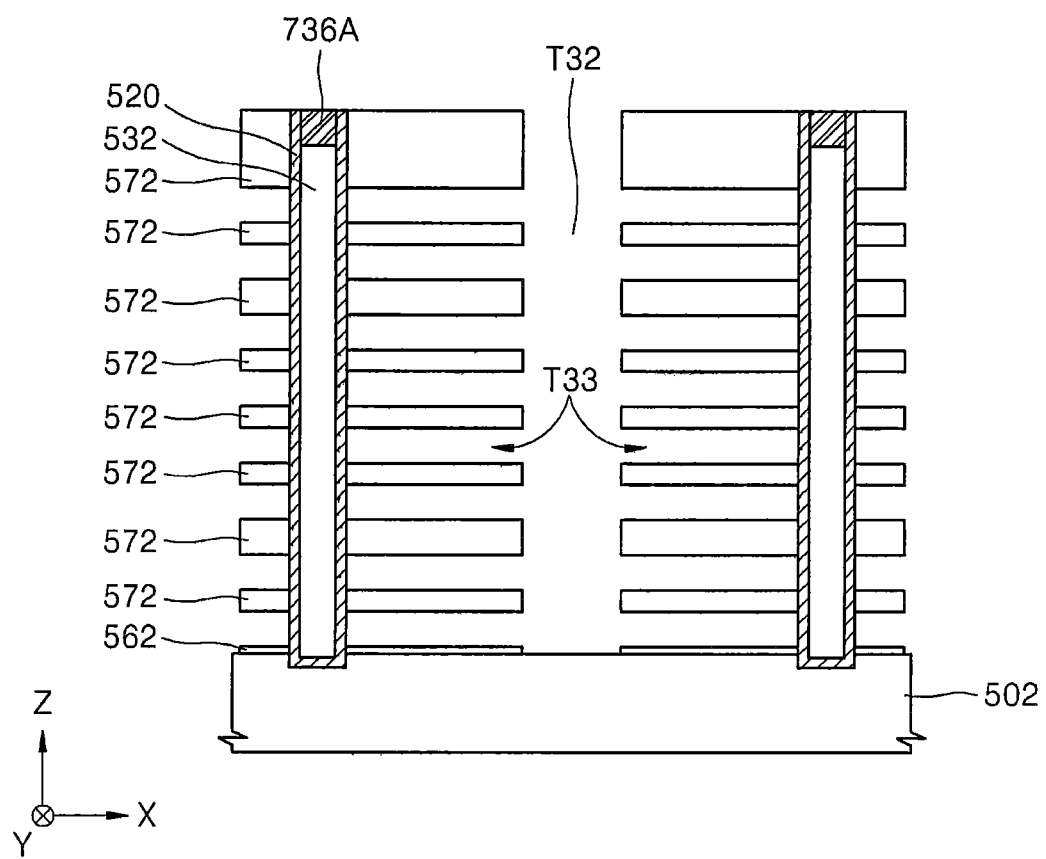

Referring to FIG. 16D, a second opening T32 penetrating the plurality of insulating layers 572, the plurality of sacrificial layers 712, and the etching-stop insulating layer 562 to expose the substrate 502, is formed on the substrate 502 in a region between two channel layers 520 neighbouring each other in direction X.

Then, the plurality of sacrificial layers 712 exposed through the second opening T32 are removed to form a plurality of third openings T33 connected with the second opening T32.

The side wall of the channel layer 520 may be exposed through the plurality of third openings T33.

Figure 16E:
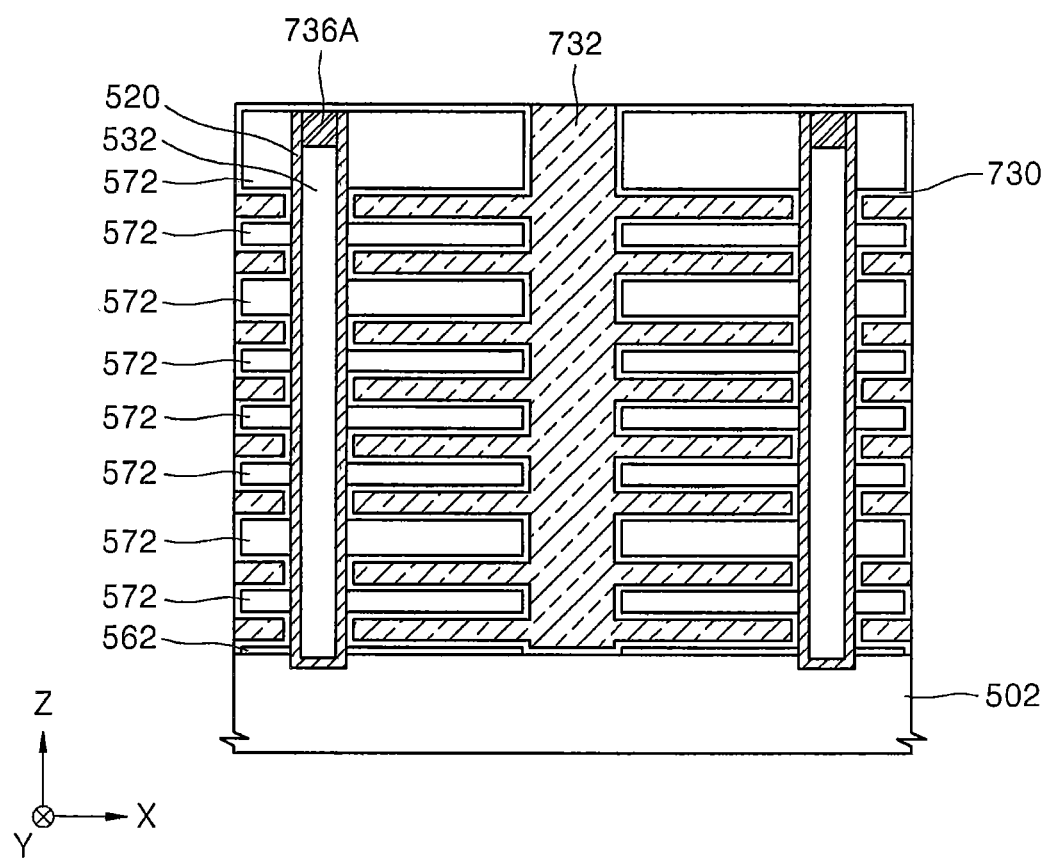

Referring to FIG. 16E, the gate insulating layer 730 is formed at inner walls of the second opening T32 and the plurality of third openings T33, and a conductive layer 732 filling the other spaces of the second opening T32 and the plurality of third openings T33 is formed.

According to an exemplary embodiment, the gate insulating layer 730 may be formed to cover the second opening T32 and a surface of each of the plurality of third openings T33, the channel layer 520, the insulating layer 572, and the substrate 502 to the same depth.

Figure 16F:
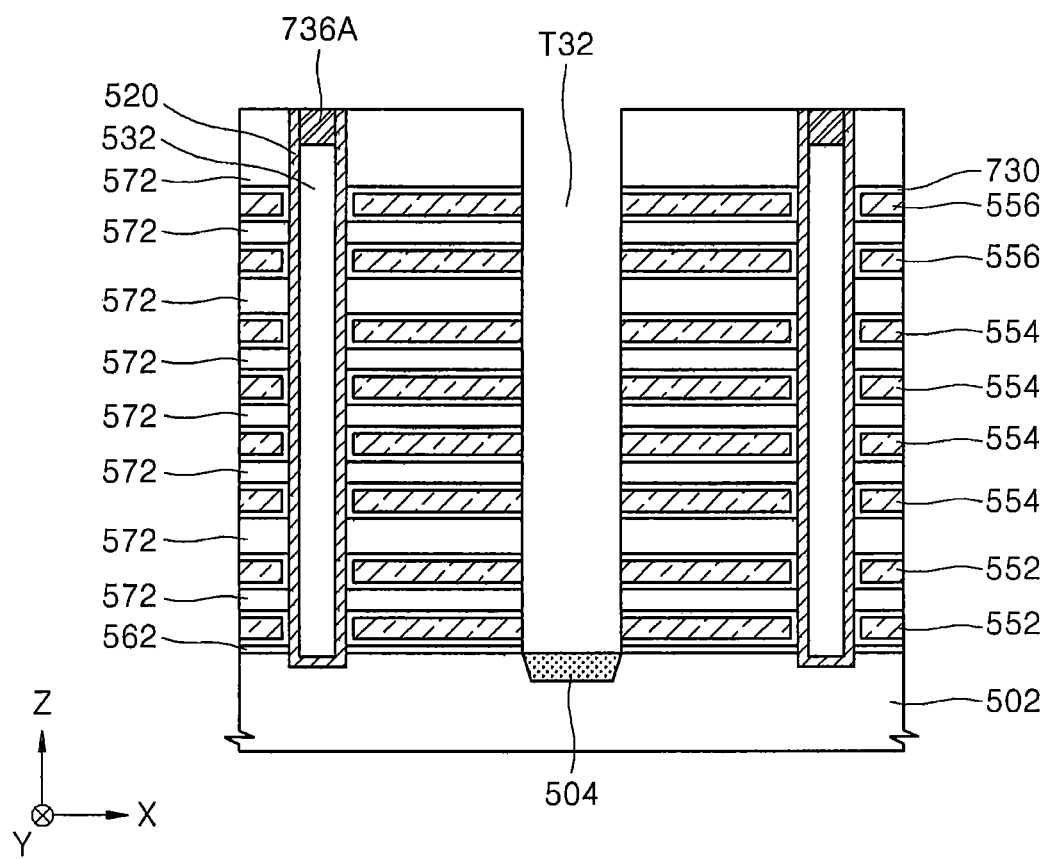

Referring to FIG. 16F, a portion of the conductive layer 732 (refer to FIG. 16E) is removed such that the conductive layer 732 remains only in the plurality of third openings T33. By this, the plurality of ground selection lines 552, the plurality of gate lines 554, and the plurality of string selection lines 556 are formed of portions of the conductive layer 732, remaining in the plurality of third openings T33, and the inside space of the second opening T32 is again exposed.

An anisotropic dry etching process may be used to remove the portion of the conductive layer 732. While the etching process to remove the portion of the conductive layer 732 is performed, the gate insulating layer 730 exposed at the side wall of the second opening T32 may also be removed.

Then, the source region 504 is formed by injecting impurities into the substrate 502 exposed through the second opening T32.

Figure 16G:
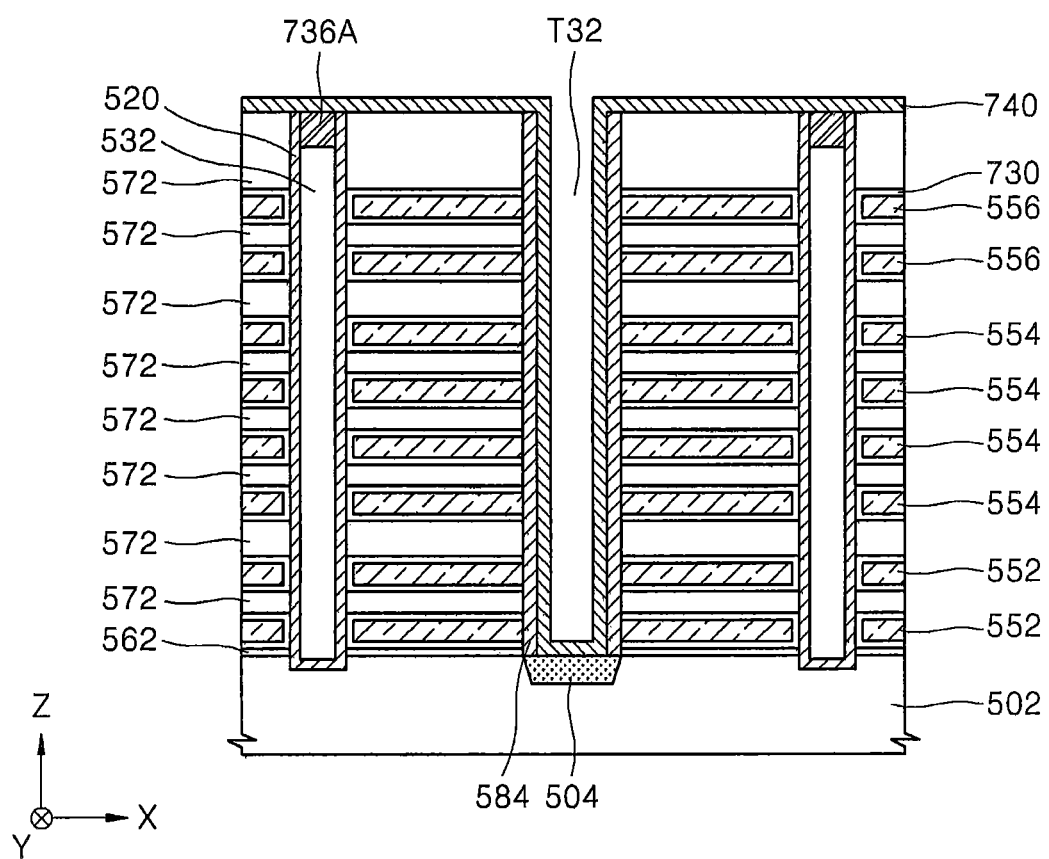

Referring to FIG. 16G, the insulating spacer 584 is formed in the second opening T32 and a nickel layer 740 covering an exposed surface of the source region 504 and an exposed surface of the first conductive layer 736A is formed.

To form the nickel layer 740, a vapor including a vaporized nickel alkoxide compound and a reducing gas such as hydrogen may be supplied onto the substrate 502 at the same time. The description with respect to the nickel layer 580 with reference to FIG. 12E will be referred to for more detailed descriptions with respect to the forming of the nickel layer 740.

The process of forming the nickel layer 740 is simplified and the nickel layer 740 having a superior gap-filling and step coverage characteristic may be obtained even in a hole having a relatively large aspect ratio, such as the second opening T32, since the nickel alkoxide compound of Formula 1 is used as a material compound when forming the nickel layer 740.

Figure 16H:
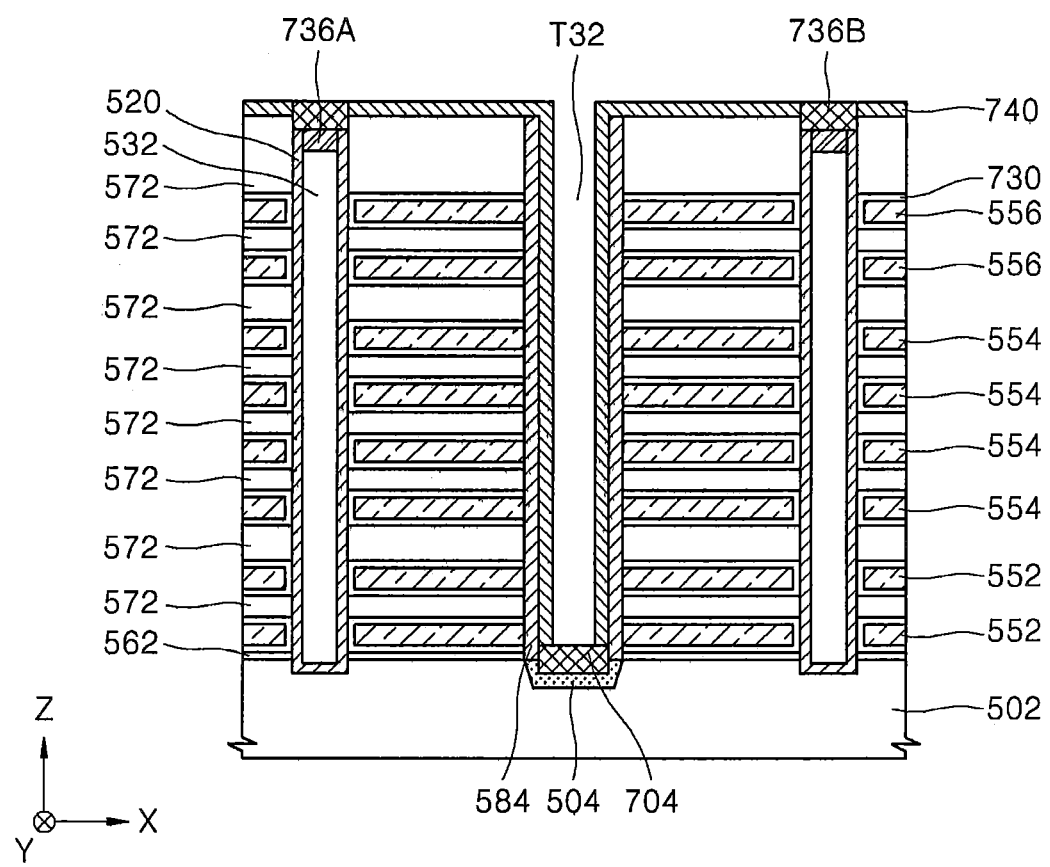

Referring to FIG. 16H, a silicidation process is performed by inducing a reaction of the nickel layer 740 and silicon forming the source region 504, and a reaction of the nickel layer 740 and the first conductive layer 736A, by annealing a product of the nickel layer 740 formed under a reducing atmosphere.

As a result, the low resistivity layer 704 formed of a nickel silicide layer is formed on the source region 504. Also, the second conductive layer 736B formed of the nickel silicide layer is formed on the first conductive layer 736A.

The description with respect to the silicidation process with reference to FIG. 12F may be referred to for more detail with respect to the silicidation process for forming the low resistivity layer 704 and the second conductive layer 736B formed of the nickel silicide layer.

Figure 16I:
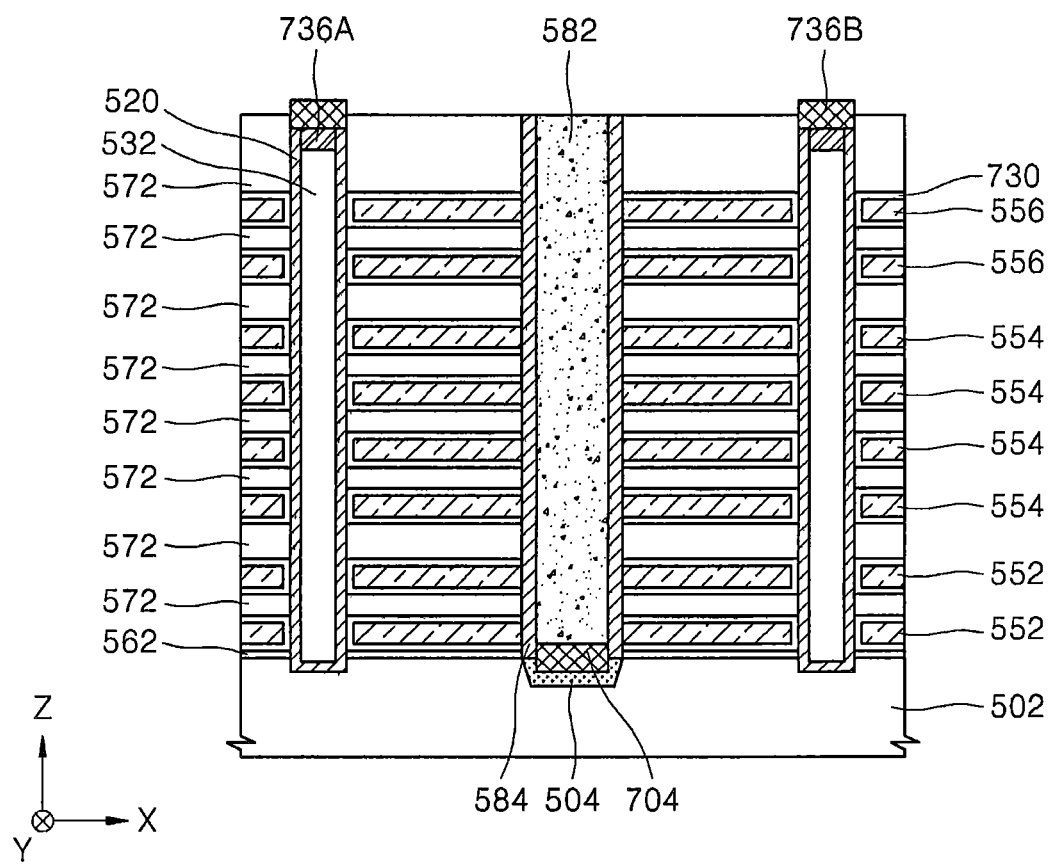

Referring to FIG. 16I, a remaining and unnecessary portion of the nickel layer 740 (refer to FIG. 16H), which has not participated in the silicidation process, is removed and the common source line 582 filling the second opening T32 (refer to FIG. 16H) above the low resistivity layer 704 is formed.

Figure 16J:
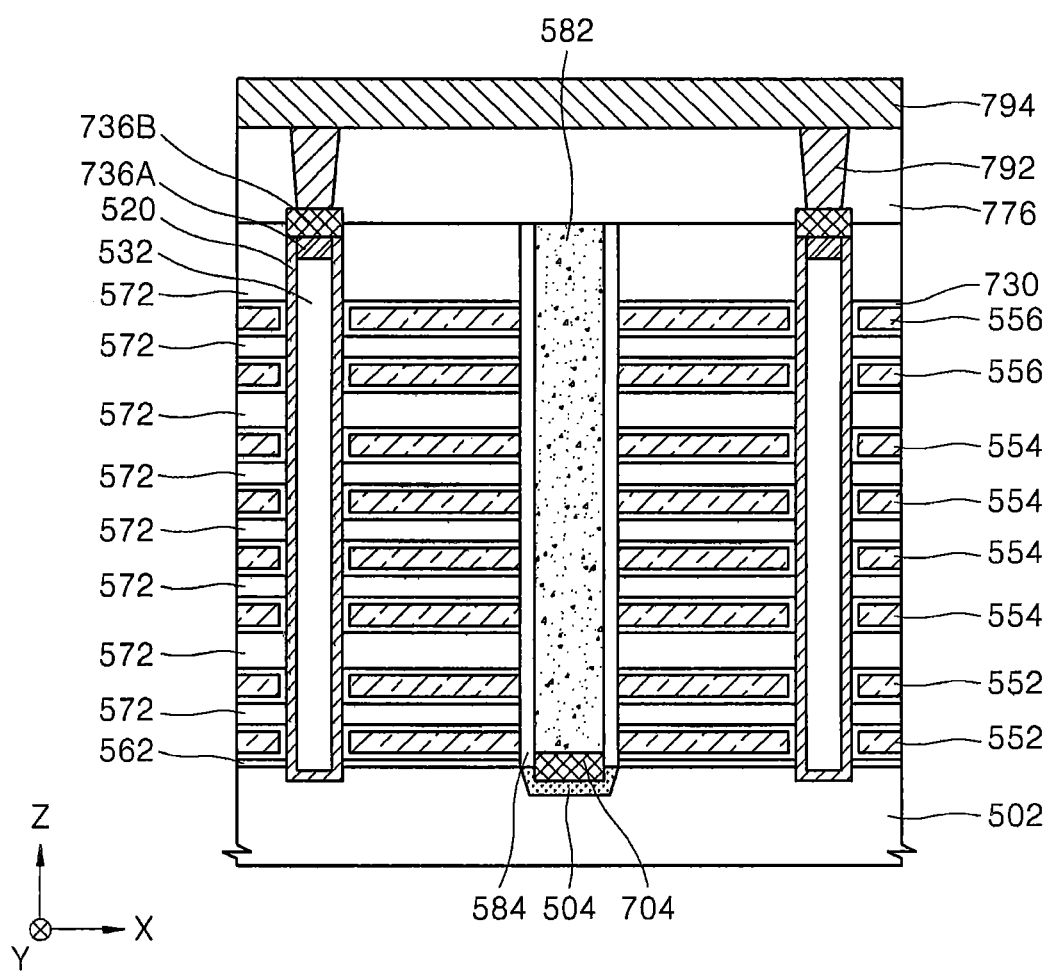

Referring to FIG. 16J, an upper insulating layer 776 is formed on a product of the common source line 582 formed, a plurality of bit line contacts 792 penetrating the upper insulating layer 776 to be connected to the second conductive layer 736B are formed, and a bit line 794 connecting bit line contacts 792 arranged in series in direction X among the plurality of bit line contacts 792 is formed on the upper insulating layer 776. The bit line 794 may be formed as a line shape extending in direction X.

Hereinafter, exemplary embodiments of the inventive concept and evaluation embodiments will be described in detail. However, the present inventive concept is not limited to these exemplary embodiments and evaluation embodiments.

Evaluation Embodiment 1

Evaluation of a Deposition Characteristic of the Nickel Alkoxide Compound

A nickel-containing layer was formed by using a nickel alkoxide compound of Formula 2 and the obtained nickel-containing layer was evaluated.

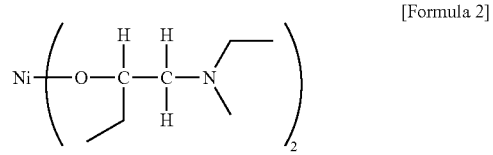

[Formula 2]

In the forming of the nickel-containing layer, an Ar gas was used as a carrier gas, and $H_2$ and $NH_3$ were used as a reactive gas.

A bubbling method was used to transport reactive gases necessary to form the nickel-containing layer, and a temperature of deposition was gradually increased from about 160° C. to form the nickel-containing layer.

Figure 17:
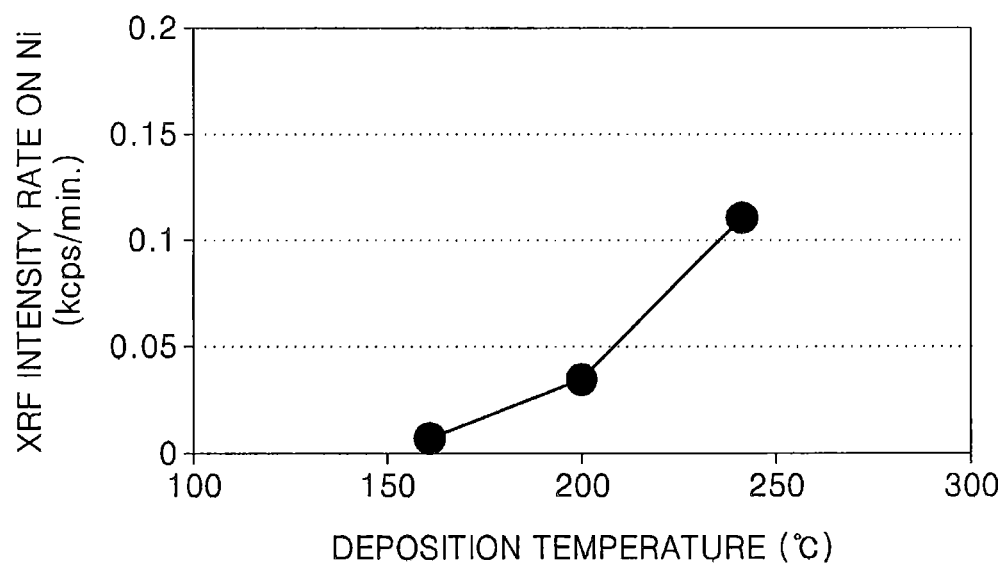
FIG. 17 is a graph illustrating a result of evaluating a deposition speed of a Ni-containing layer by analyzing by x-ray fluorescence (XRF) the Ni-containing layer obtained according to a deposition temperature, in a process of forming the Ni-containing layer according to a method of manufacturing a semiconductor device according to an exemplary embodiment of the inventive concept.

FIG. 17 is a graph illustrating a result of evaluating a deposition speed of a Ni-containing layer by analyzing by x-ray fluorescence (XRF) the Ni-containing layer obtained according to a deposition temperature, in a process of forming the Ni-containing layer according to the method of evaluation embodiment 1.

From the result of FIG. 17, it was shown that the nickel-containing layer formed in evaluation embodiment 1 had a deposition characteristic as shown in a general CVD process, since a deposition speed of the nickel-containing layer formed in evaluation embodiment 1 increased as the deposition temperature thereof increased. Thus, it is shown that the nickel alkoxide compound of Formula 2 is suitable to be used as a material compound of the CVD process.

Evaluation Embodiment 2

Formation of the Nickel Silicide Layer by Using the Nickel Alkoxide Compound

A nickel thin layer was formed on a silicon substrate by using the nickel alkoxide compound of Formula 2. A deposition temperature of a deposition process to form the nickel thin layer was maintained at about 160° C. The resistivity of the nickel thin layer obtained in such a manner was about 86.4 µΩcm.

A nickel silicide thin layer was formed by inducing a reaction of the nickel thin layer and the silicon substrate below it by annealing the nickel thin layer under a hydrogen atmosphere at about 420° C. for about 1 hour. It was shown by X-ray diffraction (XRD) that the nickel silicide thin layer had an NiSi phase. The resistivity of the nickel silicide layer having the NiSi phase was about 25.9 µΩcm, and thus, it was shown that the resistivity of the nickel silicide layer was lower than that of the nickel thin layer.

The nickel-containing layer manufactured according to the method of manufacturing the semiconductor device according to the present exemplary embodiments may have various usages. For example, the nickel-containing layer may be used for a gate electrode of a transistor, an electrode of a capacitor, a conductive barrier layer used as wiring, a resistivity layer, a magnetic layer, a liquid crystal barrier metal layer, a thin layer solar cell member, a member for a semiconductor device, a nano structure, a hydrogen storage alloy, and a micro electro mechanical systems (MEMS) actuator. However, it is not limited thereto.

Figure 18:
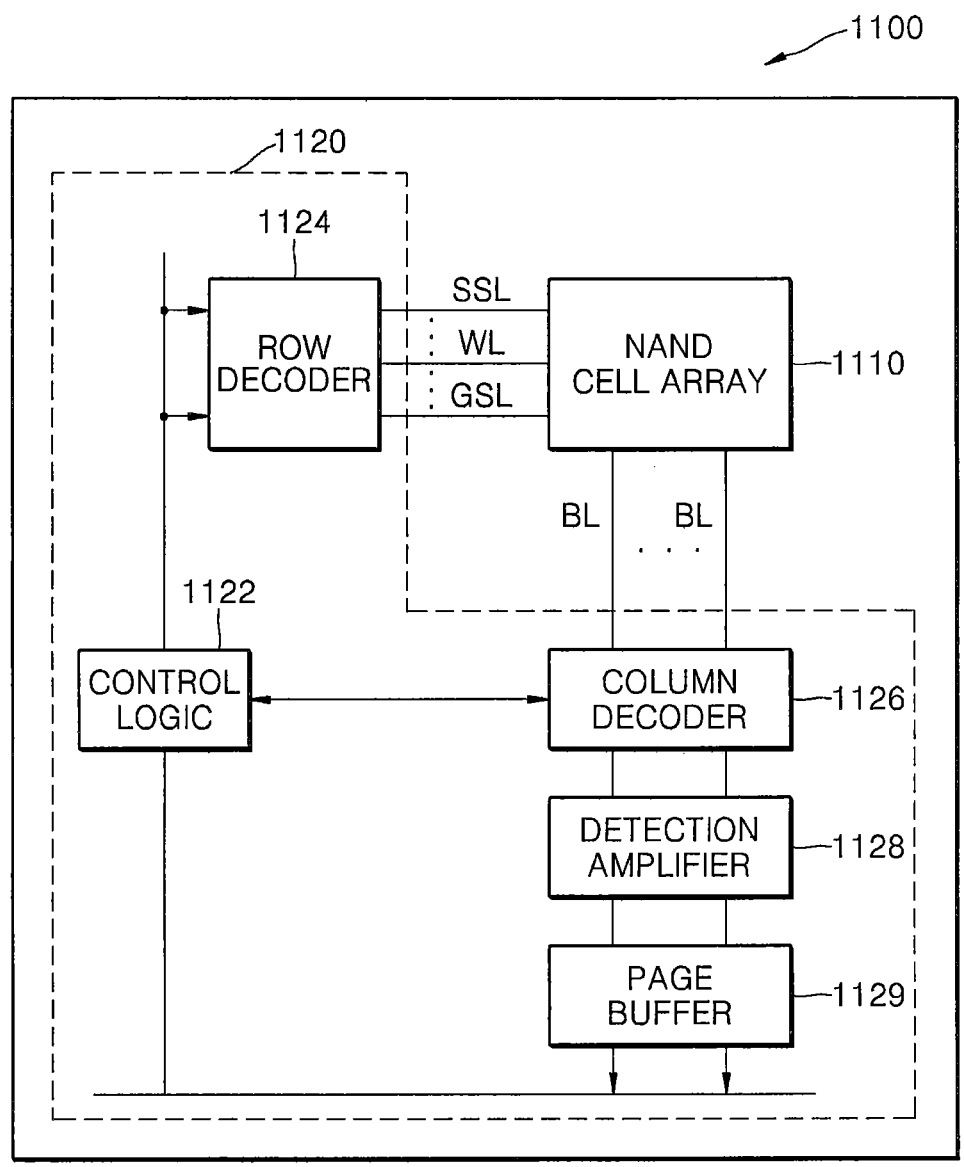
FIG. 18 is a schematic block diagram of a non-volatile memory device according to an exemplary embodiment of the inventive concept.

FIG. 18 is a schematic block diagram of a non-volatile memory device 1100 according to an exemplary embodiment of the inventive concept.

Referring to FIG. 18, in the non-volatile memory device 1100, a NAND cell array 1110 may be combined with a core circuit unit 1120. For example, the NAND cell array 1110 may include at least one of the non-volatile memory devices 400, 500, 600, and 700 described in reference to FIGS. 10 through 16J. The core circuit unit 1120 may include a control logic 1122, a row decoder 1224, a column decoder 1126, a detection amplifier 1128, and a page buffer 1129.

The control logic 1122 may communicate with the row decoder 1224, the column decoder 1126, and the page buffer 1129. The row decoder 1224 may communicate with the NAND cell array 1110 via a plurality of string selection lines SSL, a plurality of word lines WL, and a plurality of ground selection lines GSL. The column decoder 1126 may communicate with the NAND cell array 1110 via a plurality of bit lines BL. The detection amplifier 1128 may be connected with the column decoder 1126 when a signal is output from the NAND cell array 1110 and may not be connected with the column decoder 1126 when the signal is transferred to the NAND cell array 1110.

For example, the control logic 1122 may transfer a row address signal to the row decoder 1224, and the row decoder 1224 may decode the row address signal to transfer to the NAND cell array 1110 via the string selection lines SSL, the word lines WL, and the ground selection lines GSL. The control logic 1122 may transfer a column address signal to the column decoder 1126 or the page buffer 1129, and the column decoder 1126 may decode the column address signal to transfer to the NAND cell array 1110 via the plurality of bit lines BL. The signal of the NAND cell array 1110 may be transferred to the detection amplifier 1128 via the column decoder 1126, then amplified in the detection amplifier 1128, and transferred to the control logic 1122 through the page buffer 1129.

Figure 19:
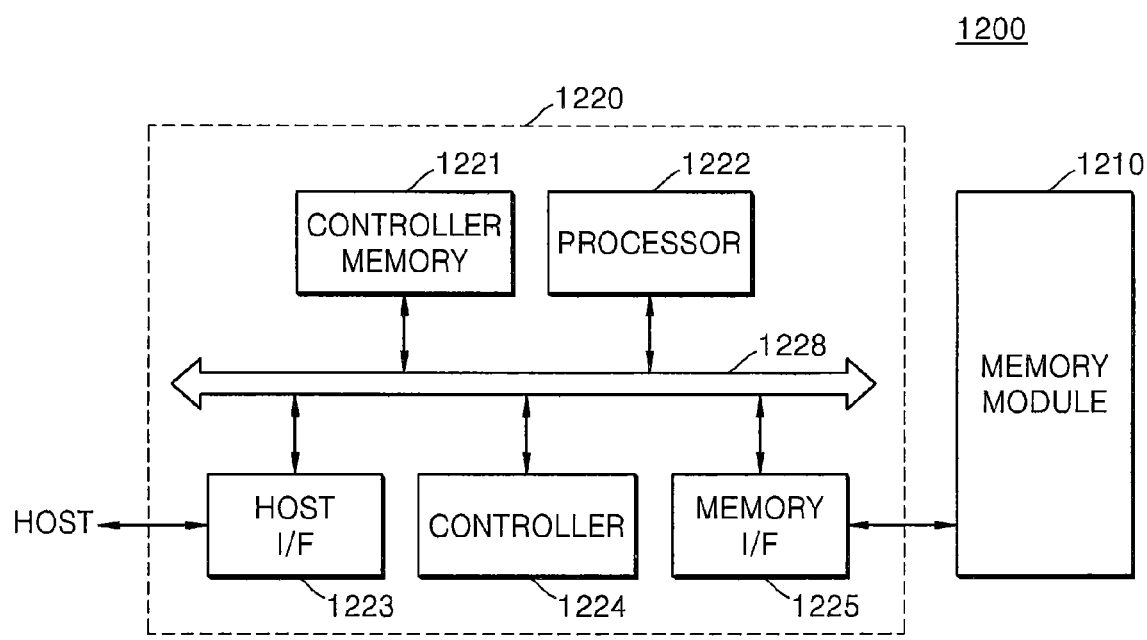
FIG. 19 is a block diagram of a memory card including a semiconductor device manufactured according to a method of manufacturing a semiconductor device according to an exemplary embodiment of the inventive concept.

FIG. 19 a block diagram of a memory card 1200 including a semiconductor device manufactured according to a method of manufacturing a semiconductor device according to an exemplary embodiment of the inventive concept.

The memory card 1200 includes a memory controller 1220 generating a command and address signal C/A and a memory module 1210, for example a flash memory including a flash memory device or a plurality of flash memory devices. The memory controller 1220 includes a host interface 1223 transferring the command and address signal C/A to a host or receiving the command and address signal from the host and a memory interface 1225 transferring again the command and address signal C/A to the memory module 1210 or receiving the command and address signal from the memory module 1210. The host interface 1223, the controller 1224, and the memory interface 1225 communicate with a controller memory 1221 such as SRAM and a processor 1222 such as CPU via a common bus 1228.

The memory module 1210 receives the command and address signal from the memory controller 1220, stores data in at least one of memory devices in the memory module 1210 as a response, and searches the data from the at least one of the memory devices. Each memory device includes a plurality of memory cells capable of addressing and a decoder generating a row signal and a column signal to access at least one of the memory cells capable of addressing during operations of receiving the command and address signal C/A, programming, and reading.

Each of components of the memory card 1200 including the memory controller 1220, electronic devices 1221, 1222, 1223, 1224, and 1225 included in the memory controller 1220, and the memory module 1210 may include a semiconductor device including a Ni-containing layer, formed according to a method of manufacturing a semiconductor layer according to an exemplary embodiment of the inventive concept. In particular, each of components of the memory card 1200 including the memory controller 1220, electronic devices 1221, 1222, 1223, 1224, and 1225 included in the memory controller 1220, and the memory module 1210 may include at least one of the non-volatile memory devices 400, 500, 600, and 700 described in reference to FIGS. 10 through 16J.

Figure 20:
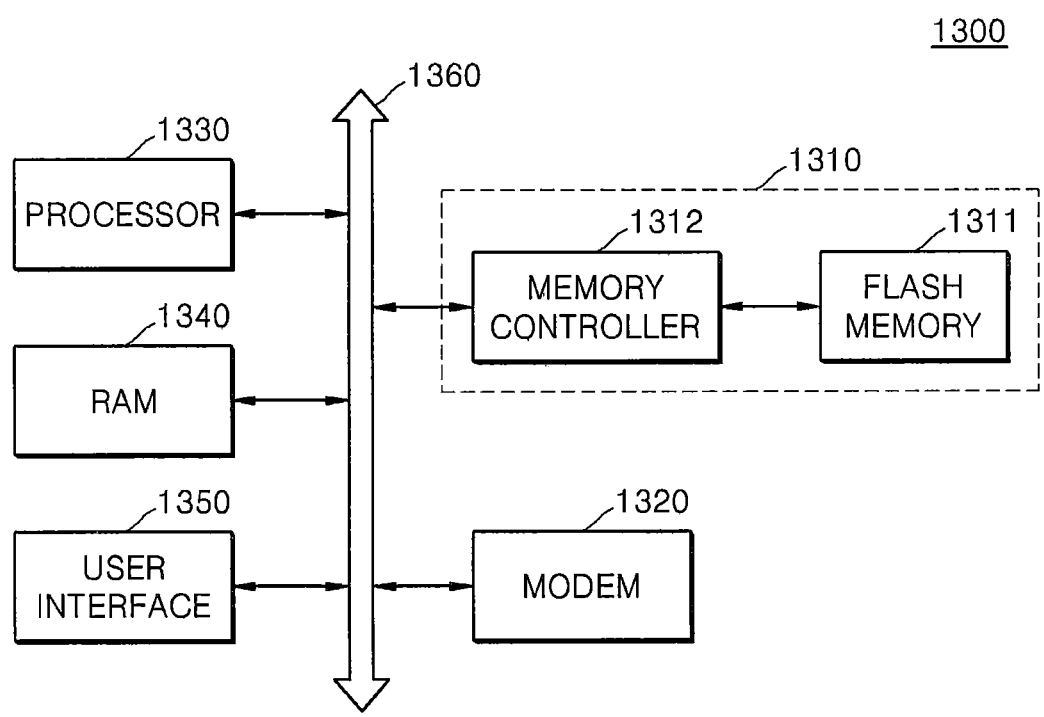
FIG. 20 is a block diagram of a memory system implementing a memory card including a semiconductor device manufactured according to a method of manufacturing a semiconductor device according to an exemplary embodiment of the inventive concept.

FIG. 20 is a block diagram of a memory system 1300 implementing a memory card 1310 including a semiconductor device manufactured according to a method of manufacturing a semiconductor device according to an exemplary embodiment of the inventive concept.

The memory system 1300 may include a processor 1330 such as a CPU, random access memory 1340, a user interface 1350, and a modem 1320 that communicate with one another via a common bus 1360. Each element transfers a signal to the memory card 1310 and receives the signal from the memory card 1310 via the common bus 1360. Each of components of the memory system 1300 including the memory card 1310, the processor 1330, the random access memory 1340, the user interface 1350, and the modem 1320 may include a semiconductor device including a Ni-containing layer, formed according to a method of manufacturing a semiconductor device according to an exemplary embodiment of the inventive concept. In particular, each of components of the memory system 1300 including the memory card 1310, the processor 1330, the random access memory 1340, the user interface 1350, and the modem 1320 may include at least one of the non-volatile memory devices 400, 500, 600, and 700 described in reference to FIGS. 10 through 16J.

The memory system 1300 may be applied to various electronic applications. For example, the memory system 1300 may be applied to solid state drives (SSD), CMOS image sensors (CIS), and computer application chip sets.

The memory system 1300 and the memory devices disclosed in this specification may be packaged as a format from among various device package formats including, but not necessarily limited to, ball grid arrays (BGA), chip scale packages (CSP), plastic leaded chip carrier (PLCC), plastic dual in-line package (PDIP), multi-chip package (MCP), wafer-level fabricated package (WFP), and wafer-level processed stock package (WSP).

While the inventive concept has been particularly shown and described with reference to exemplary embodiments thereof, it will be understood that various changes in form and details may be made therein without departing from the spirit and scope of the following claims.

What is claimed is:

1. A method of manufacturing a semiconductor device, the method comprising:
preparing a substrate comprising a structure in which a hole or a trench is formed;
vaporizing precursors comprising a nickel alkoxide compound;
forming a first nickel-containing layer in the hole or the trench by providing the vaporized precursors comprising the nickel alkoxide compound onto the substrate; and
forming a second nickel-containing layer by changing a composition of the first nickel-containing layer by using at least one of a reactive gas and heat,
wherein the nickel alkoxide compound is represented by the following formula (I):

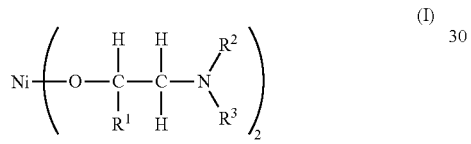

where each of $R^1$, $R^2$, and $R^3$ is a $C_1$-$C_4$ linear or branched alkyl group.

2. The method of claim 1, wherein each of $R^1$, $R^2$, and $R^3$ is a methyl group, an ethyl group, a propyl group, an isopropyl group, a butyl group, an s-butyl group, a t-butyl group, or an isobutyl group.

3. The method of claim 1, wherein $R^1$ is an ethyl group and at least one of $R^2$ and $R^3$ is an ethyl group.

4. The method of claim 1, wherein the precursors further comprise a compound having at least one organic coordination compound selected from an alcohol compound, a glycol compound, a β-diketone compound, a cyclopentadiene compound, and an organic amine compound, and
wherein the precursors include any one of silicon and metal.

5. The method of claim 1, wherein forming the first nickel-containing layer comprises providing the vaporized precursors comprising the nickel alkoxide compound onto the substrate and decomposing or chemically reacting the provided vaporized precursors in the hole or the trench.

6. The method of claim 1, wherein the substrate further comprises a silicon layer exposed through the hole or the trench, and the second nickel-containing layer is a nickel silicide layer.

7. The method of claim 1, wherein forming the first nickel-containing layer comprises alternately and sequentially exposing the substrate to the nickel alkoxide compound and a reactive gas.

8. The method of claim 7, wherein the reactive gas is formed of a reducing gas selected from a hydrogen compound, an ammonia compound, and an organo-metallic compound.

9. The method of claim 1, wherein forming the first nickel-containing layer is performed in an atmosphere in which at least one selected from plasma, heat, light, and voltage is applied.

10. The method of claim 1, wherein the first nickel-containing layer is a nickel layer, a nickel oxide layer, a nickel nitride layer, or a nickel silicide layer.

11. A method of manufacturing a semiconductor device, the method comprising:
alternately stacking on a substrate one of a plurality of insulating layers and one of a plurality of sacrificial layers, the plurality of insulating layers and the plurality of sacrificial layers extending in parallel to the substrate;
forming an opening penetrating the plurality of sacrificial layers and the plurality of insulating layers to expose the plurality of sacrificial layers;
forming a nickel-containing layer in the opening by providing precursors comprising a nickel alkoxide compound onto the substrate;
substituting the plurality of sacrificial layers with a plurality of gate lines; and
forming a common source line in the opening,
wherein the nickel alkoxide compound is represented by the following formula (I):

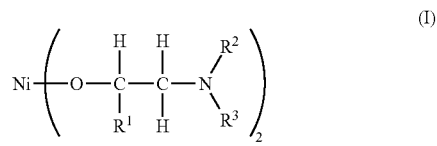

where each of $R^1$, $R^2$, and $R^3$ is a $C_1$-$C_4$ linear or branched alkyl group.

12. The method of claim 11, wherein the plurality of sacrificial layers comprise silicon, and
wherein substituting the plurality of sacrificial layers with the plurality of gate lines comprises:
performing a silicidation process by inducing a reaction of the silicon comprised in the plurality of sacrificial layers and the nickel-containing layer, and
changing the plurality of sacrificial layers to a nickel silicide layer by the silicidation process.

13. The method of claim 11, wherein forming the opening comprises etching the plurality of insulating layers and the plurality of sacrificial layers until the substrate is exposed in a bottom surface of the opening,
wherein the nickel-containing layer comprises a portion contacting the substrate exposed in the opening, and
wherein after substituting the plurality of sacrificial layers with the plurality of gate lines and before forming the common source line in the opening, the method further comprises: performing a silicidation process of the nickel-containing layer by inducing a reaction of the nickel-containing layer and the substrate.

14. A method of manufacturing a semiconductor device, the method comprising:
alternately stacking on a substrate one of a plurality of insulating layers and one of a plurality of sacrificial layers, the plurality of insulating layers and the plurality of sacrificial layers extending in parallel to the substrate;
forming a first opening penetrating the plurality of sacrificial layers and the plurality of insulating layers to expose a first region of the substrate;

forming a plurality of second openings communicating with the first opening by removing the plurality of sacrificial layers through the first opening;

forming a nickel layer in the first opening and the plurality of second openings by providing precursors comprising a nickel alkoxide compound into the first opening and the plurality of second openings;

removing a portion of the nickel layer to leave a plurality of nickel layer patterns in the plurality of second openings; and forming a plurality of gate electrodes formed of a plurality of nickel silicide layers in the plurality of second openings by a silicidation process of the plurality of nickel layer patterns, wherein the nickel alkoxide compound is represented by the following formula (I):

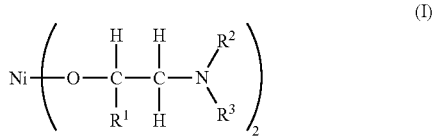

where each of $R^1$, $R^2$, and $R^3$ is a $C_1$-$C_4$ linear or branched alkyl group.

15. The method of claim 14, wherein $R^1$ is an ethyl group and at least one of $R^2$ and $R^3$ is an ethyl group.

16. The method of claim 14, wherein forming the plurality of gate electrodes comprises:

forming a polysilicon layer covering the plurality of nickel layer patterns in the first opening; and performing the silicidation process of the plurality of nickel layer patterns by inducing a reaction between the plurality of nickel layer patterns and the polysilicon layer.

17. The method of claim 14, wherein forming the nickel layer comprises:

vaporizing the precursors comprising the nickel alkoxide compound; and providing the vaporized precursors comprising the nickel alkoxide compound into the first opening and the plurality of second openings.

18. The method of claim 14, further comprising, after forming the plurality of gate electrodes:

forming a source region in the first region of the substrate;

forming an insulating spacer covering the plurality of gate electrodes; and forming a common source line connected to the source region in the first opening.

* * * * *